US012301242B2

United States Patent
Bunsen et al.

(10) Patent No.: US 12,301,242 B2
(45) Date of Patent: May 13, 2025

(54) ANALOG-TO-DIGITAL CONVERTER CIRCUIT

(71) Applicants: Sony Semiconductor Solutions Corporation, Kanagawa (JP); IMEC VZW, Leuven (BE)

(72) Inventors: Keigo Bunsen, Kanagawa (JP); Ewout Martens, Leuven (BE); Davide Dermit, Leuven (BE); Jan Craninckx, Leuven (BE)

(73) Assignees: Sony Semiconductor Solutions Corporation, Kanagawa (JP); IMEC VZW, Leuven (BE)

( * ) Notice: Subject to any disclaimer, the term of this patent is extended or adjusted under 35 U.S.C. 154(b) by 177 days.

(21) Appl. No.: 18/019,308

(22) PCT Filed: Jul. 13, 2021

(86) PCT No.: PCT/JP2021/026350
§ 371 (c)(1),
(2) Date: Feb. 2, 2023

(87) PCT Pub. No.: WO2022/044588
PCT Pub. Date: Mar. 3, 2022

(65) Prior Publication Data
US 2023/0275593 A1 Aug. 31, 2023

Related U.S. Application Data

(60) Provisional application No. 63/071,739, filed on Aug. 28, 2020.

(51) Int. Cl.
*H03M 1/14* (2006.01)
*H03M 1/06* (2006.01)

(52) U.S. Cl.
CPC .................. *H03M 1/0604* (2013.01)

(58) Field of Classification Search
CPC ........ H03M 1/164; H03M 1/468; H03M 1/38; H03M 1/0695; H03M 1/1009; H03M 1/12;
(Continued)

(56) References Cited

U.S. PATENT DOCUMENTS 6,369,744 B1 * 4/2002 Chuang ............... H03M 1/0695
341/161
6,606,042 B2 * 8/2003 Sonkusale ........... H03M 1/1004
341/161
(Continued)

FOREIGN PATENT DOCUMENTS

JP     2010109937 A     5/2010

OTHER PUBLICATIONS

Bob Verbruggen et al: "A 1.7mW 11b 250MS/s 2x interleaved fully dynamic pipelined SAR ADC in 40nm digital CMOS", Solid-State Circuits Conference Digest of Technical Papers (ISSCC), 2012 IEEE International, IEEE, Feb. 19, 2012 (Feb. 19, 2012), pp. 466-468, XP032154545,DOI: 10.1109/ISSCC.2012.6177093ISBN: 978-1-4673-0376-7This document completes the disclosure of Doc #1 with respect to Implementationdetails of the coarse and fine SAR ADCs.; figures 27.5.1,27.5.2.
(Continued)

*Primary Examiner* — Linh V Nguyen
(74) *Attorney, Agent, or Firm* — Michael Best & Friedrich LLP

(57) ABSTRACT

There is provided an analog-to-digital converter circuit including: a first converter circuit generating a first digital code by performing analog-to-digital conversion on the basis of an input voltage; a second converter circuit generating a second digital code by performing, on the basis of the input voltage and the first digital code, analog-to-digital conversion over a voltage range wider than that of a least significant bit of the first converter circuit; an error detector detecting a conversion error of the analog-to-digital conversion on the basis of the first and second digital codes, thereby generating error data indicating a bit having a conversion error and the kind of the conversion error; and a calibration
(Continued)

circuit estimating an error factor on the basis of the first and second digital codes and the error data, and performing calibration of a circuit relevant to the estimated error factor on the basis of an estimation result.

12 Claims, 18 Drawing Sheets

(58) Field of Classification Search
CPC ...... H03M 1/466; H03M 1/00; H03M 1/1033; H03M 1/1215; H03M 1/1245; H03M 1/46; H03M 1/10; H03M 1/1019; H03M 1/145; H03M 1/804; H03M 1/001; H03M 1/002; H03M 1/0602; H03M 1/1014; H03M 1/1028; H03M 1/1042; H03M 1/1071; H03M 1/122; H03M 1/124; H03M 1/125; H03M 1/14; H03M 1/44; H03M 1/462; H03M 1/06; H03M 1/0617; H03M 1/0634; H03M 1/0643; H03M 1/069; H03M 1/0692; H03M 1/0863; H03M 1/1004; H03M 1/1023; H03M 1/109; H03M 1/1225; H03M 1/123; H03M 1/1295; H03M 1/187; H03M 1/34; H03M 1/361; H03M 1/40; H03M 1/502; H03M 1/66; H03M 1/662; H03M 1/742
USPC .................. 341/118–121, 155, 172, 161
See application file for complete search history.

(56) References Cited

U.S. PATENT DOCUMENTS

| | | | | |
|---|---|---|---|---|
| 7,071,856 B2* | 7/2006 | Tsai | ............... | H03M 1/1038 |
| | | | | 341/161 |
| 7,576,676 B2* | 8/2009 | Grace | ............ | H03M 1/1042 |
| | | | | 341/161 |
| 7,808,417 B2* | 10/2010 | Nazemi | ............ | H03M 1/44 |
| | | | | 341/161 |
| 8,659,461 B1* | 2/2014 | Zhu | ............... | H03M 1/1019 |
| | | | | 341/155 |
| 8,723,706 B1* | 5/2014 | Shin | ............... | H03M 1/1019 |
| | | | | 341/161 |
| 9,369,140 B1* | 6/2016 | Sundaresan | ......... | G01S 7/52025 |
| 9,705,520 B1* | 7/2017 | Kumar | ............... | H03M 1/44 |
| 9,819,314 B1* | 11/2017 | Chiu | ............... | H03F 3/45188 |
| 9,843,337 B1* | 12/2017 | Li | ............... | H03M 1/1009 |

OTHER PUBLICATIONS

Shin Soon-Kyun et al: "A 12 bit 200 MS/s Zero-Crossing-Based Pipelined ADC With Early Sub-ADC Decision and Output Residue Background Calibration", IEEE Journal of Solid-State Circuits, IEEE, USA, vol. 49, No. 6, Jun. 2014 (Jun. 2014), pp. 1366-1382, XP011549317, ISSN: 0018-9200, DOI: 10.1109/JSSC.2014. 2322853 [retrieved on May 28, 2014] Section II.B.2; figures 7-10.
SJ Ragusa E J et al: "Gain error correction technique for pipelined analogue-to-digital converters", Electronics Letters, I EE Stevenage, GB, vol. 36, No. 7, Mar. 30, 2000 (Mar. 30, 2000) , pp. 617-618, XP006015054, ISSN: 0013-5194, DOI: 10.1049/EL:20000501 This document completes the disclosure of Doc #1 with respect to the inter-stage gain calibration.; figures 2,3.
Verbruggen Bob et al: "C268 978-4-86348-348-4 2013 Symposium on VLSI Circuits Digest of Technical Papers A 2.1 mW 11b 410 MS/ s Dynamic Pipelined SAR ADC with Background Calibration in 28nmDigital CMOS", Jun. 12, 2013 (Jun. 12, 2013), pp. C268-C269, XP055844561, Retrieved from the Internet: URL:https:// ieeexplore.ieee.org/stampPDF/getPDF.jsptp=&arnumber=6578690 &ref=aHR0CHM 6Ly9zY2hvbGFyLmdvb2dsZS5jb20v [retrieved on Sep. 24, 2021].
PCT/JP2021/026350 International Search Report and Written Opinion dated Oct. 7, 2021.

* cited by examiner

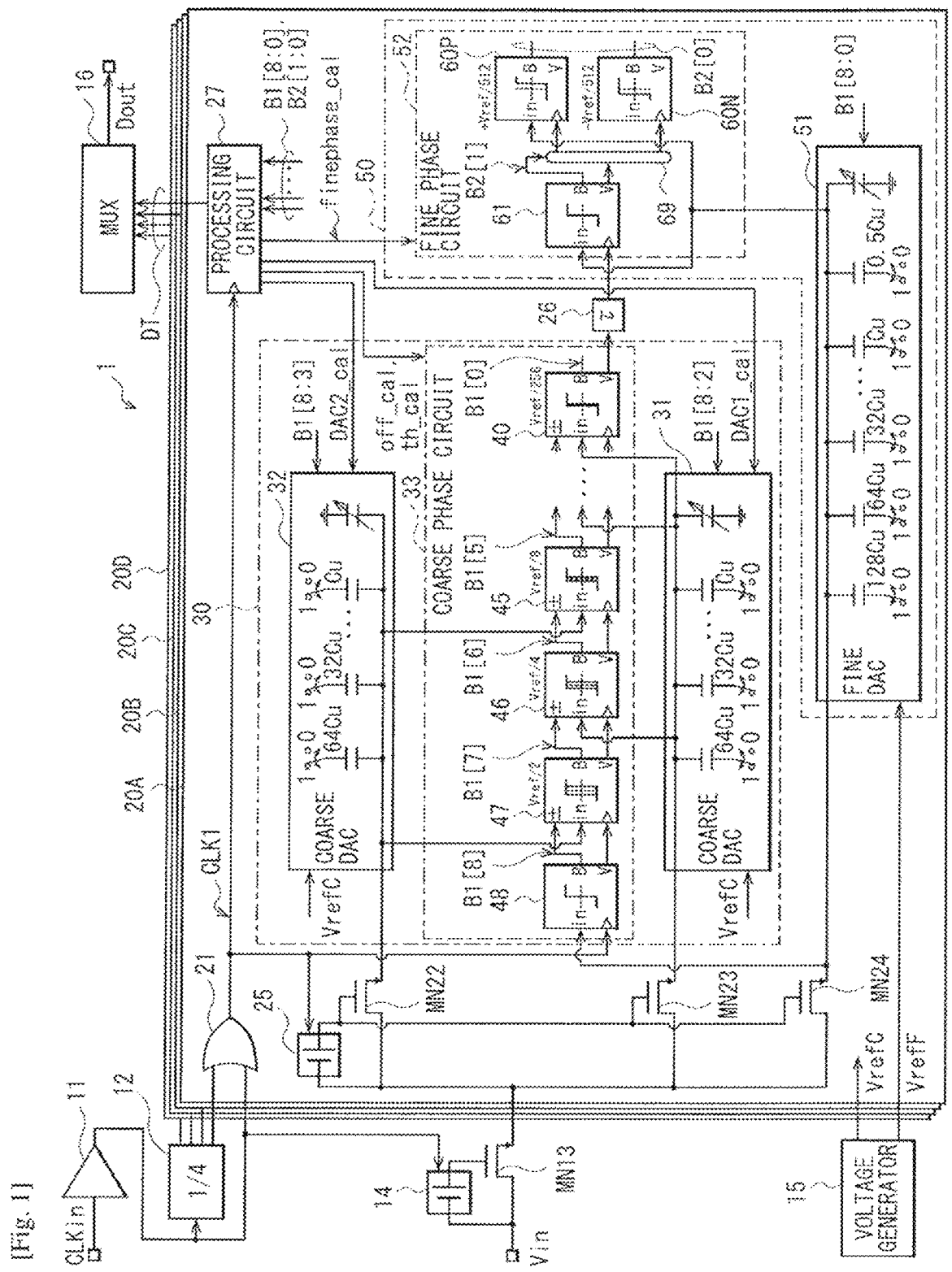
[Fig. 1]

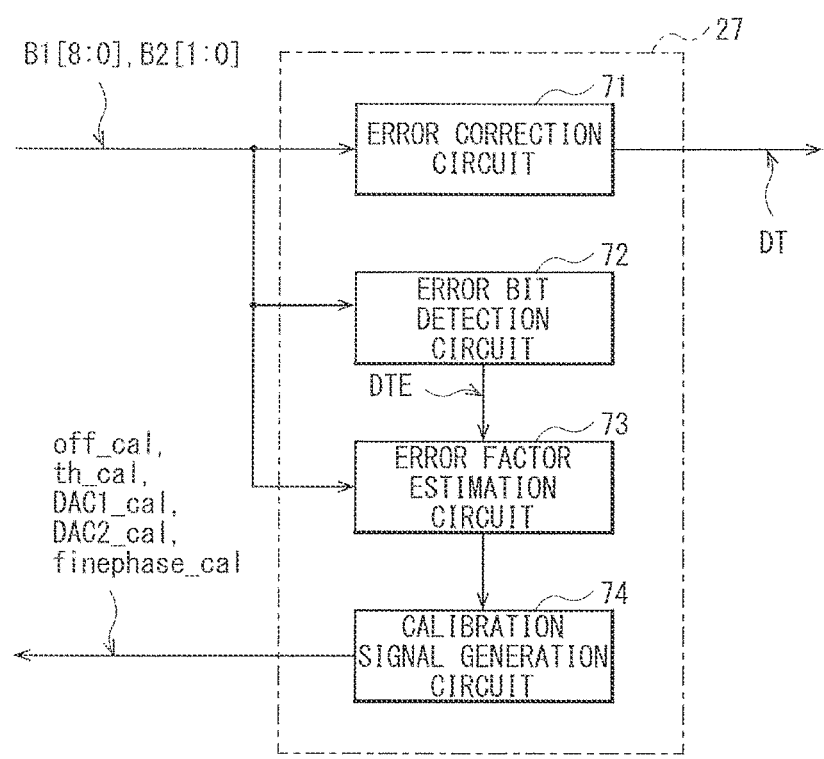
[Fig. 2]

[Fig. 3]
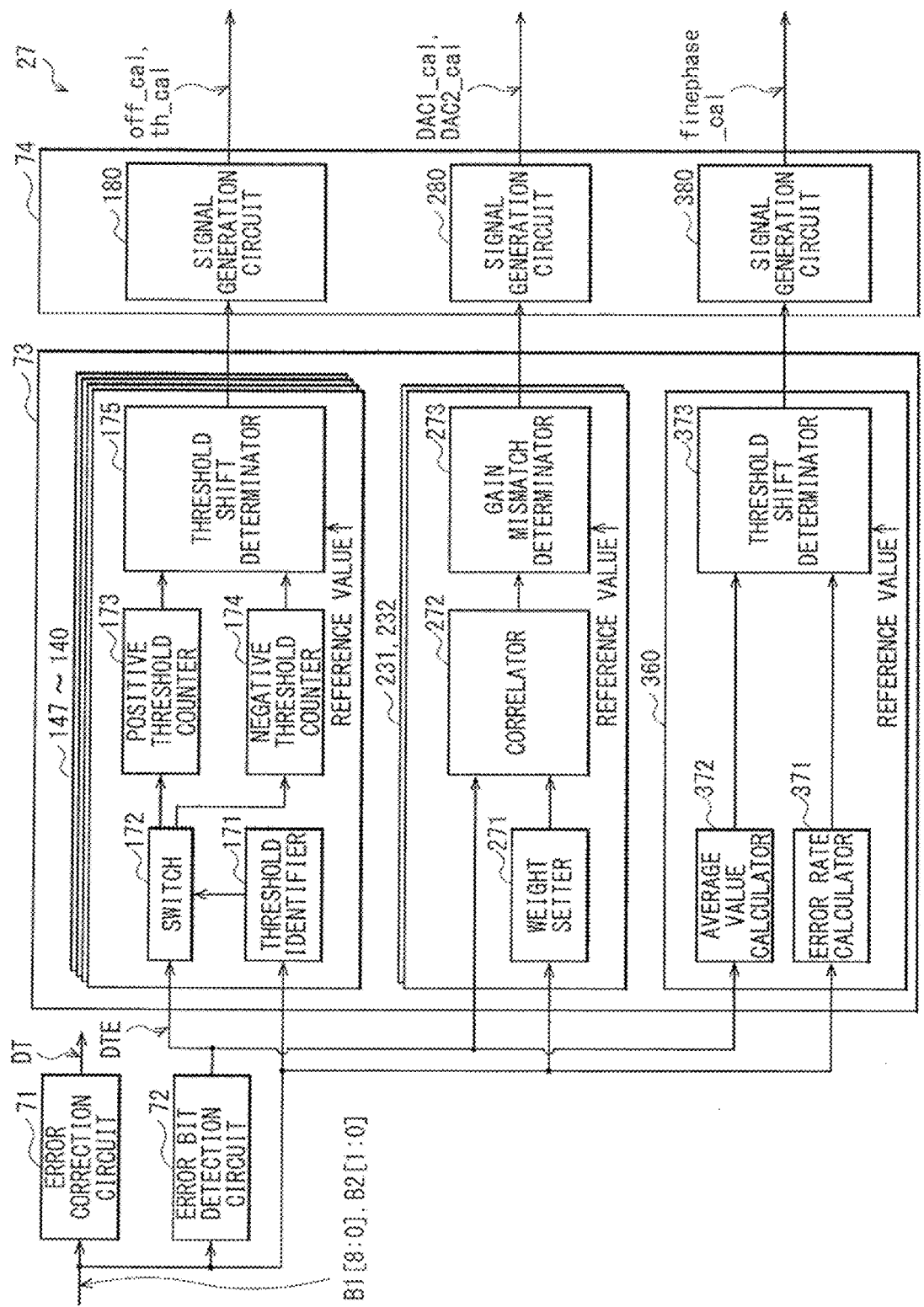

[Fig. 4]
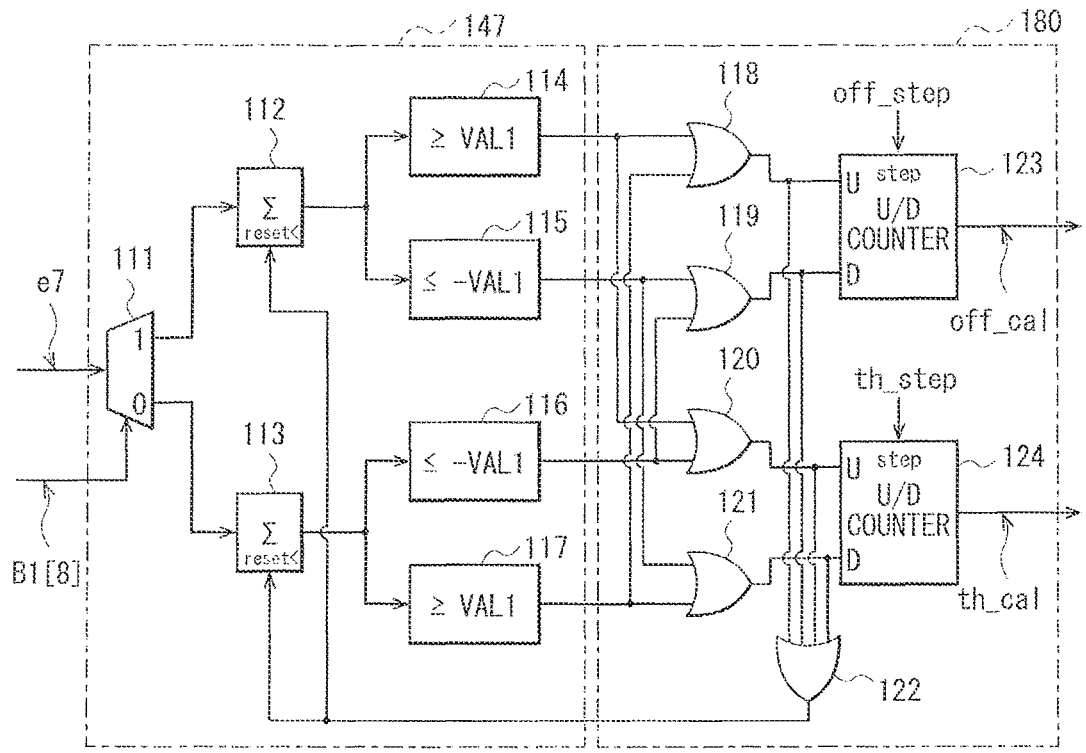
[Fig. 5]
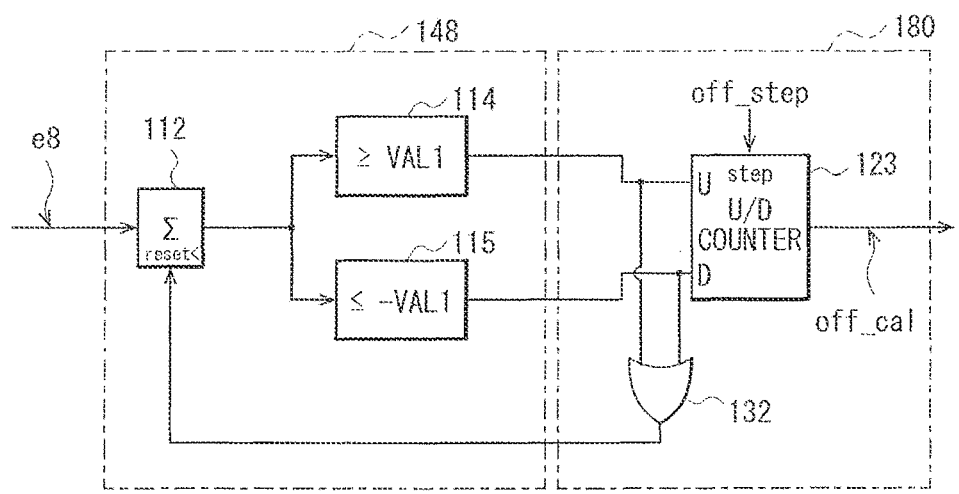

[Fig. 6]
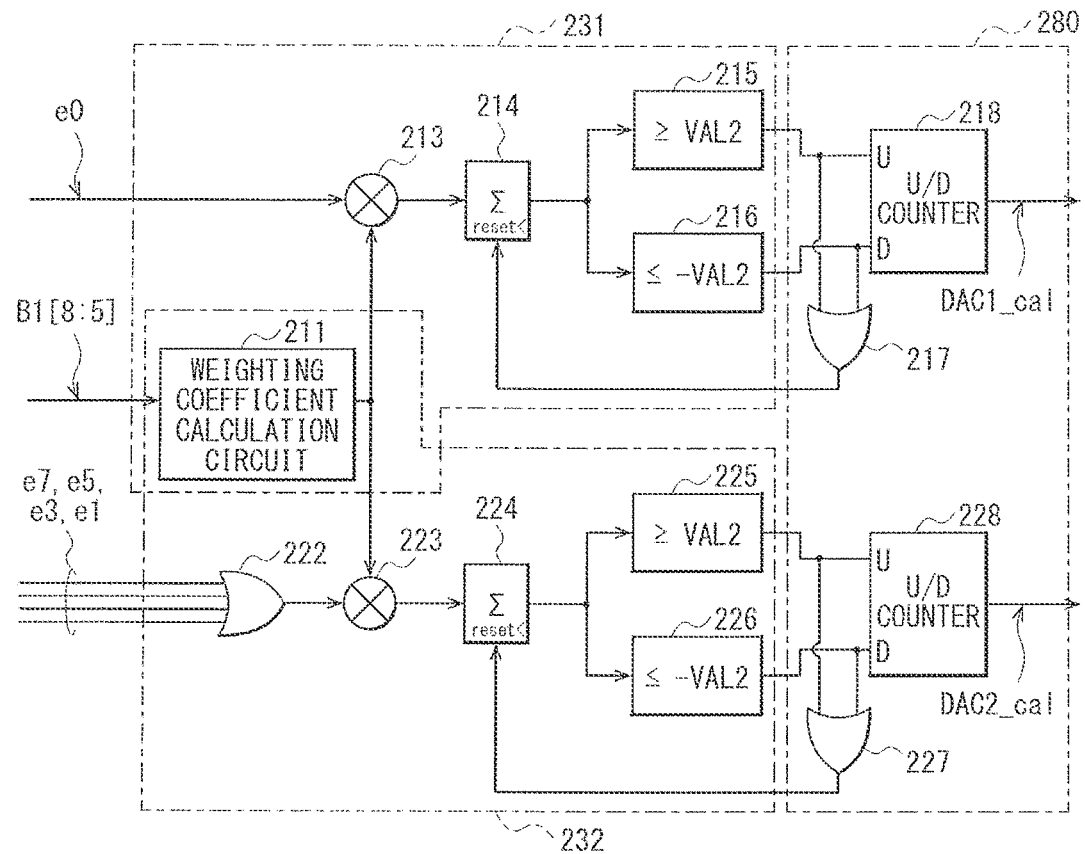
[Fig. 7]
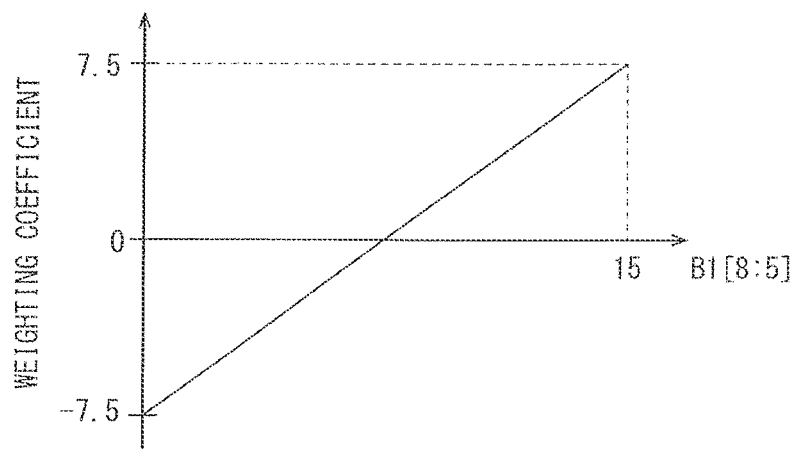

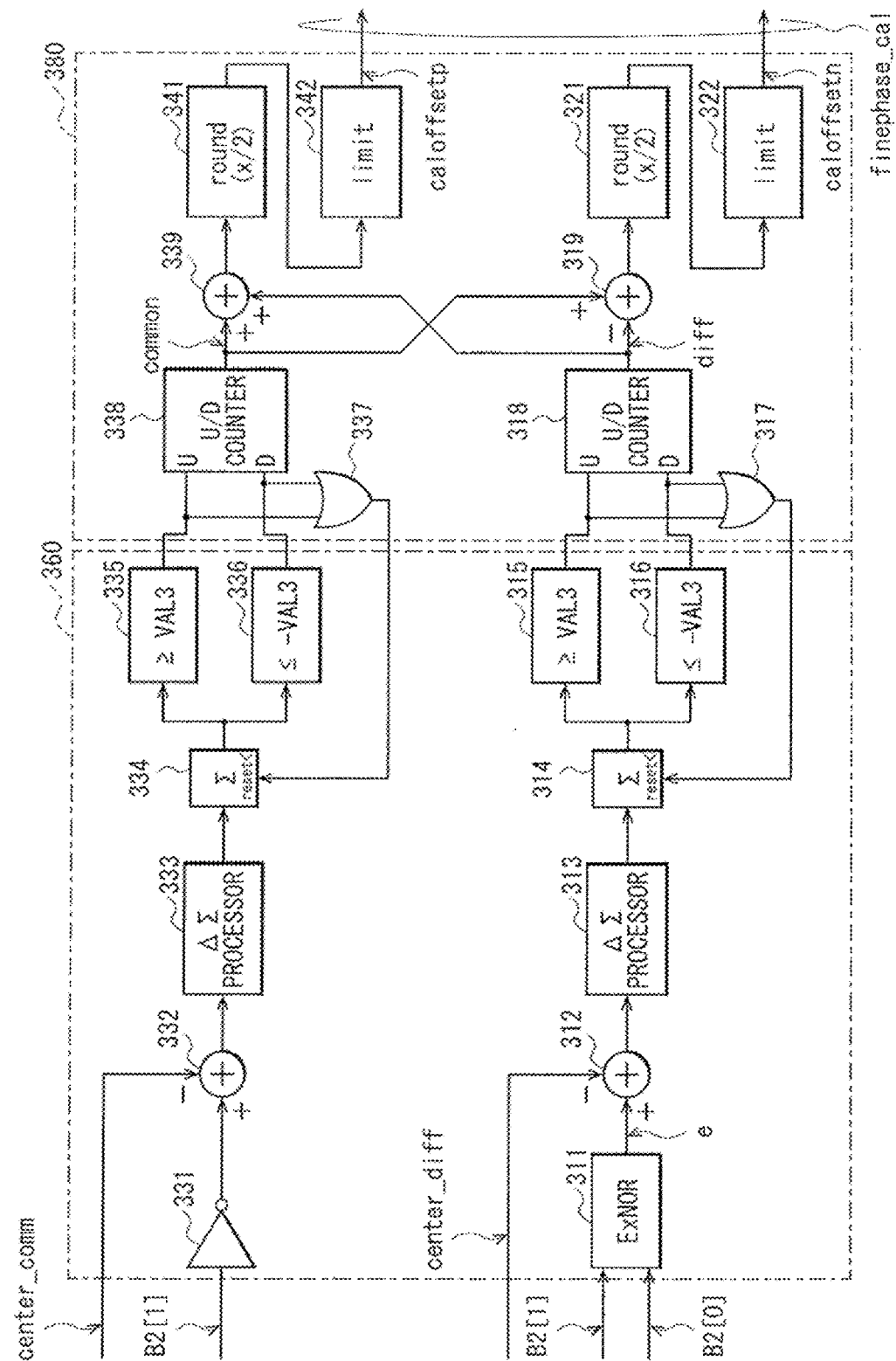

[Fig. 9]
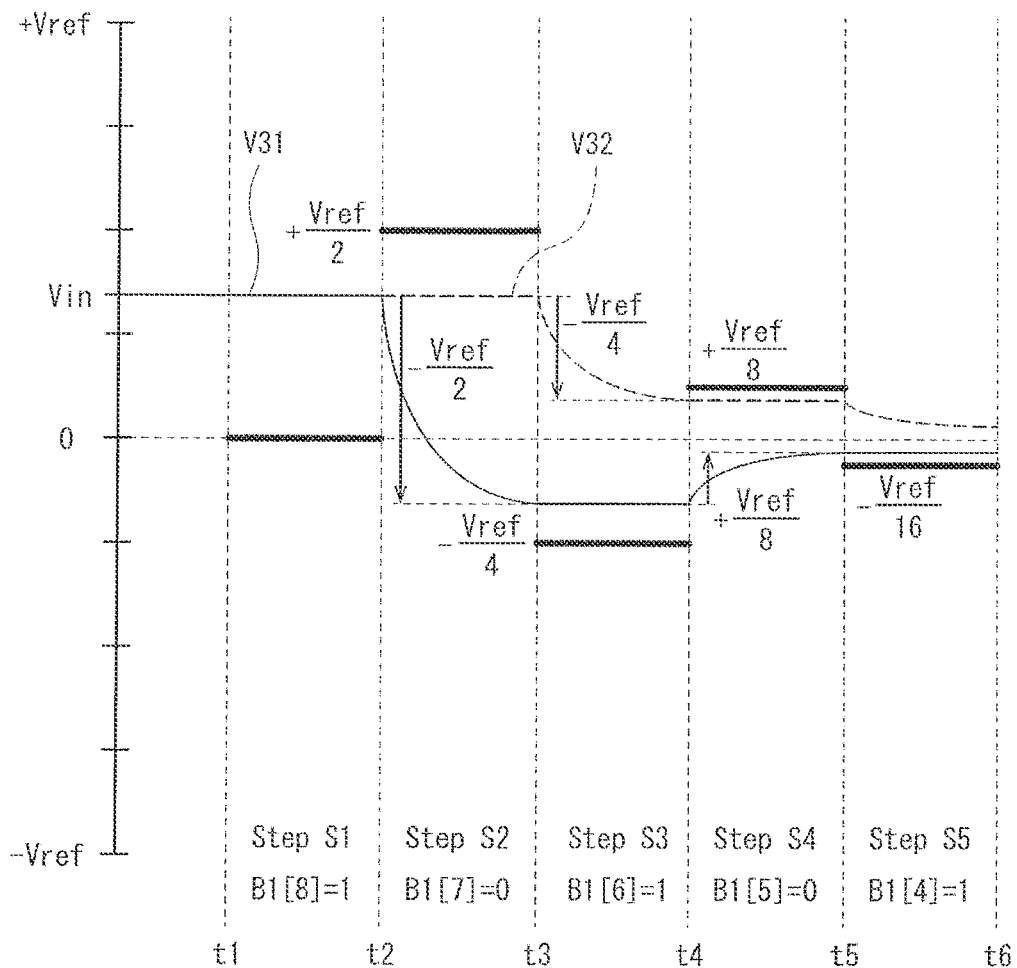
[Fig. 10]
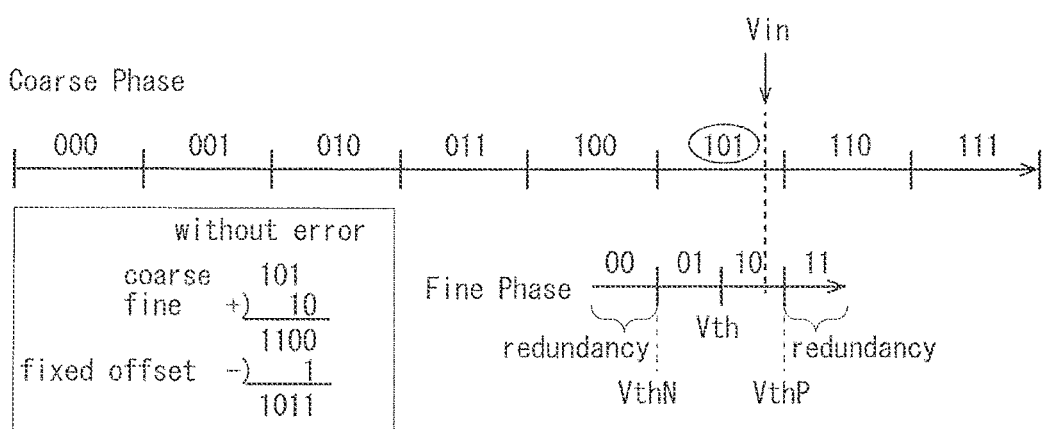

[Fig. 11]
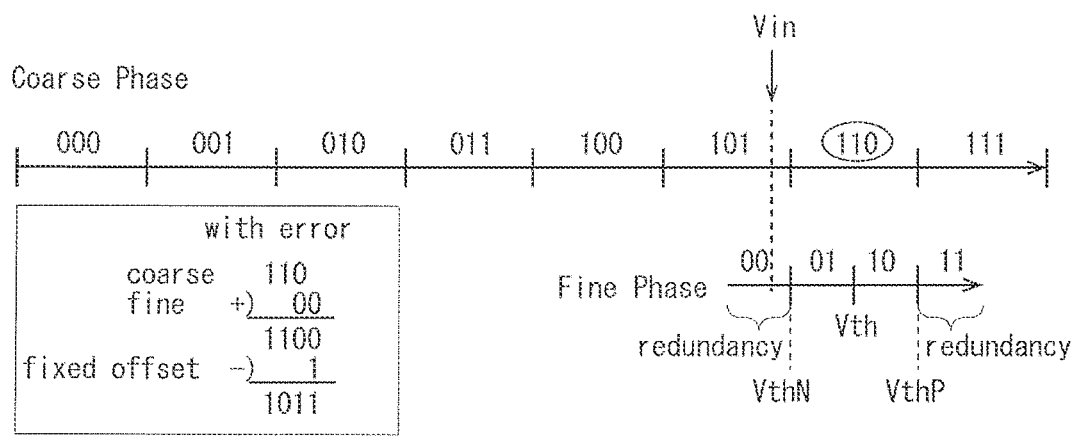
[Fig. 12]
| B1[2:0] | B2[1:0] | e2 | e1 | e0 | e |
|---|---|---|---|---|---|
| XX1 | 00 | 0 | 0 | -1 | 1 |
| X10 | 00 | 0 | -1 | 0 | 1 |
| 100 | 00 | -1 | 0 | 0 | 1 |
| XX0 | 11 | 0 | 0 | 1 | 1 |
| X01 | 11 | 0 | 1 | 0 | 1 |
| 011 | 11 | 1 | 0 | 0 | 1 |
| others | | 0 | 0 | 0 | 0 |

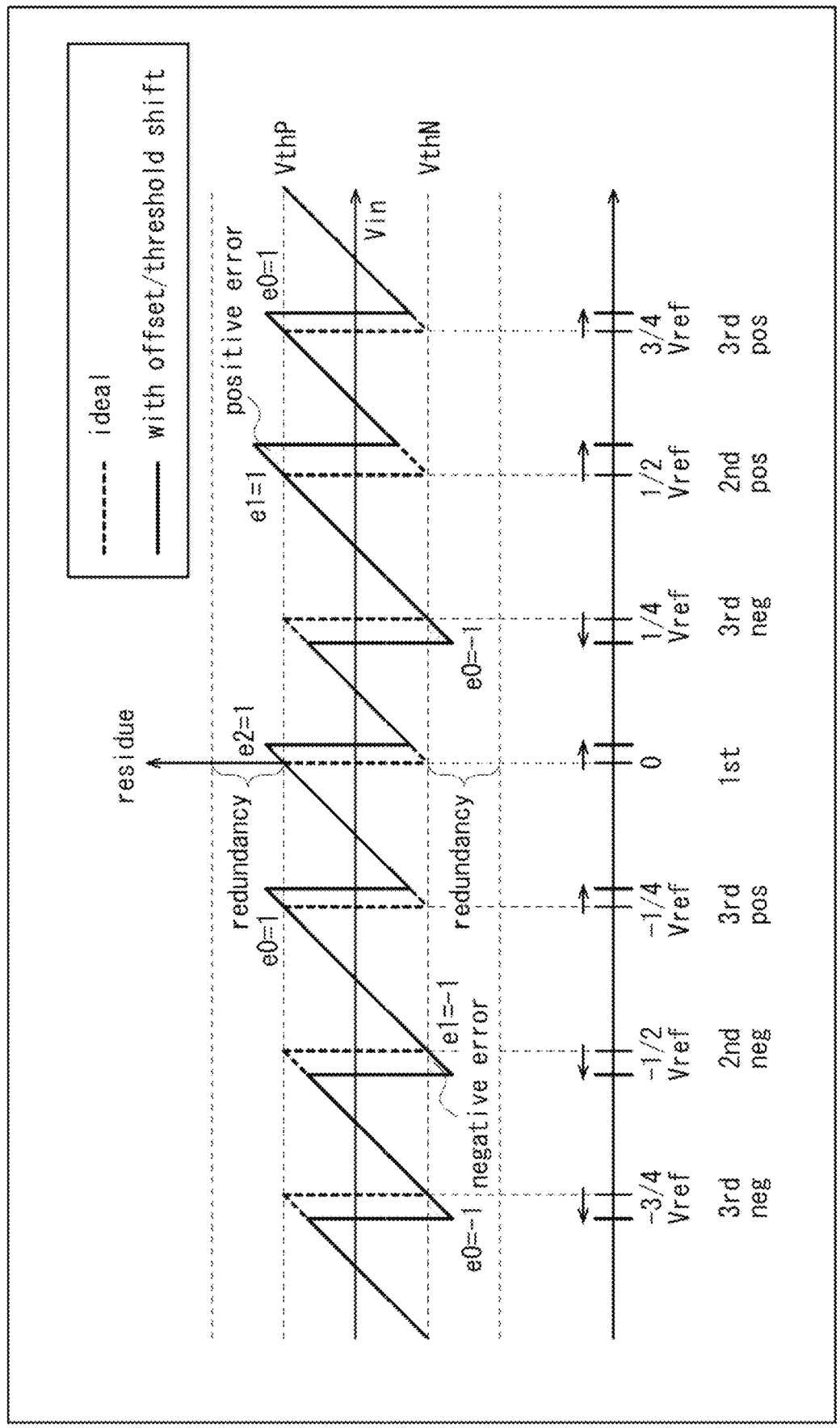
[Fig. 13]

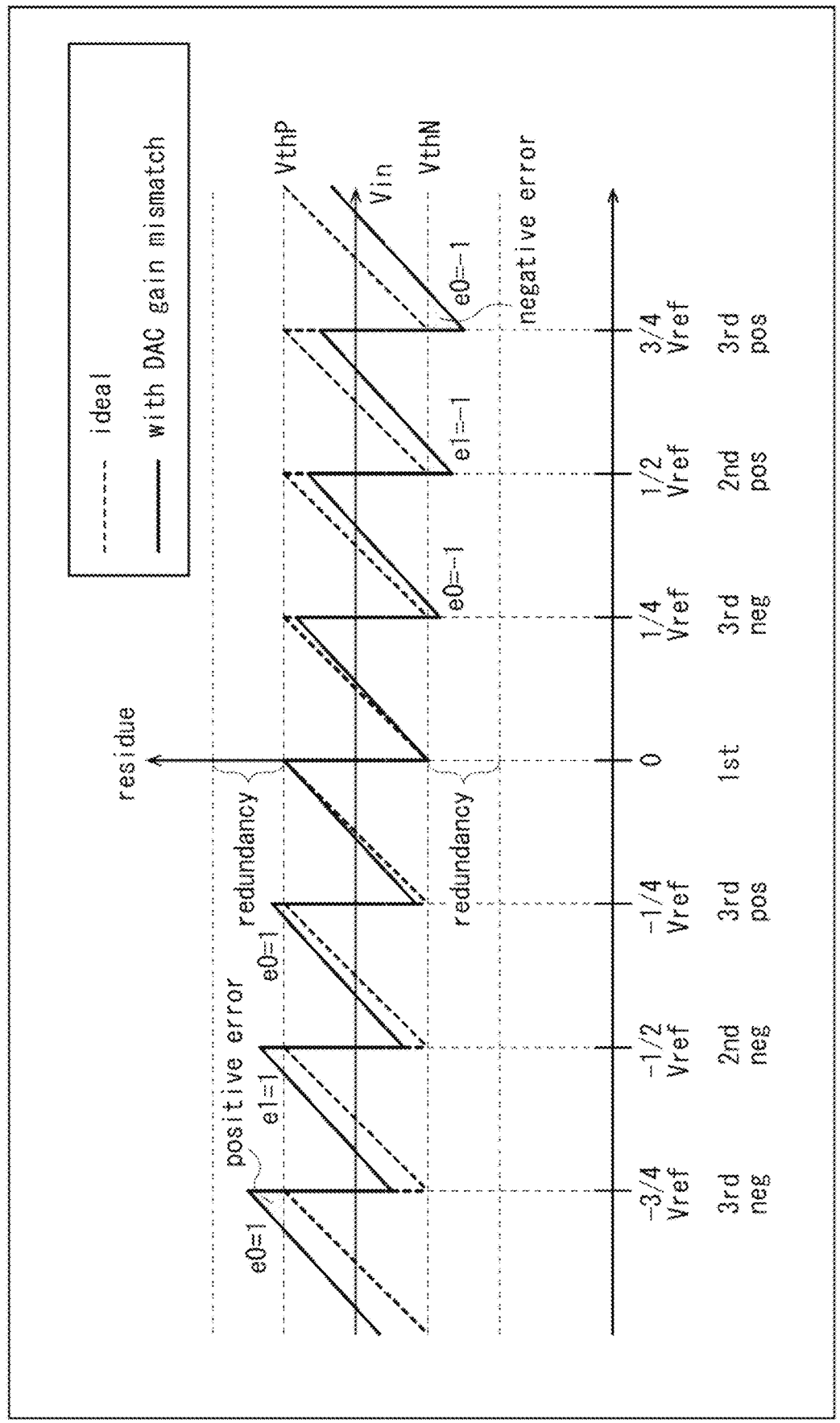
[Fig. 14]

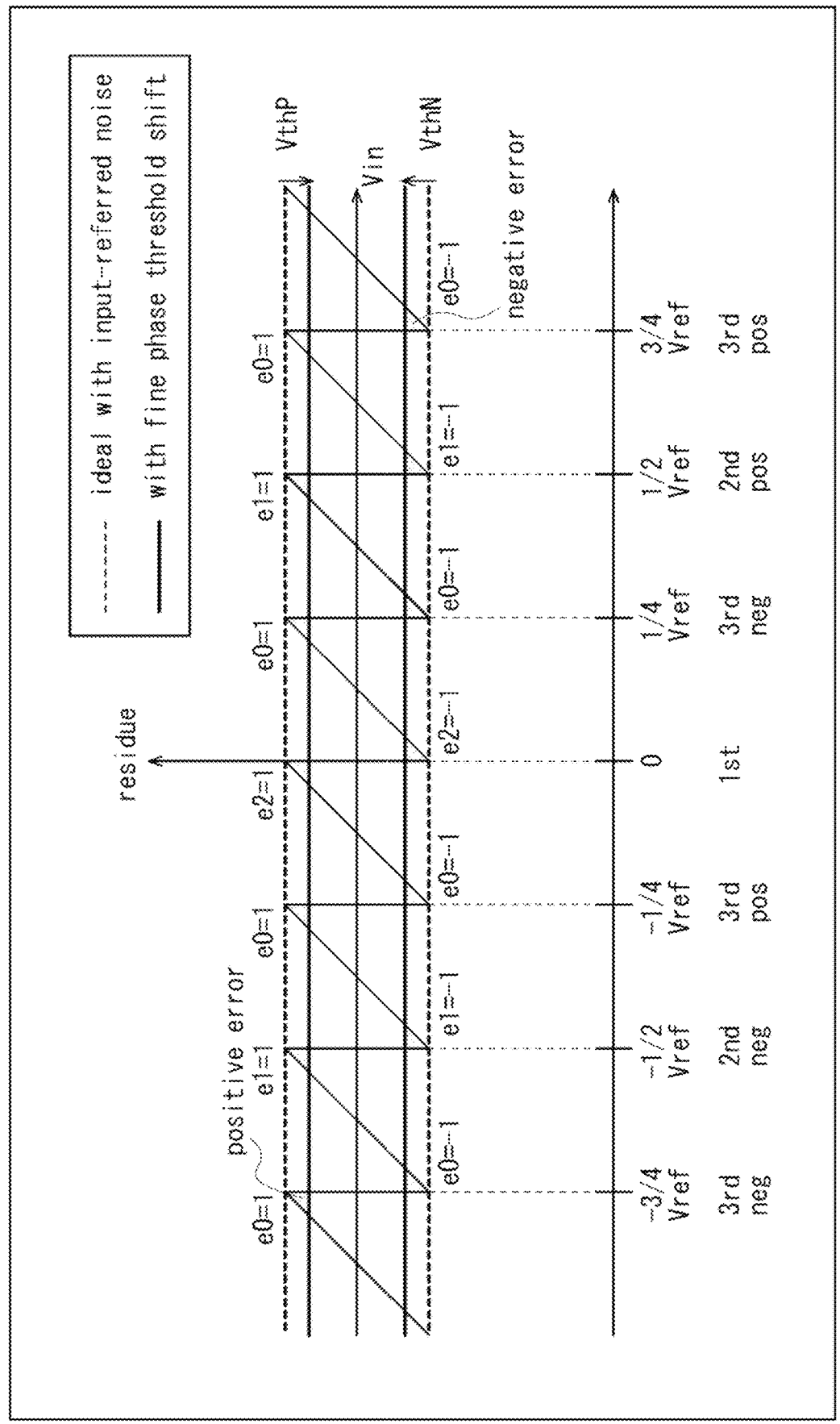
[Fig. 15]

[Fig. 16]
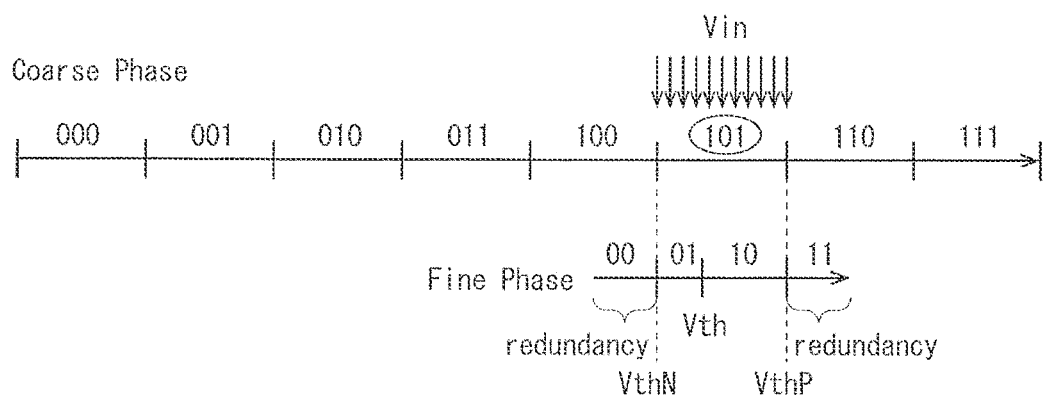
[Fig. 17]
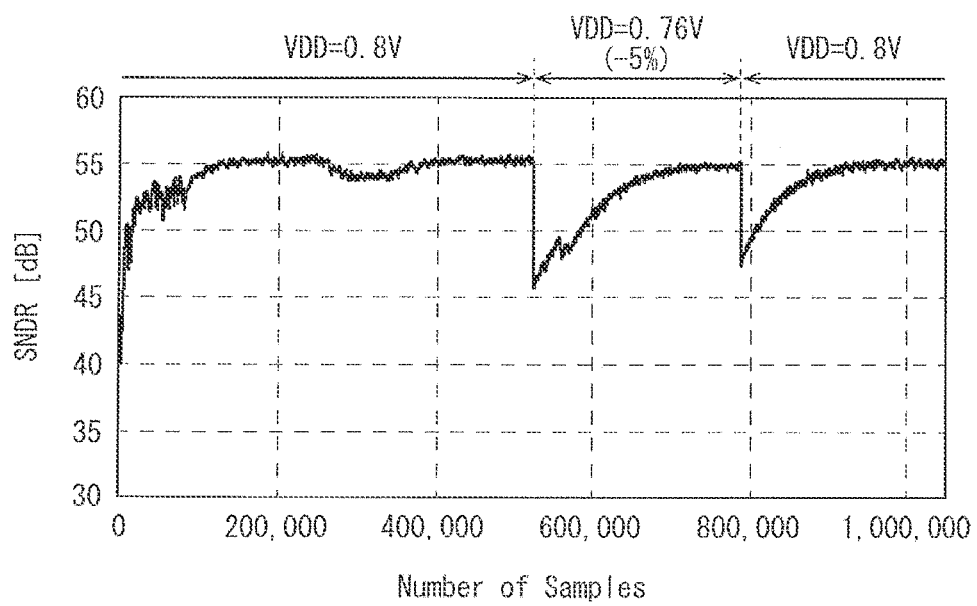

[Fig. 18]
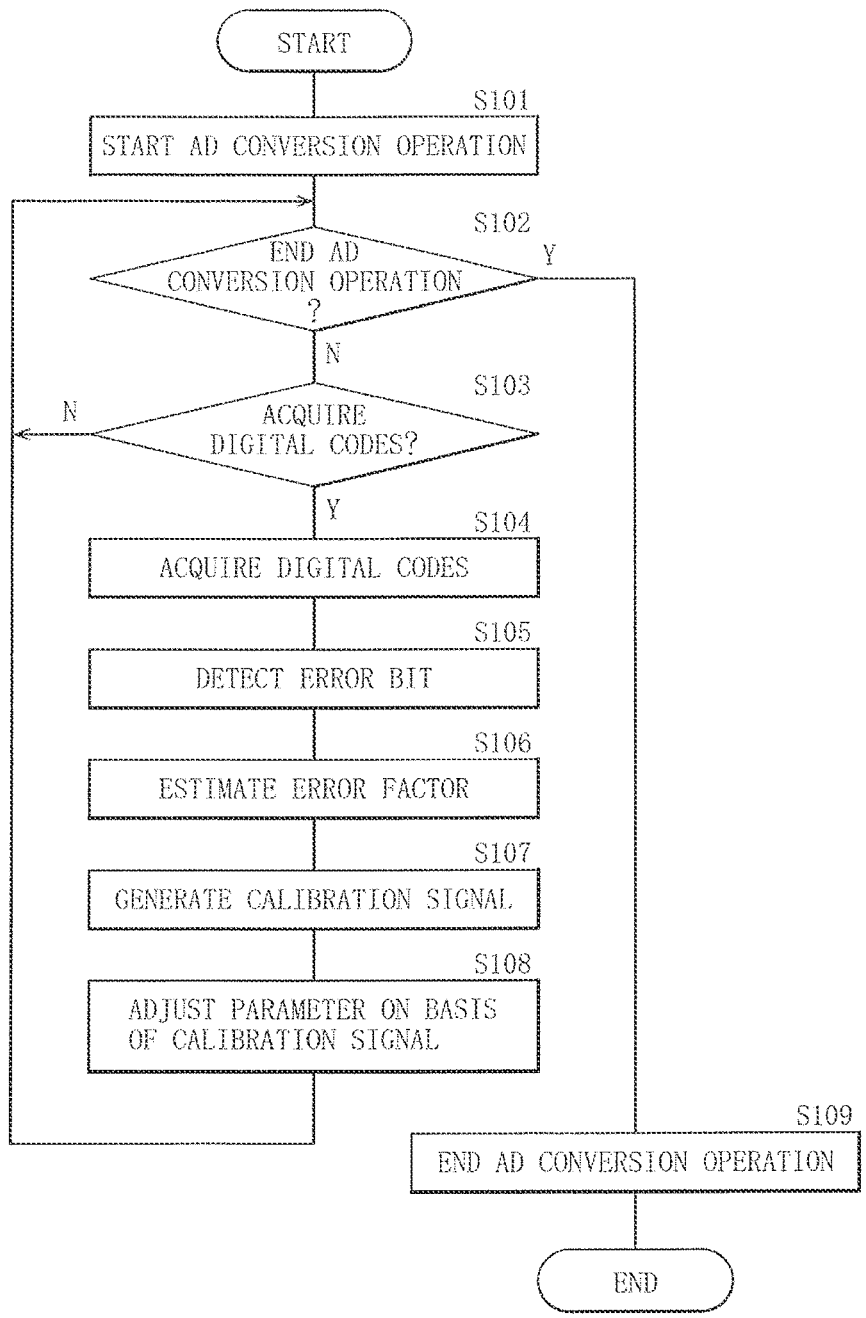

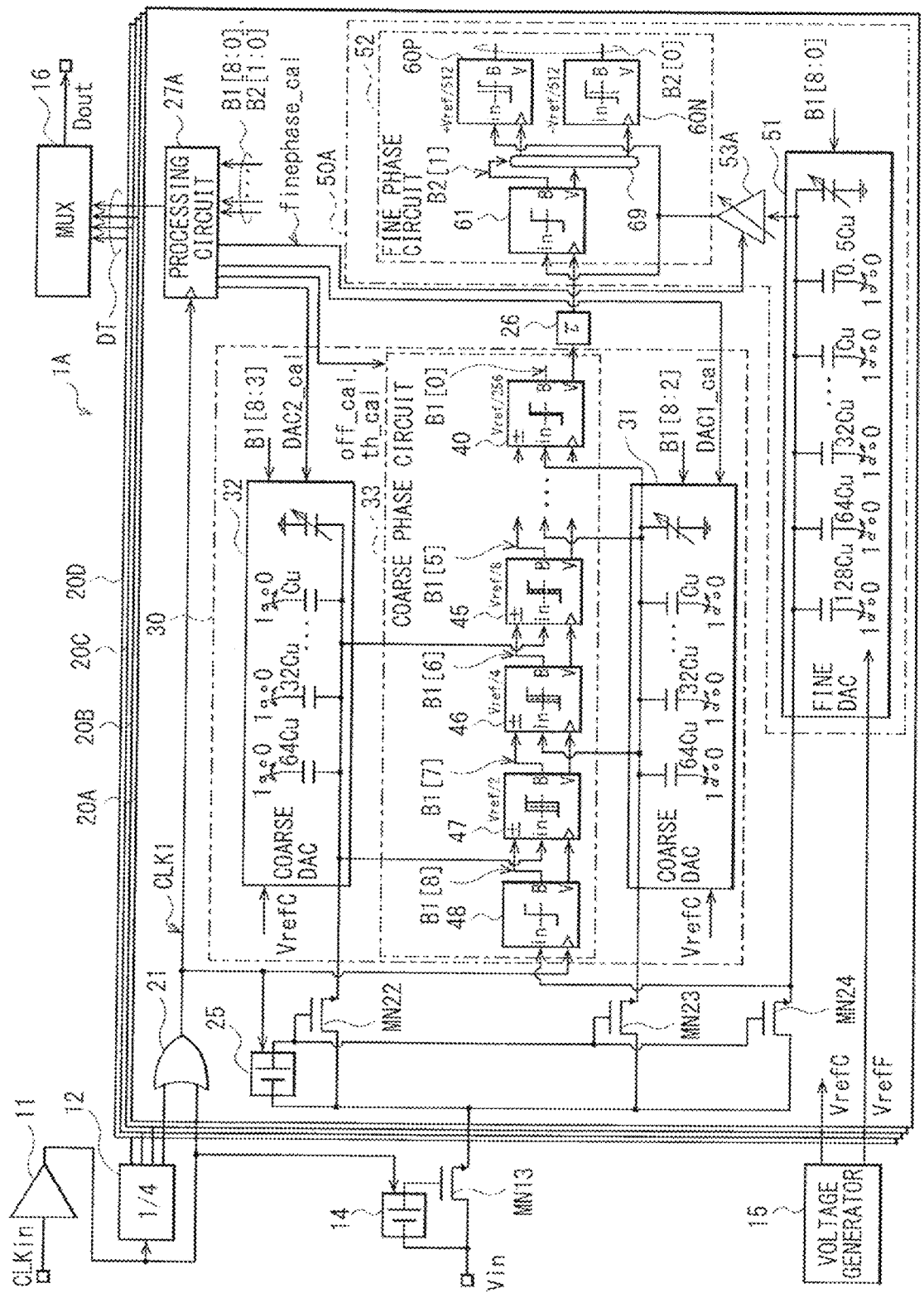
[Fig. 19]

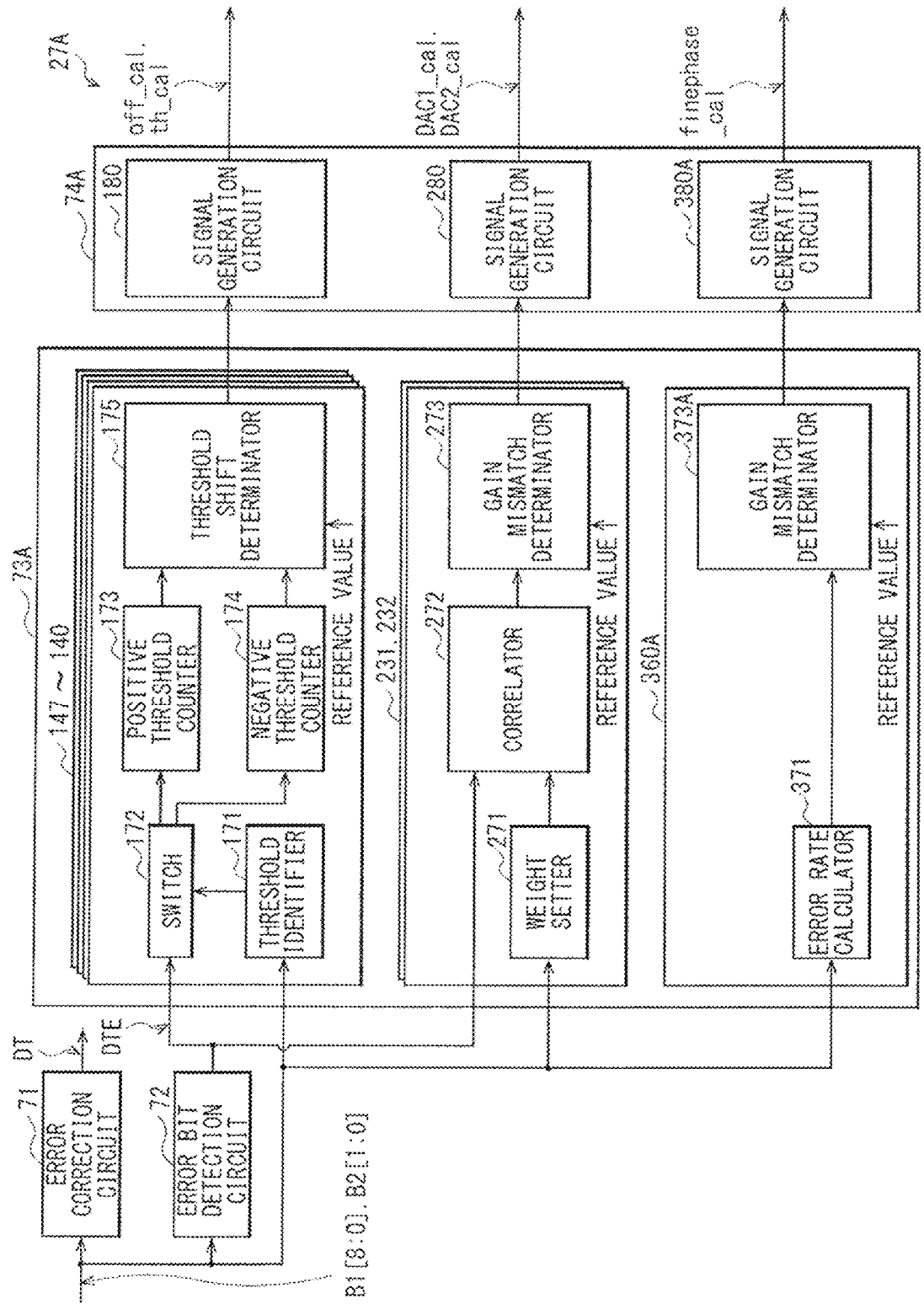

[Fig. 21]
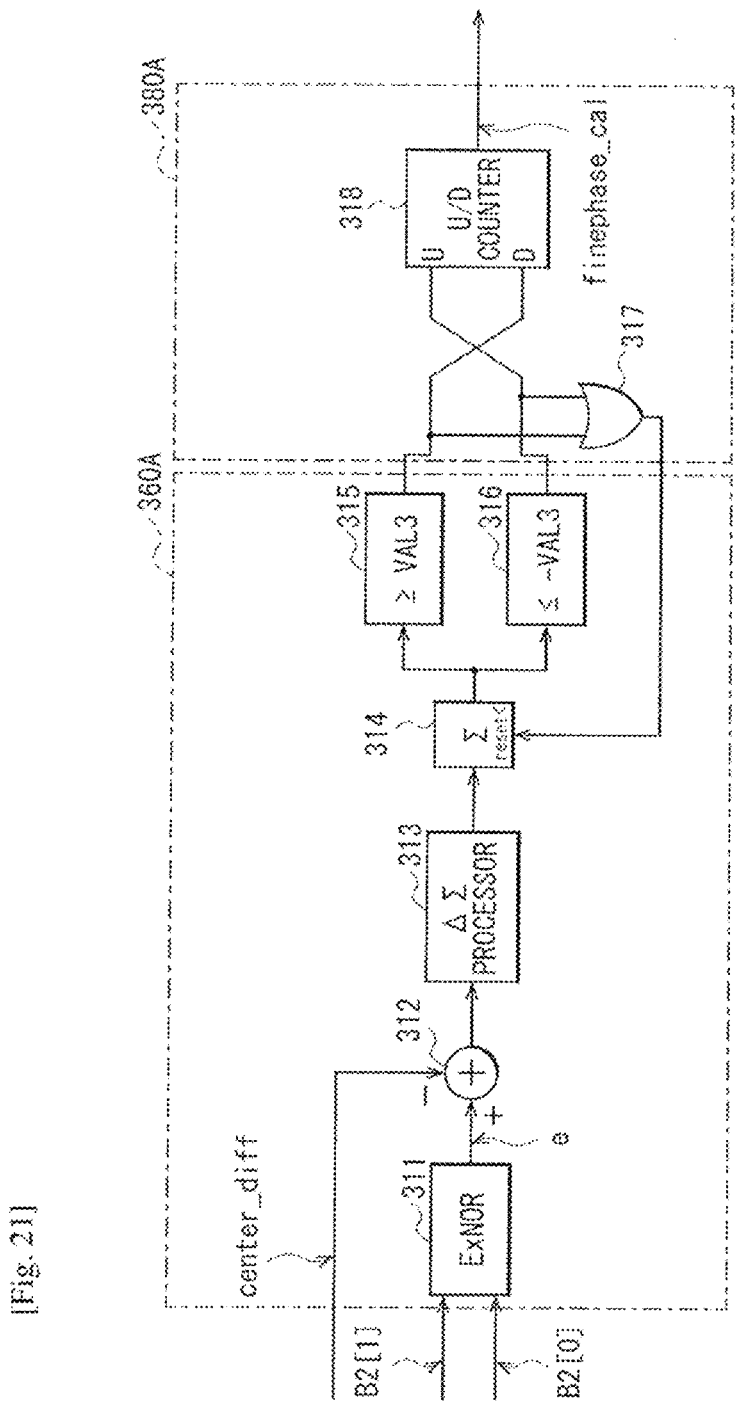

[Fig. 22]
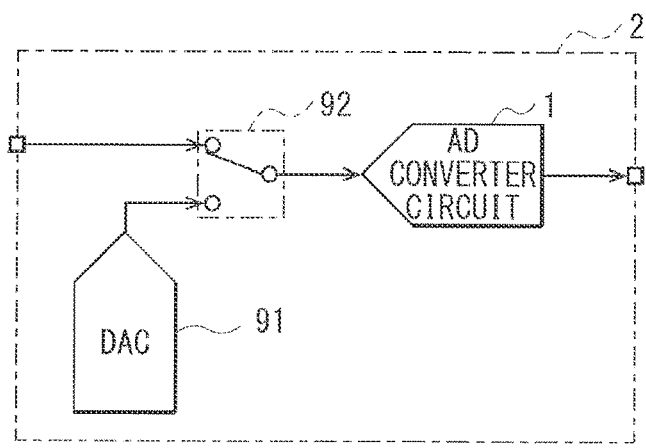

[Fig. 23]
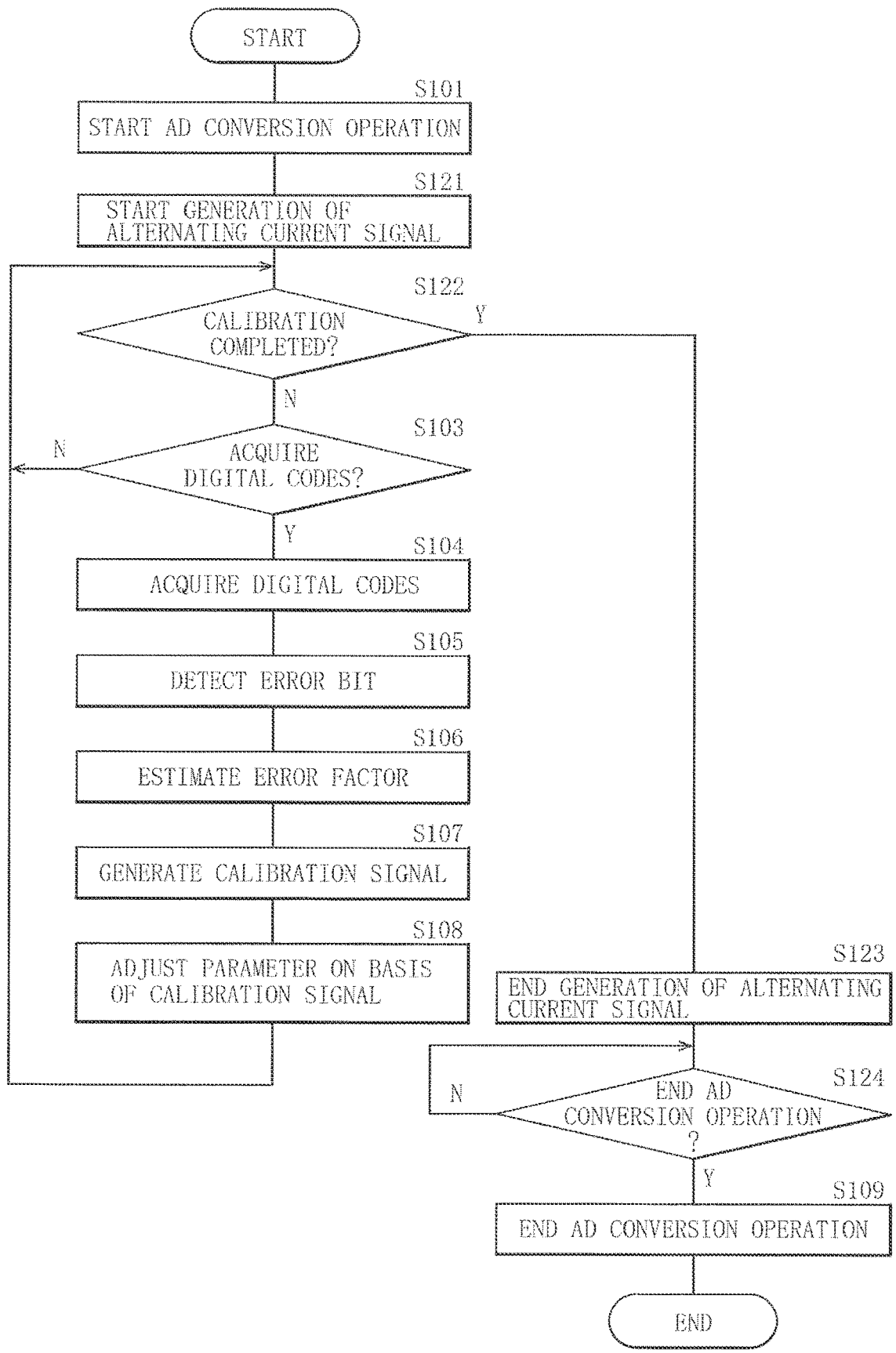

ANALOG-TO-DIGITAL CONVERTER CIRCUIT

TECHNICAL FIELD

The disclosure relates to an analog-to-digital converter circuit that converts an analog signal into a digital signal.

BACKGROUND ART

Some analog-to-digital (which may hereinafter be abbreviated as "AD") converter circuits are able to perform calibration to provide increased AD conversion accuracy. For example, PTL 1 discloses an AD converter circuit configured to perform calibration of an offset voltage of a comparator circuit.

CITATION LIST

Patent Literature

PTL 1: JP 2010-109937A

SUMMARY

Technical Problem

As described above, it is desired that AD converter circuits provide high AD conversion accuracy, and further improvement in AD conversion accuracy is expected.

It is desirable to provide an analog-to-digital converter circuit that is able to achieve increased AD conversion accuracy.

Solution to Problem

An analog-to-digital converter circuit according to an embodiment of the disclosure includes a first converter circuit, a second converter circuit, an error detector, and a calibration circuit. The first converter circuit is configured to generate a first digital code by performing analog-to-digital conversion on the basis of an input voltage. The second converter circuit is configured to generate a second digital code by performing, on the basis of the input voltage and the first digital code, analog-to-digital conversion over a voltage range wider than a voltage range of a least significant bit of the first converter circuit. The error detector is configured to detect a conversion error of the analog-to-digital conversion on a basis of the first digital code and the second digital code, and to thereby generate error data that indicates at which bit in the first digital code and what kind of conversion error has occurred. The calibration circuit is configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit.

In the analog-to-digital converter circuit of the embodiment of the disclosure, the first digital code is generated by performing analog-to-digital conversion on the basis of the input voltage. Thereafter, the second digital code is generated by performing, on the basis of the input voltage and the first digital code, analog-to-digital conversion over a voltage range wider than the voltage range of the least significant bit of the first converter circuit. Thereafter, the error data is generated by detecting a conversion error of the analog-to-digital conversion on the basis of the first digital code and the second digital code. The error data indicates at which bit in the first digital code and what kind of conversion error has occurred. An error factor is estimated on the basis of the first digital code, the second digital code, and the error data. Thereafter, on the basis of the estimation result on the error factor, calibration is performed on a circuit relevant to the error factor estimated, among circuits included in the first converter circuit and the second converter circuit.

BRIEF DESCRIPTION OF DRAWINGS

FIG. 1 is a block diagram illustrating a configuration example of an AD converter circuit according to an example embodiment of the disclosure.

FIG. 2 is a block diagram illustrating a configuration example of a processing circuit illustrated in FIG. 1.

FIG. 3 is a block diagram illustrating a specific but non-limiting example of the processing circuit illustrated in FIG. 2.

FIG. 4 is a block diagram illustrating a specific but non-limiting example of a threshold shift estimation circuit and a signal generation circuit illustrated in FIG. 3.

FIG. 5 is a block diagram illustrating a specific but non-limiting example of another threshold shift estimation circuit and the signal generation circuit.

FIG. 6 is a block diagram illustrating a specific but non-limiting example of a gain mismatch estimation circuit and the signal generation circuit illustrated in FIG. 3.

FIG. 7 is a block diagram illustrating a specific but non-limiting example of a weighting coefficient calculation circuit illustrated in FIG. 6.

FIG. 8 is a block diagram illustrating a specific but non-limiting example of the threshold shift estimation circuit and the signal generation circuit illustrated in FIG. 3.

FIG. 9 is an explanatory diagram illustrating an operation example of a first stage converter illustrated in FIG. 1.

FIG. 10 is an explanatory diagram illustrating an operation example of the first stage converter and a second stage converter illustrated in FIG. 1.

FIG. 11 is an explanatory diagram illustrating an operation example of the first stage converter and the second stage converter illustrated in FIG. 1.

FIG. 12 is an explanatory diagram illustrating an operation example of an error bit detection circuit illustrated in FIG. 3.

FIG. 13 is an explanatory diagram illustrating a characteristic example of the AD converter circuit illustrated in FIG. 1.

FIG. 14 is an explanatory diagram illustrating another characteristic example of the AD converter circuit illustrated in FIG. 1.

FIG. 15 is an explanatory diagram illustrating another characteristic example of the AD converter circuit illustrated in FIG. 1.

FIG. 16 is an explanatory diagram illustrating an operation example of the AD converter circuit illustrated in FIG. 1.

FIG. 17 is an explanatory diagram illustrating an experiment example of the AD converter circuit illustrated in FIG. 1.

FIG. 18 is a flowchart of an operation example of the AD converter circuit illustrated in FIG. 1.

FIG. 19 is a block diagram illustrating a configuration example of an AD converter circuit according to a modification example.

FIG. 20 is a block diagram illustrating a specific but non-limiting example of a processing circuit illustrated in FIG. 19.

FIG. 21 is a block diagram illustrating a specific but non-limiting example of a gain estimation circuit illustrated in FIG. 20.

FIG. 22 is a block diagram illustrating a specific but non-limiting example of an AD converter circuit according to another modification example.

FIG. 23 is a flowchart illustrating an operation example of the AD converter circuit illustrated in FIG. 22.

DESCRIPTION OF EMBODIMENTS

Some embodiments of the disclosure are described below in detail with reference to the drawings.

Example Embodiment

Configuration Example

FIG. 1 illustrates a configuration example of an AD converter circuit 1 according to an example embodiment. The AD converter circuit 1 may include a clock buffer 11, a four-phase clock generator 12, a transistor MN13, a bootstrap circuit 14, a voltage generator 15, four analog-to-digital converters (ADCs) 20 (ADC 20A, ADC 20B, ADC 20C, and ADC 20D), and a multiplexer (MUX) 16.

The clock buffer 11 may be an input buffer that receives a clock signal CLKin. The clock signal CLKin may have a frequency of 15 GHz in this example.

The four-phase clock generator 12 may be configured to generate a four-phase clock signal on the basis of an output signal of the clock buffer 11. The four-phase clock signal may include four clock signals that are different in phase from each other. The four-phase clock generator 12 may supply the four ADCs 20 with the four clock signals generated, respectively.

The transistor MN13 may be an N-type metal oxide semiconductor (MOS) transistor with a drain to be supplied with an input voltage Vin, a gate coupled to the bootstrap circuit 14, and a source coupled to the four ADCs 20.

The bootstrap circuit 14 may be configured to generate a boost voltage by performing a bootstrap operation on the basis of the output signal of the clock buffer 11 and to supply the generated boost voltage to the gate of the transistor MN13. For example, the bootstrap circuit 14 may generate a boost voltage in a case where the output signal of the clock buffer 11 is at a low level, and may supply the generated boost voltage to the gate of the transistor MN13. In a case where the output signal of the clock buffer 11 is at a high level, the bootstrap circuit 14 may supply 0 V to the gate of the transistor MN13. The transistor MN13 may thus supply the input voltage Vin to the four ADCs 20 in the case where the output signal of the clock buffer 11 is at a low level.

The voltage generator 15 may be configured to generate two voltages Vref (voltages VrefC and VrefF) serving as reference voltages. Voltage values of the voltages VrefC and VrefF may be the same in this example. Hereinafter, as appropriate, the term "voltage Vref" will be used to refer to either one of the voltages VrefC and VrefF.

The ADCs 20 may be configured to perform AD conversion on the basis of the input-voltage Vin supplied from the transistor MN13. On the basis of the four-phase clock signal generated by the four-phase clock generator 12, the four ADCs 20 may perform so-called interleaving operations where they operate during mutually different periods sequentially. The ADCs 20 may be successive approximation register (SAR) AD converter circuits.

The ADCs 20 may each include an OR circuit 21, transistors MN22 to MN24, a bootstrap circuit 25, a first stage converter 30, a delay circuit 26, a second stage converter 50, and a processing circuit 27. The ADCs 20 may each be a two-stage AD converter circuit including the first stage converter 30 and the second stage converter 50.

The OR circuit 21 may be configured to generate an internal clock signal CLK1 by determining the logical OR of the clock signal supplied from the clock buffer 11 and the clock signal supplied from the four-phase clock generator 12.

The transistors MN22 to MN24 may be N-type MOS transistors. The transistor MN22 may have a drain coupled to the source of the transistor MN13, a gate coupled to the bootstrap circuit 25, and a source coupled to the first stage converter 30. The transistor MN23 may have a drain coupled to the source of the transistor MN13, a gate coupled to the bootstrap circuit 25, and a source coupled to the first stage converter 30. The transistor MN24 may have a drain coupled to the source of the transistor MN13, a gate coupled to the bootstrap circuit 25, and a source coupled to the first stage converter 30 and the second stage converter 50.

The bootstrap circuit 25 may be configured to generate a boost voltage by performing a bootstrap operation on the basis of the internal clock signal CLK1 and to supply the generated boost voltage to the gates of the transistors MN22 to MN24. For example, in a case where the internal clock signal CLK1 is at a low level, the bootstrap circuit 25 may generate a boost voltage and supply the generated boost voltage to the gates of the transistors MN22 to MN24, and in a case where the internal clock signal CLK1 is at a high level, the bootstrap circuit 25 may supply 0 V to the gates of the transistors MN22 to MN24. The transistors MN22 to MN24 may thus supply the input voltage Vin to the first stage converter 30 and the second stage converter 50 in the case where the internal clock signal CLK1 is at a low level.

The first stage converter 30 is configured to generate a first digital code (signal B1[8:0]) by performing AD conversion on the basis of the input voltage Vin. The signal B1[8:0] may include nine bit data (signals B1[8], B1[7], ..., and B1[0]). The signal B1[8] may correspond to a most significant bit (MSB), and the signal B1[0] may correspond to a least significant bit (LSB). The first stage converter 30 may be a ping-pong SAR AD converter circuit. The ping-pong SAR AD converter circuit is disclosed in, for example, D. Dermit, M. Shrivas, K. Bunsen, J. L. Benites, J. Craninckx and E. Martens, "A 1.67-GSps TI 10-Bit Ping-Pong SAR ADC With 51-dB SNDR in 16-nm FinFET" in IEEE Solid-State Circuits Letters, vol. 3, pp. 150-153, 2020, doi: 10.1109/LSSC. 2020.3008264. The first stage converter 30 may include a coarse phase circuit 33 and coarse digital-to-analog converters (DACs) 31 and 32.

The coarse phase circuit 33 may include nine comparator circuits 48 to 40 in this example. The comparator circuits 48 to 40 may be configured to perform comparison operations to thereby generate the respective signals B1[8], B1[7], B1[6], ..., and B1[0].

The comparator circuit 48 may be configured to generate the signal B1[8] by, comparing the input voltage Vin supplied via the transistor MN24 with one threshold voltage (e.g., 0 V). The comparator circuit 48 may have an in terminal to be supplied with the input voltage Vin via the transistor MN24, a clock terminal to be supplied with the internal clock signal CLK1, a B terminal to output the comparison result as the signal B1[8], and a V terminal to output a valid signal. The comparator circuit 48 may generate the signal B1[8] by comparing the input voltage Vin with the threshold voltage on the basis of a rising edge of the internal clock signal CLK1. In a case where the input voltage Vin is higher than the threshold voltage, the signal B1[8] is "1". In a case where the input voltage Vin is lower than the threshold voltage, the signal B1[8] is "0". After outputting the signal B1[8], the comparator circuit 48 may change the valid signal at the V terminal from a low level to a high level. The comparator circuit 48 may be configured to be able to change the threshold voltage on the basis of a calibration signal off_cal. For example, the comparator circuit 48 may be able to raise or lower the threshold voltage on the basis of the calibration signal off_cal.

The comparator circuit 47 may be configured to generate the signal B1[7] by comparing a voltage generated by the coarse DAC 32 with one of two threshold voltages (e.g., +Nref/2 and −Vref/2) that corresponds to the comparison result acquired by the comparator circuit 48. The comparator circuit 47 may be configured using a split source comparator, for example. The split source comparator is disclosed in, for example, Martens, E., Hershberg, B. and Craninckx, J., "Wide-tuning range programmable threshold comparator using capacitive source-voltage shifting", Electron. Lett., vol. 54, pp. 1417-1418 (2018). The comparator circuit 47 may have a polar terminal to be supplied with the signal B1[8], which is the comparison result acquired by the comparator circuit 48, an in terminal to be supplied with the output voltage of the coarse DAC 32, and a clock terminal to be supplied with the valid signal outputted from the comparator circuit 48. The comparator circuit 47 may generate the signal B1[7] by comparing the output voltage of the coarse DAC 32 with one of the two threshold voltages that corresponds to the signal B1[8] on the basis of a rising edge of the valid signal. The comparator circuit 47 may perform a comparison operation using a positive threshold voltage (+Vref/2 in this example) of the two threshold voltages in a case where the signal B1[8] is "1", and may perform a comparison operation using a negative threshold voltage (−Vref/2 in this example) of the two threshold voltages in a case where the signal B1[8] is "0". In a case where the output voltage of the coarse DAC 32 is higher than the threshold voltage, the signal B1[7] is "1". In a case where the output voltage of the coarse DAC 32 is lower than the threshold voltage, the signal B1[7] is "0". The comparator circuit 47 may be configured to be able to change the two threshold voltages on the basis of calibration signals off_cal and th_cal. For example, the comparator circuit 47 may be able to raise or lower both of the two threshold voltages on the basis of the calibration signal off_cal. Further, the comparator circuit 47 may be able to increase or decrease a difference voltage between the two threshold voltages on the basis of the calibration signal th_cal.

The comparator circuits 46 to 40 may be similar to the comparator circuit 47 in configuration. The comparator circuit 46 may be configured to generate the signal B1[6] by comparing a voltage generated by the coarse DAC 31 with one of two threshold voltages (e.g., +Vref/4 and −Vref/4) that corresponds to the comparison result acquired by the comparator circuit 47. The comparator circuit 45 may be configured to generate the signal B1[5] by comparing a voltage generated by the coarse DAC 32 with one of two threshold voltages (e.g., +Vref/8 and −Vref/8) that corresponds to the comparison result acquired by the comparator circuit 46. The comparator circuit 44 may be configured to generate the signal B1[4] by comparing the voltage generated by the coarse DAC 31 with one of two threshold voltages (e.g., +Vref/16 and −Vref/16) that corresponds to the comparison result acquired by the comparator circuit 45. The comparator circuit 43 may be configured to generate the signal B1[3] by comparing the voltage generated by the coarse DAC 32 with one of two threshold voltages (e.g., +Vref/32 and −Vref/32) that corresponds to the comparison result acquired by the comparator circuit 44. The comparator circuit 42 may be configured to generate the signal B1[2] by comparing the voltage generated by the coarse DAC 31 with one of two threshold voltages (e.g., +Vref/64 and −Vref/64) that corresponds to the comparison result acquired by the comparator circuit 43. The comparator circuit 41 may be configured to generate the signal B1[1] by comparing the voltage generated by the coarse DAC 32 with one of two threshold voltages (e.g., +Vref/128 and −Vref/128) that corresponds to the comparison result acquired by the comparator circuit 42. The comparator circuit 40 may be configured to generate the signal B1[0] by comparing the voltage generated by the coarse DAC 31 with one of two threshold voltages (e.g., +Vref/256 and −Vref/256) that corresponds to the comparison result acquired by the comparator circuit 411. The comparator circuits 46 to 40 may each be able to change the threshold voltage on the basis of the calibration signals off_cal and th_cal.

As described above, the comparator circuits 47, 45, 43, and 41 may be supplied with the voltage generated by the course DAC 32, and the comparator circuits 46, 44, 42, and 40 may be supplied with the voltage generated by the coarse DAC 31. Thereafter, the comparator circuit 48 may perform the comparison operation using one threshold voltage, and the comparator circuits 47 to 40 may each perform the comparison operation using two threshold voltages. The comparator circuits 48 to 40 may be able to change the threshold voltages individually on the basis of the calibration signals off_cal and th_cal.

The coarse DAC 31 may be configured to generate the voltage to be supplied to the comparator circuits 46, 44, 42, and 40 of the coarse phase circuit 33 on the basis of a signal B1[8:2]. The coarse DAC 31 may be a capacitor array DAC. In this example, the coarse DAC 31 may include seven capacitors and one variable capacitor. Capacitance values of the seven capacitors may be, in this example, weighted in the following manner: 64Cu; 32Cu; 16Cu; 8Cu; 4Cu; 2Cu; and Cu. Respective first ends of these seven capacitors may be coupled to each other, and may also be coupled to the source of the transistor MN23 and to the comparator circuits 46, 44, 42, and 40 of the coarse phase circuit 33. Respective second ends of the seven capacitors may be selectively grounded or supplied with the voltage VrefC on the basis of the signal B1[8:2]. The variable capacitor may be variable in capacitance value on the basis of a calibration signal DAC1_cal having two or more bits. This makes it possible for the coarse DAC 31 to change gain. A first end of the variable capacitor may be coupled to the first ends of the seven capacitors, and may also be coupled to the source of the transistor MN23 and to the comparator circuits 46, 44, 42, and 40 of the coarse phase circuit 33. A second end of the variable capacitor may be grounded. With this configuration, in a case where the transistor MN23 is on, the input voltage Vin is supplied to the coarse DAC 31 via the transistor MN23 to cause the seven capacitors and the variable capacitor of the coarse DAC 31 to be charged. Thereafter, the coarse DAC 31 may switch the connections of the seven capacitors on the basis of the signal B1[8:2]. The coarse DAC 31 may thereby generate a voltage on the basis of the signal B1[8:2] and supply the generated voltage to the comparator circuits 46, 44, 42, and 40 of the coarse phase circuit 33.

The coarse DAC 32 may be configured to generate the voltage to be supplied to the comparator circuits 47, 45, 43, and 41 of the coarse phase circuit 33 on the basis of a signal B1[8:3], The coarse DAC 32 may be similar to the coarse DAC 31 in configuration, and may include seven capacitors and one variable capacitor in this example. Respective first ends of the seven capacitors may be coupled to each other, and may also be coupled to the source of the transistor MN22 and to the comparator circuits 47, 45, 43, and 41 of the coarse phase circuit 33. The variable capacitor may be variable in capacitance value on the basis of a calibration signal DAC2_cal having two or more bits. This makes it possible for the coarse DAC 32 to change gain. In a case where the transistor MN22 is on, the input voltage Vin is supplied to the coarse DAC 32 via the transistor MN22 to cause the seven capacitors and the variable capacitor of the coarse DAC 32 to be charged. Thereafter, the coarse DAC 32 may switch the connections of the seven capacitors on the basis of the signal B1[8:3]. The coarse DAC 32 may thereby generate a voltage on the basis of the signal B1[8:3] and supply the generated voltage to the comparator circuits 47, 45, 43, and 41 of the coarse phase circuit 33.

With this configuration, the first stage converter 30 performs AD conversion on the basis of the input voltage Vin, and generates the first digital code (signal B1[8:0]) in the order from the signal B1[8].

The delay circuit 26 may be configured to delay a valid signal outputted from the comparator circuit 40 by a predetermined time, and to supply the delayed valid signal to the second stage converter 50.

The second stage converter 50 is configured to generate a second digital code (signal B2[1:0]) by performing AD conversion on the basis of the input voltage Vin and the first digital code (signal B1[8:0]). The signal B2[1:0] may include two bit data (signals B2[1] and B2[0]). The signal B2[1] may correspond to the most significant bit (MSB), and the signal B2[0] may correspond to the least significant bit (LSB). The second stage converter 50 may include a fine DAC 51 and a fine phase circuit 52.

The fine DAC 51 may be configured to generate a voltage to be supplied to the fine phase circuit 52 on the basis of the signal B1[8:0]. The fine DAC 51 may be a capacitor array DAC. In this example, the fine DAC 51 may include nine capacitors and one variable capacitor. Capacitance values of the nine capacitors may be, in this example, weighted in the following manner: 128Cu; 64Cu; 32Cu; 16Cu; 8Cu; 4Cu; 2Cu; Cu; and 0.5Cu. Respective first ends of these nine capacitors may be coupled to each other, and may also be coupled to the source of the transistor MN24 and to the fine phase circuit 52. Respective second ends of the nine capacitors may be selectively grounded or supplied with the voltage VrefF on the basis of the signal B1[8:0]. A first end of the variable capacitor may be coupled to the first ends of the nine capacitors, and may also be coupled to the source of the transistor MN24 and to the fine phase circuit 52. A second end of the variable capacitor may be grounded. With this configuration, in a case where the transistor MN24 is on, the input voltage Vin is supplied to the fine DAC 51 via the transistor MN24 to cause the nine capacitors and the variable capacitor of the fine DAC 51 to be charged. The fine DAC 51 may generate a voltage on the basis of the signal B1[8:0] generated by the first stage converter 30, and may supply the generated voltage to the fine phase circuit 52. For example, the fine DAC 51 may start to generate the voltage after the first stage converter 30 has generated all of the nine bit data in the signal B1[8:0], or after the first stage converter 30 has generated some of the nine bit data in the signal B1[8:0].

The fine phase circuit 52 may include a comparator circuit 61, a selector 69, and comparator circuits 60P and 60N.

The comparator circuit 61 may be configured to generate the signal B2[2] by comparing the voltage generated by the fine DAC 51 with a predetermined threshold voltage Vth (0 V). The comparator circuit 61 may have an in terminal to be supplied with the output voltage of the fine DAC 51, a clock terminal to be supplied with the valid signal from the comparator circuit 40 of the coarse phase circuit 33 via the delay circuit 26, a B terminal to output the comparison result as the signal B2[1], and a V terminal to output a valid signal. The comparator circuit 61 may generate the signal B2[1] by comparing the output voltage of the fine DAC 51 with the threshold voltage Vth on the basis of the rising edge of the valid signal. In a case where the output voltage of the fine DAC 51 is higher than the threshold voltage Vth, the signal B2[1] is "1". In a case where the output voltage of the fine DAC 51 is lower than the threshold voltage Vth, the signal B2[1] is "0".

The selector 69 may be configured to supply the valid signal generated by the comparator circuit 61 to either one of the comparator circuit 60P and the comparator circuit 60N. For example, the selector 69 may supply the valid signal to the comparator circuit 60P in the case where the signal B2[1] is "1", and may supply the valid signal to the comparator circuit 60N in the case where the signal B2[1] is "0".

The comparator circuit 60P may be configured to generate the signal B2[0] by, comparing the voltage generated by the fine DAC 51 with a positive threshold voltage VthP (e.g., +Vref/512). The comparator circuit 60P may have an in terminal to be supplied with the output voltage of the fine DAC 51, and a clock terminal to receive the valid signal supplied from the comparator circuit 61 via the selector 69. The comparator circuit 60P may generate the signal B2[0] by comparing the output voltage of the fine DAC 51 with the positive threshold voltage VthP on the basis of the rising edge of the valid signal. In a case where the output voltage of the fine DAC 51 is higher than the threshold voltage VthP, the signal B2[0] is "1". In a case where the output voltage of the fine DAC 51 is lower than the threshold voltage VthP, the signal B2[0] is "0". The comparator circuit 60P may be able to change the threshold voltage VthP on the basis of a signal caloffsetp included in a calibration signal finephase_cal.

The comparator circuit 60N may be configured to generate the signal B2[0] by comparing the voltage generated by the fine DAC 51 with a negative threshold voltage VthN (e.g., -Vref/512). The comparator circuit 60N may have an in terminal to be supplied with the output voltage of the fine DAC 51, and a clock terminal to receive the valid signal supplied from the comparator circuit 61 via the selector 69. The comparator circuit 60N may generate the signal B2[0] by comparing the output voltage of the fine DAC 51 with the negative threshold voltage VthN on the basis of the rising edge of the valid signal. In a case where the output voltage of the fine DAC 51 is higher than the threshold voltage VthN, the signal B2[0] is "1". In a case where the output voltage of the fine DAC 51 is lower than the threshold voltage VthN, the signal B2[0] is "0". The comparator circuit 60N may be able to change the threshold voltage VthN on the basis of a signal caloffsetn included in the calibration signal finephase_cal.

With this configuration, the second stage converter 50 performs AD conversion on the basis of the input voltage Vin and the first digital code (signal B1[8:0]). The selector 69 may supply the valid signal to either the comparator circuit 60P or the comparator circuit 60N. Thus, either one of the comparator circuit 60P and the comparator circuit 60N may generate the signal B2[0]. In such a manner, the second stage converter 50 generates the second digital code (signal B2[1:0]).

The processing circuit 27 may be configured to generate data DT by performing an error correction process on the basis of the first digital code (signal B1[8:0]) generated by the first stage converter 30 and the second digital code (signal B2[1:0]) generated by the second stage converter 50. Further, the processing circuit 27 may be able to perform a calibration process, that is, adjustments of the threshold voltages of the comparator circuits 48 to 40 in the coarse phase circuit 33, the gains of the coarse DACs 31 and 32, and the threshold voltages VthP and VthN of the comparator circuits 60P and 60N in the fine phase circuit 52, on the basis of the first digital code and the second digital code.

FIG. 2 illustrates a configuration example of the processing circuit 27. The processing circuit 27 may include an error correction circuit 71, an error bit detection circuit 72, an error factor estimation circuit 73, and a calibration signal generation circuit 74.

The error correction circuit 71 may be configured to perform the error correction process on the basis of the first digital code and the second digital code. The error correction circuit 71 may thereafter supply the first digital code and the second digital code having undergone the error correction process, as the data DT, to the multiplexer 16 (FIG. 1).

The error bit detection circuit 72 is configured to detect a conversion error of the AD conversion on the basis of the first digital code and the second digital code, and to thereby generate error data DTE that indicates at which bit in the first digital code and what kind of conversion error has occurred.

In a more specific but non-limiting example, the error data DTE may include nine error flags e8 to e0. The error flags e8 to e0 may be data about errors of the nine bit data of the signal B1[8:0] generated by the coarse phase circuit 33. Each of the error flags e8 to e0 may take on three values: "1"; "0"; and "−1". A detailed description will be given below, taking the error flag e8 and the error flag e7 as an example. The error flag e8 relates to the signal B1[8] that the comparator circuit 48 (FIG. 1) generates. The error flag e7 relates to the signal B1[7] that the comparator circuit 47 generates.

For example, in a case where the signal B1[8] has no error, the error flag e8 is "0". Further, in a case where the signal B1[8] is erroneously "0" although originally expected to be "1", the error flag e8 is "1". The error flag e8 can be "1" in this way in a case where the threshold voltage of the comparator circuit 48 is higher than a desired voltage, for example. Further, in a case where the signal B1[8] is erroneously "1" although originally expected to be "0", the error flag e8 is "−1". The error flag e8 can be "−1" in this way in a case where the threshold voltage of the comparator circuit 48 is lower than the desired voltage, for example.

Likewise, for example, in a case where the signal B1[7] has no error, the error flag e7 is "0". Further, in a case where the signal B1[7] is erroneously "0" although originally expected to be "1", the error flag e7 is "1". The error flag e7 can be "1" in this way in a case where one of the two threshold voltages of the comparator circuit 47 that is used when generating the signal B1[7] is higher than a desired voltage, for example. Further, in a case where the signal B1[7] is erroneously "1" although originally expected to be "0", the error flag e7 is "−1". The error flag e7 can be "−1" in this way in a case where one of the two threshold voltages of the comparator circuit 47 that is used when generating the signal B1[7] is lower than the desired voltage, for example. The same applies to the error flags e6 to e0.

The error factor estimation circuit 73 is configured to estimate a factor of the conversion error of the AD conversion on the basis of the first digital code and the second digital code.

The calibration signal generation circuit 74 may be configured to generate the calibration signals off_cal, th_cal, DAC1_cal, DAC2_cal, and finephase_cal on the basis of the estimation results acquired by the error factor estimation circuit 73. The calibration signals off_cal and th_cal may be signals for adjusting the threshold voltages of the comparator circuits 48 to 40 in the coarse phase circuit 33. The calibration signal off_cal may include nine signals to be respectively supplied to the comparator circuits 48 to 40. The calibration signal th_cal may include eight signals to be respectively supplied to the comparator circuits 47 to 40. The calibration signal DAC1_cal may be a signal for adjusting the gain of the coarse DAC 31. The calibration signal DAC2_cal may be a signal for adjusting the gain of the coarse DAC 32. The calibration signal finephase_cal may be a signal for adjusting the threshold voltages of the comparator circuits 60P and 60N in the fine phase circuit 52, and may include the signals caloffsetp and caloffsetn.

FIG. 3 illustrates a configuration example of the error factor estimation circuit 73 and the calibration signal generation circuit 74. Note that the error correction circuit 71 and the error bit detection circuit 72 are also illustrated in FIG. 3.

The error factor estimation circuit 73 may include threshold shift estimation circuits 147 to 140, gain mismatch estimation circuits 231 and 232, and a threshold shift estimation circuit 360. The calibration signal generation circuit 74 may include signal generation circuits 180, 280, and 380.

(Threshold Shift Estimation Circuits 147 to 140 and Signal Generation Circuit 180)

The threshold shift estimation circuits 147 to 140 may be provided to correspond respectively to eight comparator circuits 47 to 40 of the nine comparator circuits 48 to 40 in the coarse phase circuit 33 other than the comparator circuit 48 corresponding to the MSB, and may each be configured to estimate a shift of the threshold voltage of a corresponding one of the comparator circuits.

Each of the threshold shift estimation circuits 147 to 140 may include a threshold identifier 171, a switch 172, a positive threshold counter 173, a negative threshold counter 174, and a threshold shift determinator 175. The threshold identifier 171 may be configured to identify which of the positive and negative threshold voltages has been used in the corresponding comparator circuit. The switch 172 may be configured to supply, on the basis of the identification result acquired by the threshold identifier 171, either the positive threshold counter 173 or the negative threshold counter 174 with an error flag ei (i is an integer in the range of 0 to 8) to be inputted to the relevant threshold shift estimation circuit, among the error flags e8 to e0 included in the error data DTE. The positive threshold counter 173 may be configured to cumulatively add the values of the error flag ei related to the positive threshold voltage. The negative threshold counter 174 may be configured to cumulatively add the values of the error flag ei related to the negative threshold voltage. The threshold shift determinator 175 may be configured to determine a shift of the threshold voltage, using a reference value, on the basis of a cumulative value at the positive threshold counter 173 and a cumulative value at the negative threshold counter 174.

FIG. 4 illustrates a more specific but non-limiting example of a configuration of t threshold shift estimation circuit 147 and the signal generation circuit 180 corresponding to the comparator circuit 47. The threshold shift estimation circuits 146 to 140 corresponding to the comparator circuits 46 to 40 are similar to the threshold shift estimation circuit 147. The threshold shift estimation circuit 147 may estimate a shift of the threshold voltage of the comparator circuit 47. Although a circuit in the signal generation circuit 180 corresponding to the comparator circuit 47 is only illustrated in FIG. 4, other circuits in the signal generation circuit 180 corresponding to the comparator circuits 46 to 40 may be similar to the illustrated one. The threshold shift estimation circuit 147 may include a selector 111, counters 112 and 113, and determination circuits 114 to 117. The signal generation circuit 180 may include OR circuits 118 to 122 and up/down (U/D) counters 123 and 124. The selector 111 may correspond to the threshold identifier 171 and the switch 172 illustrated in FIG. 3. The counter 112 may correspond to the positive threshold counter 173 illustrated in FIG. 3. The counter 113 may correspond to the negative threshold counter 174 illustrated in FIG. 3. The determination circuits 114 to 117 may correspond to the threshold shift determinator 175 illustrated in FIG. 3.

The selector 111 may be configured to supply the value of the error flag e7 to the counter 112 or the counter 113 on the basis of the signal B1[8]. For example, the selector 111 may supply the value of the error flag e7 to the counter 112 in the case where the signal B1[8] is "1", and may supply the value of the error flag e7 to the counter 113 in the case where the signal B1[8] is "0".

In this example, a description is given with reference to the selector 111 of the threshold shift estimation circuit 147 corresponding to the comparator circuit 47. However, for example, in the threshold shift estimation circuit 146 corresponding to the comparator circuit 46, the selector 111 may supply the value of the error flag e6 to the counter 112 or the counter 113 on the basis of the signal B1[7]. In the threshold shift estimation circuit 145 corresponding to the comparator circuit 45, the selector 111 may supply the value of the error flag e5 to the counter 112 or the counter 113 on the basis of the signal B1[6]. In the threshold shift estimation circuit 144 corresponding to the comparator circuit 44, the selector 111 may supply the value of the error flag e4 to the counter 112 or the counter 113 on the basis of the signal B1[5]. In the threshold shift estimation circuit 143 corresponding to the comparator circuit 43, the selector 111 may supply the value of the error flag e3 to the counter 112 or the counter 113 on the basis of the signal B1[4]. In the threshold shift estimation circuit 142 corresponding to the comparator circuit 42, the selector 111 may supply the value of the error flag e2 to the counter 112 or the counter 113 on the basis of the signal B1[3]. In the threshold shift estimation circuit 141 corresponding to the comparator circuit 41, the selector 111 may supply the value of the error flag e1 to the counter 112 or the counter 113 on the basis of the signal B1[2]. In the threshold shift estimation circuit 140 corresponding to the comparator circuit 40, the selector 111 may supply the value of the error flag e0 to the counter 112 or the counter 113 on the basis of the signal B1[1].

The counter 112 may be configured to cumulatively add the values of the error flag e7 supplied from the selector 111.

The counter 112 may reset the cumulative value in a case where the output signal of the OR circuit 122 reaches a high level.

The counter 113 may be configured to cumulatively add the values of the error flag e7 supplied from the selector 111. The counter 113 may reset the cumulative value in a case where the output signal of the OR circuit 122 reaches a high level.

This configuration makes it possible for the threshold shift estimation circuit 147 to separately count the number of conversion errors for the case where the comparator circuit 47 performs comparison operation using a positive threshold voltage (e.g., +Vref/2) and the number of conversion errors for the case where the comparator circuit 47 performs comparison operation using a negative threshold voltage (e.g., −Vref/2).

That is, the signal B1[8] being "1" indicates that the comparator circuit 47 performs comparison operation using a positive threshold voltage. In the case where the signal B1[8] is "1", the selector 111 may supply the error flag e7 to the counter 112. The counter 112 may thus count the number of conversion errors for the case where the comparator circuit 47 performs comparison operation using a positive threshold voltage. For example, in a case where the positive threshold voltage is higher than a desired voltage, the value of the error flag e7 is "1" and therefore the value at the counter 112 increases from "0". In contrast, for example, in a case where the positive threshold voltage is lower than the desired voltage, the value of the error flag e7 is "−1" and therefore the value at the counter 112 decreases from "0".

Likewise, the signal B1[8] being "0" indicates that the comparator circuit 47 performs comparison operation using a negative threshold voltage. In the case where the signal B1[8] is "0", the selector 111 may supply the error flag e7 to the counter 113. The counter 113 may thus count the number of conversion errors for the case where the comparator circuit 47 performs comparison operation using a negative threshold voltage. For example, in a case where the negative threshold voltage is higher than a desired voltage, the value of the error flag e7 is "1" and therefore the value at the counter 113 increases from "0". In contrast, for example, in a case where the negative threshold voltage is lower than the desired voltage, the value of the error flag e7 is "−1" and therefore the value at the counter 113 decreases from "0".

The determination circuit 114 may be configured to determine whether or not the cumulative value at the counter 112 is greater than or equal to a predetermined value "VAL1" (≥VAL1). The determination circuit 114 may output "1" in a case where the cumulative value is greater than or equal to the predetermined value "VAL1.", and may output "0" in a case where the cumulative value is less than the predetermined value "VAL1". Similarly, the determination circuit 115 may be configured to determine whether or not the cumulative value at the counter 112 is less than or equal to a predetermined value "−VAL1" (≤−VAL1). The determination circuit 116 may be configured to determine whether or not the cumulative value at the counter 113 is less than or equal to the predetermined value "−VAL1" (≤−VAL1). The determination circuit 117 may be configured to determine whether or not the cumulative value at the counter 113 is greater than or equal to the predetermined value "VAL1" (≥VAL1).

The OR circuit 118 may be configured to determine the logical OR of an output signal of the determination circuit 114 and an output signal of the determination circuit 117.

The OR circuit 119 may be configured to determine the logical OR of an output signal of the determination circuit 115 and an output signal of the determination circuit 116. The OR circuit 120 may be configured to determine the logical OR of the output signal of the determination circuit 114 and the output signal of the determination circuit 116. The OR circuit 121 may be configured to determine the logical OR of the output signal of the determination circuit 115 and the output signal of the determination circuit 117.

The OR circuit 122 may be configured to determine the logical OR of an output signal of the OR circuit 118, an output signal of the OR circuit 119, an output signal of the OR circuit 120, and an output signal of the OR circuit 121. The OR circuit 122 may supply the operation result to the counters 112 and 113. The counters 112 and 113 may reset the cumulative values on the basis of an output signal of the OR circuit 122.

The up/down counter 123 may be configured to increase or decrease the count value on the basis of the output signals of the OR circuits 118 and 119 and to thereby generate the calibration signal off_cal for adjusting the threshold voltages of the comparator circuit 47. The up/down counter 123 may have a U terminal to be supplied with the output signal of the OR circuit 118, and a D terminal to be supplied with the output signal of the OR circuit 119. The up/down counter 123 may further have a step terminal to be supplied with a step value off_step for increasing or decreasing the count value. The up/down counter 123 may increase the count value by the step value off_step in a case where, for example, the signal at the U terminal is at a high level, and may decrease the count value by the step value off_step in a case where, for example, the signal at the D terminal is at a high level. The up/down counter 123 may output the changed count value as the calibration signal off_cal for adjusting the two threshold voltages of the comparator circuit 47.

In this example, when the calibration signal off_cal for adjusting the two threshold voltages of the comparator circuit 47 indicates a larger value, the comparator circuit 47 may make both of the two threshold voltages lower, and when the calibration signal off_cal indicates a smaller value, the comparator circuit 47 may make both of the two threshold voltages higher.

The up/down counter 124 may be configured to increase or decrease the count value on the basis of the output signals of the OR circuits 120 and 121 and to thereby generate the calibration signal th_cal for adjusting the threshold voltages of the comparator circuit 47. The up/down counter 124 may have a U terminal to be supplied with the output signal of the OR circuit 120, and a D terminal to be supplied with the output signal of the OR circuit 121. The up/down counter 124 may further have a step terminal to be supplied with a step value th_step for increasing or decreasing the count value. The up/down counter 124 may increase the count value by the step value th_step in a case where, for example, the signal at the U terminal is at a high level, and may decrease the count value by the step value th_step in a case where, for example, the signal at the D terminal is at a high level. The up/down counter 124 may output the changed count value as the calibration signal th_cal for adjusting the two threshold voltages of the comparator circuit 47.

In this example, when the calibration signal th_cal for adjusting the two threshold voltages of the comparator circuit 47 indicates a larger value, the comparator circuit 47 may make the difference voltage between the two threshold voltages smaller, and when the calibration signal th_cal indicates a smaller value, the comparator circuit 47 may make the difference voltage between the two threshold voltages larger.

Description has been given above of the threshold shift estimation circuits 147 to 140 corresponding to the comparator circuits 47 to 40. A threshold shift estimation circuit 148 corresponding to the comparator circuit 48 may be configured as illustrated in FIG. 5, using the circuits in an upper half portion of the threshold shift estimation circuit 147 illustrated in FIG. 4. The threshold shift estimation circuit 148 may include the counter 112 and the determination circuits 114 and 115. The signal generation circuit 180 may include an OR circuit 132 and the up/down counter 123. The counter 112 may be configured to cumulatively add the values of the error flag e8. The counter 112 may reset the cumulative value in a case where an output signal of the OR circuit 132 reaches a high level. The determination circuit 114 may be configured to determine whether or not the cumulative value at the counter 112 is greater than or equal to the predetermined value "VAL1" (≥VAL1). The determination circuit 115 may be configured to determine whether or not the cumulative value at the counter 112 is less than or equal to the predetermined value "−VAL1" (≤−VAL1). The OR circuit 132 may be configured to determine the logical OR of an output signal of the determination circuit 114 and an output signal of the determination circuit 115. The up/down counter 123 may be configured to increase or decrease the count value on the basis of the output signals of the determination circuits 114 and 115 and to thereby generate the calibration signal off_cal for adjusting the threshold voltage of the comparator circuit 48. In this example, when the calibration signal off_cal for adjusting the threshold voltage of the comparator circuit 48 indicates a larger value, the comparator circuit 48 may make the threshold voltage lower, and when the calibration signal off_cal indicates a smaller value, the comparator circuit 48 may make the threshold voltage higher.

(Gain Mismatch Estimation Circuits 231 and 232 and Signal Generation Circuit 280)

The gain mismatch estimation circuits 231 and 232 (FIG. 3) may be provided to correspond to the coarse DACs 31 and 32, respectively, and may each be configured to estimate a gain mismatch of a corresponding one of the course DACs. It is desired that the gain of the coarse DAC 31 and the gain of the coarse DAC 32 be substantially the same as the gain of the fine DAC 51. The gain mismatch estimation circuit 231 may estimate a mismatch of the gain of the coarse DAC 31 with respect to the gain of the fine DAC 51. The gain mismatch estimation circuit 232 may estimate a mismatch of the gain of the coarse DAC 32 with respect to the gain of the fine DAC 51.

Each of the gain mismatch estimation circuits 231 and 232 may include a weight setter 271, a correlator 272, and a gain mismatch determinator 273. The weight setter 271 may be configured to set a weight for the error flag ei. The correlator 272 may be configured to calculate a degree of correlation between the first digital code (signal B1[8:0]) and one or more error flags ei to be inputted to the relevant gain mismatch estimation circuit. The gain mismatch determinator 273 may be configured to determine the gain mismatch, using a reference value, on the basis of the calculation result acquired by the correlator 272.

FIG. 6 illustrates a more specific but non-limiting example of a configuration of the gain mismatch estimation circuit 231 corresponding to the coarse DAC 31, the gain mismatch estimation circuit 232 corresponding to the coarse DAC 32, and the signal generation circuit 280. The gain mismatch estimation circuit 231 may include a weighting coefficient calculation circuit 211, a multiplier circuit 213, a counter 214, and determination circuits 215 and 216. The gain mismatch estimation circuit 232 may include the weighting coefficient calculation circuit 211, an OR circuit 222, a multiplier circuit 223, a counter 224, and determination circuits 225 and 226. The signal generation circuit 280 may include OR circuits 217 and 227 and up/down counters 218 and 228. In the gain mismatch estimation circuit 231, the weighting coefficient calculation circuit 211 may correspond to the weight setter 271 illustrated in FIG. 3, the multiplier circuit 213 and the counter 214 may correspond to the correlator 272 illustrated in FIG. 3, and the determination circuits 215 and 216 may correspond to the gain mismatch determinator 273 illustrated in FIG. 3. In the gain mismatch estimation circuit 232, the weighting coefficient calculation circuit 211 may correspond to the weight setter 271 illustrated in FIG. 3, the multiplier circuit 223 and the counter 224 may correspond to the correlator 272 illustrated in FIG. 3, and the determination circuits 225 and 226 may correspond to the gain mismatch determinator 273 illustrated in FIG. 3.

The weighting coefficient calculation circuit 211 may be configured to calculate a weighting coefficient on the basis of the signal B1[8:5].

FIG. 7 illustrates an operation example of the weighting coefficient calculation circuit 211. In FIG. 7, the horizontal axis represents the value of the signal B1[8:5], and the vertical axis represents the weighting coefficient. The signal B1 [8:5] includes four bit data, and therefore the value indicated by the signal B1 [8:5] is in the range of 0 to 15. The weighting coefficient calculation circuit 211 may calculate the weighting coefficient on the basis of the signal B1[8:5] such that, in this example, the larger the value of the signal B1[8:5] is, the larger positive value the weighting coefficient has, and that the smaller the value of the signal B1[8:5] is, the smaller negative value the weighting coefficient has. Although the weighting coefficient is calculated using the signal B1[8:5] in this example, this is non-limiting. The weighting coefficient may be calculated using the signal B1[8:6], the signal B1[8:4], or the signal B1[8:0].

The multiplier circuit 213 may be configured to multiply the value of the error flag e0 by the weighting coefficient calculated by the weighting coefficient calculation circuit 211. The error flag e0 may be data about the error of the signal B1[0] generated by the coarse phase circuit 33. The signal B1[0] may be the comparison result acquired by the comparator circuit 40 to which the voltage generated by the coarse DAC 31 is to be supplied. The error flag e0 may thus reflect the characteristic of the coarse DAC 31.

The counter 214 may be configured to cumulatively add the multiplication results acquired by the multiplier circuit 213. The counter 214 may reset the cumulative value in a case where an output signal of the OR circuit 217 reaches a high level.

This configuration makes it possible for the gain mismatch estimation circuit 231 to calculate the degree of correlation between the first digital code (signal B1[8:0]) and the error flag e0. That is, for example, as will be described later, in a case where there is no gain mismatch in the coarse DAC 31, there is almost no correlation between the first digital code and the error flag e0, for example. In such a case, the multiplication result acquired by the multiplier circuit 213 multiplying the value of the error flag e0 by the weighting coefficient calculated by the weighting coefficient calculation circuit 211 can take on a positive value or a negative value, and therefore the value at the counter 214 remains at substantially "0", for example.

For example, in a case where the gain of the coarse DAC 31 is lower than the gain of the fine DAC 51, as will be described later, the closer to the maximum value the value of the first digital code is, the more likely the error flag e0 is to become "−1", whereas the closer to the minimum value the value of the first digital code is, the more likely the error flag e0 is to become "1". In other words, there is a correlation between the first digital code and the error flag e0. In such a case, the multiplication result acquired by the multiplier circuit 213 multiplying the value of the error flag e0 by the weighting coefficient calculated by the weighting coefficient calculation circuit 211 tends to be negative, and therefore the value at the counter 214 decreases from "0".

For example, in a case where the gain of the coarse DAC 31 is higher than the gain of the fine DAC 51, the closer to the maximum value the value of the first digital code is, the more likely the error flag e0 is to become "1", whereas the closer to the minimum value the value of the first digital code is, the more likely the error flag e0 is to become "−1". In other words, there is a correlation between the first digital code and the error flag e0. In such a case, the multiplication result acquired by the multiplier circuit 213 multiplying the value of the error flag e0 by the weighting coefficient calculated by the weighting coefficient calculation circuit 211 tends to be positive, and therefore the value at the counter 214 increases from "0".

The determination circuit 215 may be configured to determine whether or not the cumulative value at the counter 214 is greater than or equal to a predetermined value "VAL2" (≥VAL2). The determination circuit 216 may be configured to determine whether or not the cumulative value at the counter 214 is less than or equal to a predetermined value "−VAL2" (≤−VAL2).

The OR circuit 217 may be configured to determine the logical OR of an output signal of the determination circuit 215 and an output signal of the determination circuit 216. The OR circuit may supply the operation result to the counter 214.

The up/down counter 218 may be configured to increase or decrease the count value on the basis of the output signals of the determination circuits 215 and 216 and to thereby generate the calibration signal DAC1_cal for adjusting the gain of the coarse DAC 31. The up/down counter 218 may have a U terminal to be supplied with the output signal of the determination circuit 215, and a D terminal to be supplied with the output signal of the determination circuit 216. The up/down counter 218 may increase the count value in a case where, for example, the signal at the U terminal is at a high level, and may decrease the count value in a case where, for example, the signal at the D terminal is at a high level. The up/down counter 218 may output the changed count value as the calibration signal DAC1_cal for adjusting the gain of the coarse DAC 31.

In this example, when the calibration signal DAC1_cal indicates a larger value, the coarse DAC 31 may make the gain lower by making the capacitance value of the variable capacitor larger, and when the calibration signal DAC1_cal indicates a smaller value, the coarse DAC 31 may make the gain higher by making the capacitance value of the variable capacitor smaller.

The OR circuit 222 may be configured to output one of the values of any of the error flags e7, e5, e3, and e1 that are not "0". The error flags e7, e5, e3, and e1 may be data about errors of the signals B1[7], B1[5], B1[3], and B1[1] generated by the coarse phase circuit 33. The signals B1[7], B1[5], B1[3], and B1[1] may be the comparison results acquired by the comparator circuits 47, 45, 43, and 41 to which the voltage generated by the coarse DAC 32 is supplied. The error flags e7, e5, e3, and e1 may thus reflect the characteristics of the coarse DAC 32.

The multiplier circuit 223 may be configured to multiply an output value of the OR circuit 222 by the weighting coefficient calculated by the weighting coefficient calculation circuit 211.

The counter 224 may be configured to cumulatively add the multiplication results acquired by the multiplier circuit 223. The counter 224 may reset the cumulative value in a case where an output signal of the OR circuit 227 reaches a high level.

This configuration makes it possible for the gain mismatch estimation circuit 232 to calculate the degree of correlation between the first digital code (signal B1[8:0]) and the error flags e7, e5, e3, and e1, similarly to the gain mismatch estimation circuit 231.

The determination circuit 225 may be configured to determine whether or not the cumulative value at the counter 224 is greater than or equal to the predetermined value "VAL2" (≥VAL2). The determination circuit 226 may be configured to determine whether or not the cumulative value at the counter 224 is less than or equal to the predetermined value "−VAL2" (≤−VAL2).

The OR circuit 227 may be configured to determine the logical OR of an output signal of the determination circuit 225 and an output signal of the determination circuit 226. The OR circuit 227 may supply the operation result to the counter 224.

Like the up/down counter 218, the up/down counter 228 may be configured to increase or decrease the count value on the basis of the output signals of the determination circuits 225 and 226 and to thereby generate the calibration signal DAC2_cal for adjusting the gain of the coarse DAC 32. The up/down counter 228 may have a U terminal to be supplied with the output signal of the determination circuit 225, and a D terminal to be supplied with the output signal of the determination circuit 226. The up/down counter 228 may increase the count value in a case where, for example, the signal at the U terminal is at a high level, and may decrease the count value in a case where, for example, the signal at the D terminal is at a high level. The up/down counter 228 may output the changed count value as the calibration signal DAC2_cal for adjusting the gain of the coarse DAC 32.

(Threshold Shift Estimation Circuit 360 and Signal Generation Circuit 380)

The threshold shift estimation circuit 360 (FIG. 3) may be configured to estimate shift of each of the threshold voltages VthP and VthN of the comparator circuits 60P and 60N in the fine phase circuit 52. It is desired that a difference voltage between the threshold voltage VthP of the comparator circuit 60P and the threshold voltage VthN of the comparator circuit 60N be the same as a voltage width of the voltage range of the least significant bit of the first stage converter 30, and that an average voltage of the threshold voltage VthP of the comparator circuit 60P and the threshold voltage VthN of the comparator circuit 60N be equal to the threshold voltage Vth of the comparator circuit 61. The threshold shift estimation circuit 360 may estimate a shift of the threshold voltage VthP of the comparator circuit 60P and a shift of the threshold voltage VthN of the comparator circuit 60N in the fine phase circuit 52.

The threshold shift estimation circuit 360 may include an error rate calculator 371, an average value calculator 372, and a threshold shift determinator 373. The error rate calculator 371 may be configured to calculate an error rate of the AD conversion operation in the first stage converter 30 on the basis of the second digital code (signal B2[1:0]). The average value calculator 372 may be configured to calculate an average value of the signal B2[1]. The threshold shift determinator 373 may be configured to determine a shift of the threshold voltage, using a reference value, on the basis of the calculation result acquired by the error rate calculator 371 and the calculation result acquired by the average value calculator 372.

FIG. 8 illustrates a more specific but non-limiting example of configurations of the threshold shift estimation circuit 360 and the signal generation circuit 380. The threshold shift estimation circuit 360 may include an exclusive NOR circuit (ExNOR) 311, an adder circuit 312, a ΔΣ processor 313, a counter 314, determination circuits 315 and 316, an inverter 331, an adder circuit 332, a ΔΣ processor 333, a counter 334, and determination circuits 335 and 336. The signal generation circuit 380 may include an OR circuit 317, an up/down counter 318, an adder circuit 319, a round processing circuit 321, a limit circuit 322, an OR circuit 337, an up/down counter 338, an adder circuit 339, a round processing circuit 341, and a limit circuit 342. The exclusive NOR circuit 311, the adder circuit 3112, the ΔΣ processor 313, and the counter 314 may correspond to the error rate calculator 371 illustrated in FIG. 3. The inverter 331, the adder circuit 332, the ΔΣ processor 333, and the counter 334 may correspond to the average value calculator 372 illustrated in FIG. 3. The determination circuits 315, 316, 335, and 336 may correspond to the threshold shift determinator 373 illustrated in FIG. 3.

The exclusive NOR circuit 311 may be configured to determine the exclusive NOR of the signal B2[1] and the signal B2[0].

The adder circuit 312 may be configured to subtract a value center_diff from an output value of the exclusive NOR circuit 311. The value center_diff may be, for example, a reference value for the error rate of the AD conversion operation in the first stage converter 30, and may be set to "0.3", for example.

The ΔΣ processor 313 may be configured to convert an inputted sequence of decimals into a sequence of "1", "0", and "−1" by performing, in this example, the first-order ΔΣ processing. The ΔΣ processor 313 may calculate a sequence of output signals such that an average value of the sequence of output signals is the same as an average value of the inputted sequence of decimals.

The counter 314 may be configured to cumulatively add values outputted from the ΔΣ processor 313. The counter 314 may reset the cumulative value in a case where an output signal of the OR circuit 317 reaches a high level.

This configuration makes it possible for the threshold shift estimation circuit 360 to calculate a value corresponding to the error rate of the AD conversion operation in the first stage converter 30. That is, as will be described later, in a case where there is a conversion error in the first stage converter 30, the signal B2[1] and the signal B2[0] coincide with each other. In such a case, the exclusive NOR circuit 311 may output "1". The adder circuit 312 may subtract the value center_diff (e.g., 0.3) from the output value of the exclusive NOR circuit 311. Therefore, for example, in the case where there is a conversion error in the first stage converter 30, the output value of the adder circuit 312 may be "0.7", for example. In a case where there is no conversion error in the first stage converter 30, the output value of the adder circuit 312 may be "−0.3", for example.

For example, in a case where the difference voltage between the threshold voltage VthP of the comparator circuit 60P and the threshold voltage VthN of the comparator circuit 60N is the same as the voltage width of the voltage range of the least significant bit of the first stage converter 30, the error rate of the AD conversion operation in the first stage converter 30 may be about "0.3" in this example. That is, in the AD converter circuit 1, due to noise occurring therein, the error rate of the AD conversion operation may become "0.3", for example. In such a case, an average output value of the adder circuit 312 is substantially "0", and therefore the value at the counter 314 remains at substantially "0", for example.

For example, in a case where the difference voltage between the threshold voltage VthP of the comparator circuit 60P and the threshold voltage VthN of the comparator circuit 60N is greater than the voltage width of the voltage range of the least significant bit of the first stage converter 30, as will be described later, the error rate of the AD conversion operation in the first stage converter 30 becomes lower than "0.3" in this example. In such a case, the average output value of the adder circuit 312 becomes negative and therefore the value at the counter 314 decreases from "0".

Further, for example, in a case where the difference voltage between the threshold voltage VthP of the comparator circuit 60P and the threshold voltage VthN of the comparator circuit 60N is smaller than the voltage width of the voltage range of the least significant bit of the first stage converter 30, as will be described later, the error rate of the AD conversion operation in the first stage converter 30 becomes higher than "0.3" in this example. In such a case, the average output value of the adder circuit 312 becomes positive and therefore the value at the counter 314 increases from "0".

The determination circuit 315 may be configured to determine whether or not the cumulative value at the counter 314 is greater than or equal to a predetermined value "VAL3" (≥VAL3). The determination circuit 316 may be configured to determine whether or not the cumulative value at the counter 314 is less than or equal to a predetermined value "−VAL3" (≤−VAL3).

The OR circuit 317 may be configured to determine the logical OR of an output signal of the determination circuit 315 and an output signal of the determination circuit 316. The OR circuit 317 may supply the operation result to the counter 314.

The up/down counter 318 may be configured to increase or decrease a count value diff on the basis of the output signals of the determination circuits 315 and 316. The up/down counter 318 may have a terminal to be supplied with the output signal of the determination circuit 315, and a D terminal to be supplied with the output signal of the determination circuit 316. The count value diff may correspond to the difference voltage between the threshold voltage VthP of the comparator circuit 60P and the threshold voltage VthN of the comparator circuit 60N.

The inverter 331 may be configured to invert the signal B2[1].

The adder circuit 332 may be configured to subtract a value center_comm from an output value of inverter 331. The value center_comm may be a reference value for an average value of the signal B2[1], and may be set to "0.5", for example.

The ΔΣ processor 333 may be configured to convert an inputted sequence of decimals into a sequence of "1", "0", and "−1" by performing, in this example, the first-order ΔΣ processing. The ΔΣ processor 333 may calculate a sequence of output signals such that an average value of the sequence of output signals is the same as an average value of the inputted sequence of decimals.

The counter 334 may be configured to cumulatively add values outputted from the ΔΣ processor 333. The counter 334 may reset the cumulative value in a case where an output signal of the OR circuit 337 reaches a high level.

This configuration makes it possible for the threshold shift estimation circuit 360 to calculate a value corresponding to the average value of the signal B2[1]. For example, in a case where the signal B2[1] is "1", the output value of the inverter 331 is "0", and therefore the output value of the adder circuit 332 is "−0.5", for example. Further, in a case where the signal B2[1] is 0, the output value of the inverter 331 is "1", and therefore the output value of the adder circuit 332 is "0.5".

For example, as will be described later, in a case where the average voltage of the threshold voltage VthP of the comparator circuit 60P and the threshold voltage VthN of the comparator circuit 60N is equal to the threshold voltage Vth of the comparator circuit 61, the average value of the signal B2[1] is "0.5". In such a case, the average output value of the adder circuit 332 is "0", and therefore the value at the counter 334 remains at substantially "0", for example.

For example, as will be described later, in a case where the average voltage of the threshold voltage VthP of the comparator circuit 60P and the threshold voltage VthN of the comparator circuit 60N is higher than the threshold voltage Vth of the comparator circuit 61, the average value of the signal B2[1] is higher than "0.5". In such a case, the average output value of the adder circuit 332 is negative and therefore the value at the counter 334 decreases from "0".

Further, for example, as will be described later, in a case where the average voltage of the threshold voltage VthP of the comparator circuit 60P and the threshold voltage VthN of the comparator circuit 60N is lower than the threshold voltage Vth of the comparator circuit 61, the average value of the signal B2[1] is lower than "0.5". In such a case, the average output value of the adder circuit 332 is positive and therefore the value at the counter 334 increases from "0".

The determination circuit 335 may be configured to determine whether or not the cumulative value at the counter 334 is greater than or equal to the predetermined value "VAL3" (≥VAL3). The determination circuit 336 may be configured to determine whether or not the cumulative value at the counter 334 is less than or equal to the predetermined value "−VAL3" (≤−VAL3).

The OR circuit 337 may be configured to determine the logical OR of an output signal of the determination circuit 335 and an output signal of the determination circuit 336. The OR circuit 337 may supply the operation result to the counter 334.

The up/down counter 338 may be configured to increase or decrease a count value common on the basis of the output signals of the determination circuits 335 and 336. The up/down counter 338 may have a U terminal to be supplied with the output signal of the determination circuit 335, and a D terminal to be supplied with the output signal of the determination circuit 336. The count value common may correspond to the average voltage of the threshold voltage VthP of the comparator circuit 60P and the threshold voltage VthN of the comparator circuit 60N.

The adder circuit 319 may be configured to subtract the count value diff from the count value common. The round processing circuit 321 may be configured to halve the value of the addition result acquired by the adder circuit 319 and round up or down the halved value to the nearest integer. The limit circuit 322 may be configured to generate the signal caloffsetp included in the calibration signal finephase_cal by performing a limit process to cause the value obtained by the round processing circuit 321 to fall within a predetermined range.

The adder circuit 339 may be configured to add up the count value common and the count value diff. The round processing circuit 341 may be configured to halve the value of the addition result acquired by the adder circuit 319 and round up or down the halved value to the nearest integer. The limit circuit 342 may be configured to generate the signal caloffsetn included in the calibration signal finephase_cal by performing a limit process to cause the value obtained by the round processing circuit 341 to fall within a predetermined range.

In this example, when the signal caloffsetp included in the calibration signal finephase_cal indicates a larger value, the comparator circuit 60P may make the threshold voltage VthP higher, and when the signal caloffsetp indicates a smaller value, the comparator circuit 60P may make the threshold voltage VthP lower. Further, when the signal caloffsetn included in the calibration signal finephase_cal indicates a larger value, the comparator circuit 60N may make the threshold voltage VthN higher, and when the signal caloffsetn indicates a smaller value, the comparator circuit 60N may make the threshold voltage VthN lower.

In such a manner, the calibration signal generation circuit 74 (FIGS. 1 and 2) of the processing circuit 27 may generate the calibration signals off_cal, th_cal, DAC1_cal, DAC2_cal, and finephase_cal. The comparator circuits 48 to 40 of the coarse phase circuit 33 may change the threshold voltages on the basis of the calibration signals off_cal and th_cal. The coarse DAC 31 may change the gain by changing the capacitance value of the variable capacitor on the basis of the calibration signal DAC1_cal. The coarse DAC 32 may change the gain by changing the capacitance value of the variable capacitor on the basis of the calibration signal DAC2_cal. The comparator circuits 60P and 60N of the fine phase circuit 52 may change the threshold voltages VthP and VthN on the basis of the calibration signal finephase_cal.

The multiplexer 16 (FIG. 1) may be configured to generate data Dout by outputting the data. DT outputted from the four ADCs 20 in accordance with the order of the operations of the four ADCs 20.

The first stage converter 30 may correspond to a specific but non-limiting example of a "first converter circuit" according to one embodiment of the disclosure. The signal B1[8:0] may correspond to a specific but non-limiting example of a "first digital code" according to one embodiment of the disclosure. The second stage converter 50 may, correspond to a specific but non-limiting example of a "second converter circuit" according to one embodiment of the disclosure. The signal B2[1:0] may correspond to a specific but non-limiting example of a "second digital code" according to one embodiment of the disclosure. The error bit detection circuit 72 may correspond to a specific but non-limiting example of an "error detector" according to one embodiment of the disclosure. The error data DTE may correspond to a specific but non-limiting example of "error data" according to one embodiment of the disclosure. The error factor estimation circuit 73 and the calibration signal generation circuit 74 may correspond to a specific but non-limiting example of a "calibration circuit" according to one embodiment of the disclosure. The comparator circuits 48 to 40 may correspond to a specific but non-limiting example of "two or more comparator circuits" according to one embodiment of the disclosure. The comparator circuit 46 may correspond to a specific but non-limiting example of a "first comparator circuit" according to one embodiment of the disclosure. The comparator circuit 47 may correspond to a specific but non-limiting example of a "second comparator circuit" according to one embodiment of the disclosure. The comparator circuit 45 may correspond to a specific but non-limiting example of a "third comparator circuit" according to one embodiment of the disclosure. The coarse DACs 31 and 32 may each correspond to a specific but non-limiting example of a "digital-to-analog converter circuit" according to one embodiment of the disclosure. The comparator circuits 60P and 60N may each correspond to a specific but non-limiting example of a "fourth comparator circuit" according to one embodiment of the disclosure.

<Operations and Workings>

Example operations and example workings of the AD converter circuit 1 of the present example embodiment will now be described.

(Outline of Overall Operation)

First, an outline of an overall operation of the AD converter circuit 1 will be described with reference to FIGS. 1 and 2. The clock buffer 11 may receive the clock signal CLKin. On the basis of the output signal of the clock buffer 11, the four-phase clock generator 12 may generate the four-phase clock signal including four clock signals that are different in phase from each other. The four-phase dock generator 12 may supply the four ADCs 20 with the four clock signals generated, respectively. On the basis of the output signal of the clock buffer 11, the bootstrap circuit 14 may perform a bootstrap operation to generate a boost voltage, and may supply the generated boost voltage to the gate of the transistor MN13. The transistor MN13 may turn on or off in response to the operation of the bootstrap circuit 14. The voltage generator 15 may generate two voltages Vref (voltages VrefC and VrefF) serving as reference voltages.

In the ADC 20, the OR circuit 21 may generate the internal clock signal CLK1 by determining the logical OR of the dock signal supplied from the clock buffer 11 and the clock signal supplied from the four-phase clock generator 12. On the basis of the internal clock signal CLK1 the bootstrap circuit 25 may perform a bootstrap operation to generate a boost voltage, and may supply the generated boost voltage to the gates of the transistors MN22, MN23, and MN24. The transistors MN22, MN23, and MN24 may each turn on or off in response to the operation of the bootstrap circuit 25. The first stage converter 30 generates the first digital code (signal B1[8:0]) by performing AD conversion on the basis of the input voltage Vin. The delay circuit 26 may delay a valid signal outputted from the comparator circuit 40 by a predetermined time, and supply the delayed valid signal to the second stage converter 50. The second stage converter 50 may generate the second digital code (signal B2[1:0]) by performing AD conversion on the basis of the input voltage Vin and the first digital code (signal B1[8:0]). The processing circuit 27 may generate the data DT by performing the error correction process on the basis of the first digital code (signal B1[8:0]) generated by the first stage converter 30 and the second digital code (signal B2[1:0]) generated by the second stage converter 50. Further, the processing circuit 27 may perform a calibration process on the basis of the first digital code and the second digital code. The multiplexer 16 (FIG. 1) may generate data. Dout by outputting the data DT outputted from the four ADCs 20 in accordance with the order of the operations of the four ADCs 20.

(Detailed Operation)

The AD conversion operation of the ADC 20 will be described in detail first. In the ADC 20, the first stage converter 30 generates the first digital code (signal B1[8:0]) by performing AD conversion on the basis of the input voltage Vin.

FIG. 9 illustrates an operation example of the first stage converter 30. The first stage converter 30 may start the AD conversion operation at timing t1. At this time, an output voltage V31 of the coarse DAC 31 and an output voltage V32 of the coarse DAC 32 may both be set to the same voltage as the input voltage Vin.

First, during a period from the timing t1 to timing t2, i.e., at step S1, the comparator circuit 48 of the coarse phase circuit 33 may generate the signal B1[8] by comparing the input voltage Vin supplied via the transistor MN24 with a threshold voltage (e.g., (0 V). In this example, the input voltage Vin is higher than the threshold voltage of the comparator circuit 48 (0 V in this example). The comparator circuit 48 may therefore set the signal B1[8] to "1".

Next, during a period from the timing t2 to timing t3, i.e., at step S2, the comparator circuit 47 may compare the output voltage V32 of the coarse DAC 32 with one of two threshold voltages (+Vref/2 and −Vref/2 in this example) that corresponds to the comparison result acquired by the comparator circuit 48. In this example, the comparison result acquired by the comparator circuit 48, i.e., the signal B[8], is "1", and therefore the comparator circuit 47 may perform the comparison operation using the positive threshold voltage (+Vref/2 in this example) of the two threshold voltages. In this example, the output voltage V32 of the DAC 32 is lower than this positive threshold voltage. The comparator circuit 47 may therefore set the signal B1[7] to "0".

Further, during this period from the timing t2 to the timing t3, the coarse DAC 31 may set the output voltage V31 on the basis of the signal B1[8]. In this example, the signal B1[8] is "1", and therefore the coarse DAC 31 may lower the output voltage V31 by "Vref/2" with respect to the initial value, i.e., the input voltage Vin.

Next, during a period from the timing t3 to timing t4, i.e., at step S3, the comparator circuit 46 may compare the output voltage V31 of the coarse DAC 31 with one of two threshold voltages (+Vref/4 and −Vref/4 in this example) that corresponds to the comparison result acquired by the comparator circuit 47. In this example, the comparison result acquired by the comparator circuit 47, i.e., the signal B[7], is "0", and therefore the comparator circuit 46 may perform the comparison operation using the negative threshold voltage (−Vref/4 in this example) of the two threshold voltages. In this example, the output voltage V31 of the DAC 31 is higher than this negative threshold voltage. The comparator circuit 46 may therefore set the signal B1[6] to "1".

Further, during this period from the timing t3 to the timing t4, the coarse DAC 32 may set the output voltage V32 on the basis of the signals B1[8] and B1[7], in this example, the coarse DAC 32 may aim to lower the output voltage V32 by "Vref/2" because the signal B1[8] is "1", and may also aim to raise the output voltage V32 by "Vref/4" because the signal B1[7] is "0". As a result, the coarse DAC 32 may lower the output voltage V32 by "Vref/4" (=Vref/2−Vref/4) with respect to the initial value, i.e., the input voltage Vin.

Next, during a period from the timing t4 to timing t5, i.e., at step S4, the comparator circuit 45 may compare the output voltage V32 of the coarse DAC 32 with one of two threshold voltages (+Vref/8 and −Vref/8 in this example) that corresponds to the comparison result acquired by the comparator circuit 46. In this example, the comparison result acquired by the comparator circuit 46, i.e., the signal B[6], is "1", and therefore the comparator circuit 45 may perform the comparison operation using the positive threshold voltage (+Vref/8 in this example) of the two threshold voltages. In this example, the output voltage V32 of the DAC 32 is lower than this positive threshold voltage. The comparator circuit 45 may therefore set the signal B1[5] to "0".

Further, during this period from the timing t4 to the timing t5, the coarse DAC 31 may set the output voltage V31 on the basis of the signals B1[7] and B1[6]. In this example, the coarse DAC 31 may aim to raise the output voltage V31 by "Vref/4" because the signal B1[7] is "0", and may also aim to lower the output voltage V31 by "Vref/8" because the signal B1[6] is "1". As a result, the coarse DAC 31 may raise the output voltage V31 by "Vref/8" (=Vref/4−Vref/8).

Next, during a period from the timing t5 to timing t6, i.e., at step S5, the comparator circuit 44 may compare the output voltage V31 of the coarse DAC 31 with one of two threshold voltages (+Vref/16 and −Nref/16 in this example) that corresponds to the comparison result acquired by the comparator circuit 45. In this example, the comparison result acquired by the comparator circuit 45, i.e., the signal B[5], is "0", and therefore the comparator circuit 44 may perform the comparison operation using the negative threshold voltage (−Vref/16 in this example) of the two threshold voltages. In this example, the output voltage V31 of the DAC 31 is higher than this negative threshold voltage. The comparator circuit 44 may therefore set the signal B1[4] to "1".

Further, during this period from the timing t5 to the timing t6, the coarse DAC 32 may set the output voltage V32 on the basis of the signals B1[6] and B1[5]. In this example, the coarse DAC 32 may aim to lower the output voltage V32 by "Vref/8" because the signal B1[6] is "1", and may also aim to raise the output voltage V32 by "Vref/16" because the signal B1[5] is "0". As a result, the coarse DAC 32 may lower the output voltage V32 by "Vref/16" Vref/8−Vref/16).

The subsequent operations proceed in a similar manner. In this way, the first stage converter 30 performs AD conversion on the basis of the input voltage Vin and generates the first digital code (signal B1[8:0]) in the order from the signal B1[8].

Thereafter, the second stage converter 50 generates the second digital code (signal B2[1:0]) by performing AD conversion on the basis of the input voltage Vin and the first digital code (signal B1[8:0]). The fine DAC 51 of the second stage converter 50 may generate a voltage by changing voltage from the initial value, i.e., the input voltage Vin on the basis of the first digital code (signal B1[8:0]), and may supply the generated voltage to the fine phase circuit 52. The comparator circuit 61 of the fine phase circuit 52 may generate the signal B2[1] by comparing the voltage generated by the fine DAC 51 with a predetermined threshold voltage Vth (0 V). On the basis of the signal B2[1], the selector 69 may supply the valid signal generated by the comparator circuit 61 to either the comparator circuit 60P or the comparator circuit 60N. The comparator circuit 60P may generate the signal B2[0] by comparing the voltage generated by the fine DAC 51 with a positive threshold voltage VthP (e.g., +Vref/512). The comparator circuit 60N may generate the signal B2[0] by comparing the voltage generated by the fine DAC 51 with a negative threshold voltage VthN (e.g., −Vref/512). Because the selector 69 may supply the valid signal to either one of the comparator circuits 60P and 60N, the one of the comparator circuits 60P and 60N may generate the signal B2[0]. The second stage converter 50 may generate the second digital code (signal B2[1:0]) in such a manner.

FIG. 10 illustrates an example of operations of the coarse phase circuit 33 and the fine phase circuit 52. In this example, for convenience in description, the coarse phase circuit 33 includes three comparator circuits and generates a 3-bit first digital code (signal B1[2:0]). The coarse phase circuit 33 may thus generate eight codes from "000" to "111".

As illustrated in FIG. 10, in a case where the input voltage Vin is a voltage within a voltage range corresponding to "101", the signal B1[2:0] to be generated by the coarse phase circuit 33 generates is "101". In this case, a voltage range over which the fine phase circuit 52 is to perform AD conversion is set to cover this voltage range corresponding to "101", as illustrated in FIG. 10. For example, the threshold voltage VthP of the comparator circuit 60P of the fine phase circuit 52 is set near a maximum value of the voltage range corresponding to "101", and the threshold voltage VthN of the comparator circuit 60N is set near a minimum value of the voltage range corresponding to "101". Further, in the case where the average voltage of the threshold voltage VthP and the threshold voltage VthN is equal to the threshold voltage Vth of the comparator circuit 61, the threshold voltage Vth is set near the middle of the voltage range corresponding to "101".

Because the input voltage Vin is higher than the threshold voltage Vth, the comparator circuit 61 may set the signal B2[1] to "1". In this case, of the comparator circuits 60P and 60N, the comparator circuit 60P may perform the comparison operation. Because the input voltage Vin is lower than the threshold voltage VthP, the comparator circuit 60P may set the signal B2[0] to "0". The signal B2[1:0] may thus be "10".

Because the threshold voltage VthP of the comparator circuit 60P is set near the maximum value of the voltage range corresponding to "101", it is generally unlikely that the input voltage Vin becomes higher than the threshold voltage VthP. Therefore, a portion of the voltage range of the fine phase circuit 52 higher than the threshold voltage VthP is redundant. Likewise, because the threshold voltage VthN of the comparator circuit 60N is set near the minimum value of the voltage range corresponding to "101", it is generally unlikely that the input voltage Vin becomes lower than the threshold voltage VthN. Therefore, a portion of the voltage range of the fine phase circuit 52 lower than the threshold voltage VthN is redundant. In this way, the second stage converter 50 performs AD conversion over a voltage range wider than the voltage range of the least significant bit of the first stage converter 30.

The error correction circuit 71 of the processing circuit 27 may perform the error correction process on the basis of the first digital code ("101") and the second digital code ("10") thus obtained. In this example, as illustrated in FIG. 10, the error correction circuit 71 may perform an addition process on the basis of the first digital code ("101") and the second digital code ("10"), and subtract a fixed offset value from the result of the addition process. As a result, in this example, a digital code "1011" is obtained. That is, as illustrated in FIG. 10, because the input voltage Vin is a voltage within the range of the upper half of the voltage range corresponding to "101", the digital code is "1011".

Next, a description will be given of a case where a conversion error occurs in the AD conversion operation in the first stage converter 30.

FIG. 11 illustrates an operation example of the coarse phase circuit 33 and the fine phase circuit 52. In this example, as is the case with FIG. 10, the input voltage Vin is a voltage within the voltage range corresponding to "101". However, in this example, the signal B1[2:0] that the coarse phase circuit 33 generates is "110" due to, for example, noise, a threshold voltage shift, or other reasons. In this case, the voltage range over which the fine phase circuit 52 is to perform AD conversion is set to cover a voltage range corresponding to "110", as illustrated in FIG. 11. For example, the threshold voltage VthP of the comparator circuit 60P is set near a maximum value of the voltage range corresponding to "110", and the threshold voltage VthN of the comparator circuit 60N is set near a minimum value of the voltage range corresponding to "110". Further, for example, the threshold voltage Vth of the comparator circuit 61 is set near the middle of the voltage range corresponding to "110".

Because the input voltage Vin is lower than the threshold voltage Vth, the comparator circuit 61 may set the signal B2[1] to "0". In this case, of the comparator circuits 60P and 60N, the comparator circuit 60N may perform the comparison operation. Because the input voltage Vin is lower than the threshold voltage VthN, the comparator circuit 60N may set the signal B2[0] to "0". In this case, the signal B2[1:0] is "00". Thus, in the case where a conversion error occurs, the input voltage Vin can be a voltage within the redundant voltage range of the fine phase circuit 52.

The error correction circuit 71 of the processing circuit 27 may perform the error correction process on the basis of the first digital code ("110") and the second digital code ("00") thus obtained. In this example, as illustrated in FIG. 11, the error correction circuit 71 may perform an addition process on the basis of the first digital code ("1110") and the second digital code ("00"), and subtract the fixed offset value from the result of the addition process. As a result, in this example, a digital code "1011" is obtained. The obtained digital code is the same as the digital code obtained in the case where there is no conversion error, as illustrated in FIG. 10. In this way, by performing the error correction process, the error correction circuit 71 is able to generate the correct digital code even in the case where a conversion error occurs.

Calibration

The error bit detection circuit 72 (FIGS. 2 and 3) of the processing circuit 27 detects a conversion error of the AD conversion on the basis of the first digital code and the second digital code, and thereby generates the error data DTE that indicates at which bit in the first digital code and what kind of conversion error has occurred. The error factor estimation circuit 73 estimates a factor of the conversion error of the AD conversion on the basis of the first digital code and the second digital code. The calibration signal generation circuit 74 may generate the calibration signals off_cal, th_cal, DAC1_cal, DAC2_cal, and finephase_cal on the basis of the estimation result acquired by the error factor estimation circuit 73.

The comparator circuits 48 to 40 of the coarse phase circuit 33 may change the threshold voltages on the basis of the calibration signals off_cal and th_cal. The coarse DAC 31 may change the gain by changing the capacitance value of the variable capacitor on the basis of the calibration signal DAC1_cal. The coarse. DAC 32 may change the gain by changing the capacitance value of the variable capacitor on the basis of the calibration signal DAC2_cal. The comparator circuits 60P and 60N of the fine phase circuit 52 may change the threshold voltages VthP and VthN on the basis of the calibration signal finephase_cal. This operation will be described in detail below.

(Error Bit Detection Circuit 72)

FIG. 12 illustrates an operation example of the error bit detection circuit 72. In this example, for convenience in description, the coarse phase circuit 33 includes three comparator circuits and generates a 3-bit first digital code (signal B1[2:0]). In FIG. 12, "X" in the signal B1[2:0] indicates that the bit may be either "1" or "0".

As described above, in the case where a conversion error occurs, the input voltage Vin can become a voltage within the redundant voltage range included in the voltage range of the fine phase circuit 52. As illustrated in FIG. 11, in the case where the input voltage Vin is higher than the threshold voltage VthP, the signal B2[1:0] is "11", and in the case where the input voltage Vin is lower an the threshold voltage VthN the signal B2[1:0] is "00". Therefore, in the case where the signal B2[1:0] is "11" or "00", the error bit detection circuit 72 may determine that, a conversion error has occurred in the AD conversion operation in the first stage converter 30.

Thereafter, the error bit detection circuit 72 may generate error flags e3, e2, and e1 indicating errors in the three bit data of the signal B1[2:0] in this example.

For example, in a case where the signal B1[2:0] is "XX1" and the signal B2[1:0] is "00", the error bit detection circuit 72 may set the error flags e2, e1, and e0 to "0", "0", and "−1", respectively. This indicates that the signal B1[0] corresponding to the error flag e0 is erroneously "1" due to a conversion error, and is originally expected to be "0".

For example, in a case where the signal B1[2:0] is "X10" and the signal B2[1:0] is "00", the error bit detection circuit 72 may set the error flags e2, e1, and e0 to "0", "−1", and "0", respectively. This indicates that the signal B1[1] corresponding to the error flag e1 is erroneously "1" due to a conversion error, and is originally expected to be "0".

For example, in a case where the signal B1[2:0] is "100" and the signal B2[1:0] is "00", the error bit detection circuit 72 may set the error flags e2, e1, and e0 to "−1", "0", and "0", respectively. This indicates that the signal B1[2] corresponding to the error flag e2 is erroneously "1" due to a conversion error, and is originally expected to be "0".

For example, in a case where the signal B1[2:0] is "XX0" and the signal B2[1:0] is "11", the error bit detection circuit 72 may set the error flags e2, e1, and e0 to "0", "0", and "1", respectively. This indicates that the signal B1[0] corresponding to the error flag e0 is erroneously "0" due to a conversion error, and is originally expected to be "1".

For example, in a case where the signal B1[2:0] is "X01" and the signal B2[1:0] is "11", the error bit detection circuit 72 may set the error flags e2, e1, and e0 to "0", "1", and "0", respectively. This indicates that the signal B1[1] corresponding to the error flag e1 is erroneously "0" due to a conversion error, and is originally expected to be "1".

For example, in a case where the signal B1[2:0] is "011" and the signal B2[1:0] is "11", the error bit detection circuit 72 may set the error flags e2, e1, and e0 to "1", "0", and "0", respectively. This indicates that the signal B1[2] corresponding to the error flag e2 is erroneously "0" due to a conversion error, and is originally expected to be "1".

In the example of FIG. 11, the signal B1[2:0] is erroneously "110" due to a conversion error, although originally expected to be "101". The signal B2[1:0] is "00". Therefore, the error bit detection circuit 72 may set the error flags e2, e1, and e0 to "0", "−1", and "0", respectively. This indicates that the signal B1[1] corresponding to the error flag e1 is erroneously "1" due to a conversion error, and is originally expected to be "0". In this way, in the example of FIG. 11, the error hit detection circuit 72 is able to detect that there is an error at the signal B1[1].

In such a manner, the error bit detection circuit 72 may generate the nine error flags e8 to e0 that respectively correspond to the nine bit data of the signal B1[8:0] generated by the coarse phase circuit 33. The error bit detection circuit 72 may supply the nine error flags e8 to e0 as the error data DTE to the error factor estimation circuit 73.

Next, a detailed description will be given of operations of the error factor estimation circuit 73 and the calibration signal generation circuit 74 (FIGS. 2 and 3). The following will describe operations of the threshold shift estimation circuits 147 to 140 and the signal generation circuit 180, operations of the gain mismatch estimation circuits 231 and 232 and the signal generation circuit 280, and operations of the threshold shift estimation circuit 360 and the signal generation circuit 380 in this order.

(Threshold Shift Estimation Circuits 147 to 140 and Signal Generation Circuit 180)

FIG. 13 illustrates an example of a conversion characteristic of the first stage converter 30 in a case where the threshold voltages of the comparator circuits in the coarse phase circuit 33 are shifted. In this example, for convenience in description, the coarse phase circuit 33 includes three comparator circuits and generates a 3-bit first digital code (signal B1[2:0]). The horizontal axis represents the input voltage Vin, and the vertical axis represents residue, i.e., a residual voltage after conversion by the first stage converter 30. The residue thus corresponds to an input voltage to the second stage converter 50.

The conversion characteristic illustrated in FIG. 13 is a sawtooth characteristic and has seven stepped portions. The seven stepped portions correspond to the threshold voltages of the three comparator circuits of the coarse phase circuit 33. For example, the input voltage Vin is first compared with the threshold voltage of the first comparator circuit. Therefore, the middle stepped portion of the seven stepped portions corresponds to the threshold voltage of the first comparator circuit. In a case where the input voltage Vin is higher than the threshold voltage of the first comparator circuit, the second comparator circuit performs the comparison operation using the positive threshold voltage. Therefore, the second stepped portion from the right, among the seven stepped portions, corresponds to the positive threshold voltage of the second comparator circuit. In a case where the input voltage Vin is lower than the threshold voltage of the first comparator circuit, the second comparator circuit performs the comparison operation using the negative threshold voltage. Therefore, the second stepped portion from the left, among the seven stepped portions, corresponds to the negative threshold voltage of the second comparator circuit. The same applies to the third comparator circuit. The first and fifth stepped portions from the right, among the seven stepped portions, correspond to the positive threshold voltages of the third comparator circuit. The first and fifth stepped portions from the left, among the seven stepped portions, correspond to the negative threshold voltages of the third comparator circuit.

In a case where the threshold voltages of the comparator circuits are not shifted from desired voltages, for example, the residue neither exceeds the threshold voltage VthP of the comparator circuit 60P nor falls below the threshold voltage VthN of the comparator circuit 60N, as illustrated by broken lines in FIG. 13. In contrast, in a case where the threshold voltages of the comparator circuits are shifted from desired voltages, for example, the residue exceeds the threshold voltage VthP of the comparator circuit 60P or fails below the threshold voltage VthN of the comparator circuit 60N, as illustrated by solid lines in FIG. 13.

In this example, as indicated by arrows in FIG. 13, the threshold voltage of the first comparator circuit is shifted in the positive direction, the positive threshold voltage of the second comparator circuit is shifted in the positive direction, the negative threshold voltage of the second comparator circuit is shifted in the negative direction, the positive threshold voltages of the third comparator circuit are shifted in the positive direction, and the negative threshold voltages of the third comparator circuit are shifted in the negative direction. As a result, as illustrated in FIG. 13, at the portions where the threshold voltages are shifted in the positive direction, the residue exceeds the threshold voltage VthP of the comparator circuit 60P. In this case, as illustrated in FIGS. 11 and 12, the signal B2[1:0] becomes "11", and therefore the error flag ei is "1". Further, at the portions where the threshold voltages are shifted in the negative direction, the residue falls below the threshold voltage VthN of the comparator circuit 60N. In this case, as illustrated in FIGS. 11 and 12, the signal B2[1:0] becomes "00", and therefore the error flag ei is "−1".

For example, the threshold voltage of the first comparator circuit is shifted in the positive direction. Therefore, at the middle stepped portion corresponding to the threshold voltage of the first comparator circuit among the seven stepped portions, the error flag e2 corresponding to the first comparator circuit is "1".

The positive threshold voltage of the second comparator circuit is shifted in the positive direction. Therefore, at the second stepped portion from the right corresponding to the positive threshold voltage of the second comparator circuit, the error flag e1 corresponding to the second comparator circuit is "1". The negative threshold voltage of the second comparator circuit is shifted in the negative direction. Therefore, at the second stepped portion from the left corresponding to the negative threshold voltage of the second comparator circuit, the error flag e1 corresponding to the second comparator circuit, is "−1".

The positive threshold voltages of the third comparator circuit are shifted in the positive direction. Therefore, at the first and fifth stepped portions from the right corresponding to the positive threshold voltages of the third comparator circuit, the error flag e0 corresponding to the third comparator circuit is "1". The negative threshold voltages of the third comparator circuit are shifted in the negative direction. Therefore, at the first and fifth stepped portions from the left corresponding to the negative threshold voltages of the third comparator circuit, the error flag e0 corresponding to the third comparator circuit is "−1".

The threshold shift estimation circuits 147 to 140 may estimate shifts of the threshold voltages of the comparator circuits 47 to 40 on the basis of the error flags e7 to e0 included in the error data DTE and the signal B1[8:1], as illustrated in FIG. 4.

For example, the threshold shift estimation circuit 147 corresponding to the comparator circuit 47 may count the number of conversion errors for the case where the comparator circuit 47 performs the comparison operation using a positive threshold voltage (e.g., +Vref/2) and the number of conversion errors for the case where the comparator circuit 47 performs the comparison operation using a negative threshold voltage (e.g., −Vref/2), separately.

That is, the signal B1[8] being "1" indicates that the comparator circuit 47 performs the comparison operation using a positive threshold voltage. In the case where the signal B1[8] is "1", the selector 111 may supply the error flag e7 to the counter 112. The counter 112 may thus count the number of conversion errors for the case where the comparator circuit 47 performs the comparison operation using the positive threshold voltage. For example, in the case where this positive threshold voltage is higher than a desired voltage, the value of the error flag e7 is "1", and therefore the value at the counter 112 increases from "0". In the case where the positive threshold voltage is lower than the desired voltage, the value of the error flag e7 is "−1", and therefore the value at the counter 112 decreases from "0".

Likewise, the signal B1[8] being "0" indicates that the comparator circuit 47 performs the comparison operation using a negative threshold voltage. In the case where the signal B1[8] is "0", the selector 111 may supply the error flag e7 to the counter 113. The counter 113 may thus count the number of conversion errors for the case where the comparator circuit 47 performs the comparison operation using the negative threshold voltage. For example, in the case where this negative threshold voltage is higher than a desired voltage, the value of the error flag e7 is "1", and therefore the value at the counter 113 increases from "0". In the case where the negative threshold voltage is lower than the desired voltage, the value of the error flag e7 is "−1", and therefore the value at the counter 113 decreases from "0".

For example, in the case where the positive threshold voltage of the comparator circuit 47 is higher than a desired voltage, the value at the counter 112 increases. Once the value at the counter 112 has reached the value "VAL1", the determination circuit 114 may output "1".

On the basis of the output signal of the determination circuit 114, the up/down counter 123 may increase the count value by the step value off_step, and may output the changed count value as the calibration signal off_cal for adjusting the two threshold voltages of the comparator circuit 47. The comparator circuit 47 may lower both of the positive threshold voltage and the negative threshold voltage on the basis of the calibration signal off_cal.

Likewise, on the basis of the output signal of the determination circuit 114, the up/down counter 124 may increase the count value by the step value th_step, and may output the changed count value as the calibration signal th_cal for adjusting the two threshold voltages of the comparator circuit 47. The comparator circuit 47 may decrease the difference voltage between the two threshold voltages on the basis of the calibration signal th_cal. This causes the positive threshold voltage to become lower, and the negative threshold voltage to become higher.

As a result, the positive threshold voltage of the two threshold voltages of the comparator circuit 47 becomes lower, whereas the negative threshold voltage is maintained. In this way, the step values off_step and th_step are set so that the negative threshold voltage is maintained.

Further, for example, in the case where the positive threshold voltage of the comparator circuit 47 is lower than a desired voltage, the value at the counter 112 decreases. Once the value at the counter 112 has reached the value "−VAL1", the determination circuit 115 may output "1".

On the basis of the output signal of the determination circuit 115, the up/down counter 123 may decrease the count value by the step value off_step, and may output the changed count value as the calibration signal off_cal for adjusting the two threshold voltages of the comparator circuit 47. The comparator circuit 47 may raise both of the positive threshold voltage and the negative threshold voltage on the basis of the calibration signal off_cal.

Likewise, on the basis of the output signal of the determination circuit 115, the up/down counter 124 may decrease the count value by the step value th_step, and may output the changed count value as the calibration signal th_cal for adjusting the two threshold voltages of the comparator circuit 47. The comparator circuit 47 may increase the difference voltage between the two threshold voltages on the basis of the calibration signal th_cal. This causes the positive threshold voltage to become higher, and the negative threshold voltage to become lower.

As a result, the positive threshold voltage of the two threshold voltages of the comparator circuit 47 becomes higher, whereas the negative threshold voltage is maintained.

In this example, the adjustment of the positive threshold voltage of the comparator circuit 47 has been described by way of example; however, the same applies to the adjustment of the negative threshold voltage.

In such a manner, the threshold shift estimation circuit 147 may estimate shifts of the two threshold voltages of the comparator circuit 47, and on the basis of the estimation result, the signal generation circuit 180 may generate the calibration signals off_cal and th_cal for adjusting the two threshold voltages of the comparator circuit 47. The comparator circuit 47 are able to adjust the two threshold voltages on the basis of the calibration signals off_cal and th_cal.

In this example, the adjustments of the two threshold voltages of the comparator circuit 47 have been described by way of example. The adjustments of the two threshold voltages of each of the comparator circuits 46 to 40, and the adjustment of the threshold voltage of the comparator circuit 48 are similar to the above. In such a manner, the AD converter circuit 1 is able to adjust the threshold voltages of the comparator circuits 48 to 40 in the coarse phase circuit 33.

(Gain Mismatch Estimation Circuits 231 and 232 and Signal Generation Circuit 280)

FIG. 14 illustrates an example of the conversion characteristic of the first stage converter 30 in a case where the gain of the coarse DAC 31 is lower than the gain of the fine DAC 51. In this example, for convenience in description, the coarse phase circuit 33 includes three comparator circuits and generates a 3-bit first digital code (signal B1[2:0]).

In a case where the gain of the coarse DAC 31 is equivalent to the gain of the fine DAC 51, the sawtooth conversion characteristic is, as illustrated by broken lines in FIG. 14, substantially in alignment with respect to a horizontal line. In this case, the residue neither exceeds the threshold voltage VthP of the comparator circuit 60P nor falls below the threshold voltage VthN of the comparator circuit 60N.

In contrast, in a case where the gain of the coarse DAC 31 is lower than the gain of the fine DAC 51, the sawtooth conversion characteristic as a whole slants from upper left to lower right, as illustrated by solid lines in FIG. 14. As a result, the higher the input voltage Vin is than 0V, the more likely the residue is to fall below the threshold voltage VthN of the comparator circuit 60N. In this case, as illustrated in FIGS. 11 and 12, the signal B2[1:0] becomes "00", and therefore the error flag ei becomes "−1". Further, the lower the input voltage Vin is than 0 V, the more likely the residue is to exceed the threshold voltage VthP of the comparator circuit 60P. In this case, as illustrated in FIGS. 11 and 12, the signal B2[1:0] becomes "11", and therefore the error flag ei becomes "1".

In this example, a description has been given of the case where the gain of the coarse DAC 31 is lower than the gain of the fine DAC 51. In a case where the gain of the coarse DAC 31 is higher than the gain of the fine DAC 51, the sawtooth conversion characteristic as a whole slants from lower left to upper right. As a result, the higher the input voltage Vin is than 0 V, the more likely the residue is to exceed the threshold voltage VthP of the comparator circuit 60P. In this case, as illustrated in FIGS. 11 and 12, the signal B2[1:0] becomes "11", and therefore the error flag ei becomes "1". Further, the lower the input voltage Vin is than 0 V, the more likely the residue is to fall below the threshold voltage VthN of the comparator circuit 60N. In this case, as illustrated in FIGS. 11 and 12, the signal B2[1:0] becomes "00", and therefore the error flag ei becomes "−1".

The gain mismatch estimation circuit 231 may estimate a gain mismatch of the coarse DAC 31 on the basis of the error flag e0 included in the error data DTE and the signal B1[8:5], as illustrated in FIG. 6. The gain mismatch estimation circuit 232 may estimate a gain mismatch of the coarse DAC 32 on the basis of the error flags e7, e5, e3, and e1 included in the error data DTE and the signal B1[8:5], as illustrated in FIG. 6.

For example, the gain mismatch estimation circuit 231 may calculate the degree of correlation between the first digital code (signal B1[8:0]) and the error flag e0. That is, for example, in a case where there is no gain mismatch in the coarse DAC 31, there is almost no correlation between the first digital code and the error flag e0, for example. In this case, the multiplication result acquired by the multiplier circuit 213 multiplying the value of the error flag e0 by the weighting coefficient calculated by the weighting coefficient calculation circuit 211 can take on a positive value or a negative value, and therefore the value at the counter 214 remains at substantially "0", for example.

For example, in the case where the gain of the coarse DAC 31 is lower than the gain of the fine DAC 51, as illustrated in FIG. 14, the closer to the maximum value the value of the first digital code is, the more likely the error flag e0 is to become "−1", whereas the closer to the minimum value the value of the first digital code is, the more likely the error flag e0 is to become "1". In other words, there is a correlation between the first digital code and the error flag e0. In this case, the multiplication result acquired by the multiplier circuit 213 multiplying the value of the error flag e0 by the weighting coefficient calculated by the weighting coefficient calculation circuit 211 tends to be negative, and therefore the value at the counter 214 decreases from "0". Once the value at the counter 214 has reached the value "−VAL2", the determination circuit 216 may output "1".

On the basis of the output signal of the determination circuit 216, the up/down counter 218 may decrease the count value and output the changed count value as the calibration signal DAC Leal for adjusting the gain of the coarse. DAC 31. On the basis of this calibration signal DAC1_cal, the coarse DAC 31 may increase the gain by decreasing the capacitance value of the variable capacitor.

For example, in the case where the gain of the coarse DAC 31 is higher than the gain of the fine DAC 51, the closer to the maximum value the value of the first digital code is, the more likely the error flag e0 is to become "1", whereas the closer to the minimum value the value of the first digital code is, the more likely the error flag e0 is to become "−1". In other words, there is a correlation between the first digital code and the error flag e0. In this case, the multiplication result acquired by the multiplier circuit 213 multiplying the value of the error flag e0 by the weighting coefficient calculated by the weighting coefficient calculation circuit 211 tends to be positive, and therefore the value at the counter 214 increases from "0". Once the value at the counter 214 has reached the value "VAL2", the determination circuit 215 may output "1".

On the basis of the output signal of the determination circuit 215, the up/down counter 218 may increase the count value and output the changed count value as the calibration signal DAC1_cal for adjusting the gain of the coarse DAC 31. On the basis of this calibration signal DAC the coarse DAC 31 may decrease the gain by increasing the capacitance value of the variable capacitor.

In such a manner, the gain mismatch estimation circuit 231 may estimate a gain mismatch of the coarse DAC 31, and on the basis of the estimation result, the signal generation circuit 280 may generate the calibration signal DAC1_cal for adjusting the gain of the coarse DAC 31. The coarse DAC 31 is able to adjust the gain on the basis of the calibration signal DAC1_cal.

Similarly to the gain mismatch estimation circuit 231, the gain mismatch estimation circuit 232 may calculate the degree of correlation between the first digital code (signal B1[8:0]) and the error flags e7, e5, e3, and e1. For example, in the case where there is no gain mismatch in the coarse DAC 32, there is almost no correlation between the first digital code and the error flags e7, e5, e3, and e1, for example.

For example, in the case where the gain of the coarse DAC 32 is lower than the gain of the fine DAC 51, as illustrated in FIG. 14, the closer to the maximum value the value of the first digital code is, the more likely the error flags e7, e5, e3, and e1 are to become "−1", whereas the closer to the minimum value the value of the first digital code is, the more likely the error flags e7, e5, e3, and e1 are to become "1". In other words, there is a correlation between the first digital code and the error flags e7, e5, e3, and e1. In this case, the value at the counter 224 decreases from "0". Once the value at the counter 224 has reached the value "−VAL2", the determination circuit 226 may output "1". On the basis of the output signal of the determination circuit 226, the up/down counter 228 may decrease the count value and output the changed count value as the calibration signal DAC2_cal for adjusting the gain of the coarse DAC 32. On the basis of this calibration signal DAC2_cal, the coarse DAC 32 may increase the gain by decreasing the capacitance value of the variable capacitor.

Further, for example, in the case where the gain of the coarse DAC 32 is higher than the gain of the fine. DAC 51, the closer to the maximum value the value of the first digital code is, the more likely the error flags e7, e5, e3, and e1 are to become "1", whereas the closer to the minimum value the value of the first digital code is, the more likely the error flags e7, e5, e3, and e1 are to become "−1". In other words, there is a correlation between the first digital code and the error flags e7, e5, e3, and e1. In this case, the value at the counter 224 increases from "0". Once the value at the counter 224 has reached the value "VAL2", the determination circuit 225 may output "1". On the basis of the output signal of the determination circuit 225, the up/down counter 228 may increase the count value and output the changed count value as the calibration signal DAC2_cal for adjusting the gain of the coarse DAC 32. On the basis of this calibration signal DAC2_cal, the coarse DAC 32 may decrease the gain by increasing the capacitance value of the variable capacitor.

In such a manner, the gain mismatch estimation circuit 232 may estimate a gain mismatch of the coarse DAC 32, and on the basis of the estimation result, the signal generation circuit 280 may generate the calibration signal DAC2_cal for adjusting the gain of the coarse DAC 32. The coarse DAC 32 is able to adjust the gain on the basis of the calibration signal DAC2_cal.

In such a manner, it is possible to adjust the gains of the coarse DACs 31 and 32 in the AD converter circuit 1.

(Threshold Shift Estimation Circuit 360 and Signal Generation Circuit 380)

FIG. 15 illustrates an example of the conversion characteristic of the first stage converter 30 in a case where the difference voltage between the threshold voltage VthP of the comparator circuit 60P and the threshold voltage VthN of the comparator circuit 60N in the fine phase circuit 52 is shifted. In this example, for convenience in description, the coarse phase circuit 33 includes three comparator circuits and generates a 3-bit first digital code (signal B1[2:0]).

In a case where the difference voltage between the threshold voltage VthP of the comparator circuit 60P and the threshold voltage VthN of the comparator circuit 60N is the same as the voltage width of the voltage range of the least significant bit of the first stage converter 30, the residue neither exceeds the threshold voltage VthP of the comparator circuit 60P nor falls below the threshold voltage VthN of the comparator circuit 60N, as illustrated by broken lines in FIG. 15. However, in a case where the difference voltage between the threshold voltage VthP and the threshold voltage VthN is smaller than the voltage width of the voltage range of the least significant bit of the first stage converter 30 as indicated by arrows in FIG. 15, for example, the residue exceeds the threshold voltage VthP or falls below the threshold voltage VthN, as illustrated by solid lines in FIG. 15. In the case where the residue exceeds the threshold voltage VthP, as illustrated in FIGS. 11 and 12, the signal B2[1:0] becomes "11", and therefore the error flag ei becomes "1". In the case where the residue falls below the threshold voltage VthN, as illustrated in FIGS. 11 and 12, the signal B2[1:0] becomes "00", and therefore the error flag ei becomes "−1".

The threshold shift estimation circuit 360 may estimate a shift of the difference voltage between the threshold voltage VthP of the comparator circuit 60P and the threshold voltage of the comparator circuit 60N on the basis of the signal B2[1:0], as illustrated in FIG. 8.

For example, in the case where there is a conversion error in the first stage converter 30, the signal B2[1] and the signal B2[0] coincide with each other, as illustrated in FIGS. 11 and 12. In this case, the exclusive NOR circuit 311 may output "1". Note that the output signal of the exclusive NOR circuit 311 is illustrated as the error flag e in FIG. 12. The adder circuit 312 may subtract the value center_diff (e.g., 0.3) from the output value of the exclusive NOR circuit 311. Therefore, for example, in the case where there is a conversion error in the first stage converter 30, the output value of the adder circuit 312 may be "0.7", for example. In the case where there is no conversion error in the first stage converter 30, the output value of the adder circuit 312 may be "−0.3", for example.

For example, in the case where the difference voltage between the threshold voltage VthP of the comparator circuit 60P and the threshold voltage VthN of the comparator circuit 60N is the same as the voltage width of the voltage range of the least significant bit of the first stage converter 30, the error rate of the AD conversion operation in the first stage converter 30 may be about "0.3" in this example. That is, in the AD converter circuit 1, due to noise occurring therein, the error rate of the AD conversion operation may become "0.3", for example. In such a case, an average output value of the adder circuit 312 is substantially "0", and therefore the value at the counter 314 remains at substantially "0", for example.

For example, in the case where the difference voltage between the threshold voltage VthP of the comparator circuit 60P and the threshold voltage VthN of the comparator circuit 60N is greater than the voltage width of the voltage range of the least significant bit of the first stage converter 30, the error rate of the AD conversion operation in the first stage converter 30 becomes lower than "0.3" in this example. In such a case, the average output value of the adder circuit 312 is negative and therefore the value at the counter 314 decreases from "0". Once the value at the counter 314 has reached the value "−VAL3", the determination circuit 316 may output "1". On the basis of the output signal of the determination circuit 316, the up/down counter 318 may decrease the count value diff. Due to the decrease in the count value diff, the output value of the adder circuit 339 decreases, and as a result, the value of the signal caloffsetp decreases. Further, due to the decrease in the count value diff, the output value of the adder circuit 319 increases, and as a result, the value of the signal caloffsetn increases.

The comparator circuit 60P of the fine phase circuit 52 may lower the threshold voltage VthP on the basis of the signal caloffsetp, and the comparator circuit 60N may raise the threshold voltage VthN on the basis of the signal caloffsetn. In such a manner, the comparator circuits 60P and 60N may decrease the difference voltage between the threshold voltage VthP and the threshold voltage VthN.

For example, in the case where the difference voltage between the threshold voltage VthP of the comparator circuit 60P and the threshold voltage VthN of the comparator circuit 60N is smaller than the voltage width of the voltage range of the least significant bit of the first stage converter 30, the error rate of the AD conversion operation in the first stage converter 30 becomes higher than "0.3" in this example. In such a case, the average output value of the adder circuit 312 is positive and therefore the value at the counter 314 increases from "0". Once the value at the counter 314 has reached the value "VAL3", the determination circuit 315 may output "1". On the basis of the output signal of the determination circuit 315, the up/down counter 318 may, increase the count value diff. Due to the increase in the count value diff, the output value of the adder circuit 339 increases, and as a result, the value of the signal caloffsetp increases. Further, due to the increase in the count value diff, the output value of the adder circuit 319 decreases, and as a result, the value of the signal caloffsetn decreases.

The comparator circuit 60P of the fine phase circuit 52 may raise the threshold voltage VthP on the basis of the signal caloffsetp, and the comparator circuit 60N may lower the threshold voltage VthN on the basis of the signal caloffsetn. In such a manner, the comparator circuits 60P and 60N may increase the difference voltage between the threshold voltage VthP and the threshold voltage VthN.

FIG. 16 illustrates an example of operations of the coarse phase circuit 33 and the fine phase circuit 52 in a case where the average voltage of the threshold voltage VthP of the comparator circuit 60P and the threshold voltage VthN of the comparator circuit 60N in the fine phase circuit 52 is shifted. In this example, for convenience in description, the coarse phase circuit 33 includes three comparator circuits and generates a 3-bit first digital code (signal B1[2:0]).

As illustrated in FIG. 16, in the case where the input voltage Vin is a voltage within the voltage range corresponding to "101", the signal B1[2:0] to be generated by the coarse phase circuit 33 is "101". In this case, a voltage range over which the fine phase circuit 52 is to perform AD conversion is set to cover this voltage range corresponding to "101", as illustrated in FIG. 10. For example, the threshold voltage VthP of the comparator circuit 60P of the fine phase circuit 52 is set near the maximum value of the voltage range corresponding to "101", and the threshold voltage VGA of the comparator circuit 60N is set near the minimum value of the voltage range corresponding to "101".

For example, in the case where the average voltage of the threshold voltage VthP and the threshold voltage VthN is equal to the threshold voltage Vth of the comparator circuit 61 of the fine phase circuit 52, the threshold voltage Vth is set near the middle of the voltage range corresponding to "101", as illustrated in FIG. 10. In this case, an average value of the signal B2[1] is "0.5".

For example, in the case where the average voltage of the threshold voltage VthP and the threshold voltage VthN is higher than the threshold voltage Vth of the comparator circuit 61 of the fine phase circuit 52, the threshold voltage Vth is set to a voltage lower than the middle of the voltage range corresponding to "101", as illustrated in FIG. 16. In this case, the average value of the signal B2[1] is higher than "0.5".

Further, for example, in the case where the average voltage of the threshold voltage VthP and the threshold voltage VthN is lower than the threshold voltage Vth of the comparator circuit 61 of the fine phase circuit 52, the threshold voltage Vth is set to a voltage higher than the middle of the voltage range corresponding to "101". In this case, the average value of the signal B2[1] is lower than "0.5".

The threshold shift estimation circuit 360 may estimate a shift of the average voltage of the threshold voltage VthP of the comparator circuit 60P and the threshold voltage VthN of the comparator circuit 60N on the basis of the signal B2[1], as illustrated in FIG. 8.

For example, in a case where the signal B2[1] is "1", the output value of the inverter 331 is "0", and therefore the output value of the adder circuit 332 is "−0.5", for example. In a case where the signal B2[1] is 0, the output value of the inverter 331 is "1", and therefore the output value of the adder circuit 332 is "0.5".

For example, in the case where the average voltage of the threshold voltage VthP and the threshold voltage VthN is equal to the threshold voltage Vth of the comparator circuit 61 of the fine phase circuit 52, the average value of the signal B2[1] is "0.5". In this case, the average output value of the adder circuit 332 is "0", and therefore the value at the counter 334 remains at substantially "0", for example.

For example, in the case where the average voltage of the threshold voltage VthP and the threshold voltage VthN is higher than the threshold voltage Vth of the comparator circuit 61 of the fine phase circuit 52, the average value of the signal B2[1] is higher than "0.5". In this case, the average output value of the adder circuit 332 is negative and therefore the value at the counter 334 decreases from "0". Once the value at the counter 334 has reached the value "−VAL3", the determination circuit 336 may output "1". On the basis of the output signal of the determination circuit 336, the up/down counter 318 may decrease the count value common. Due to the decrease in the count value common, the output value of the adder circuit 339 decreases, and as a result, the value of the signal caloffsetp decreases. Further, due to the decrease in the count value common, the output value of the adder circuit 319 decreases, and as a result, the value of the signal caloffsetn decreases.

The comparator circuit 60P of the fine phase circuit 52 may lower the threshold voltage VthP on the basis of the signal caloffsetp, and the comparator circuit 60N may lower the threshold voltage VthN on the basis of the signal caloffsetn. In such a manner, the comparator circuits 60P and 60N may lower the average voltage of the threshold voltage VthP and the threshold voltage VthN.

For example, in the case where the average voltage of the threshold voltage VthP and the threshold voltage VthN is lower than the threshold voltage Vth of the comparator circuit. 61 of the fine phase circuit 52, the average value of the signal B2[1] is lower than "0.5". In this case, the average output value of the adder circuit 332 is positive and therefore the value at the counter 334 increases from "0". Once the value at the counter 334 has reached the value "VAL3", the determination circuit 335 may output "1". On the basis of the output signal of the determination circuit 335, the up/down counter 318 may increase the count value common. Due to the increase in the count value common, the output value of the adder circuit 339 increases, and as a result, the value of the signal caloffsetp increases. Further, due to the increase in the count value common, the output value of the adder circuit 319 increases, and as a result, the value of the signal caloffsetn increases.

The comparator circuit 60P of the fine phase circuit 52 may raise the threshold voltage VthP on the basis of the signal caloffsetp, and the comparator circuit 60N may raise the threshold voltage VthN on the basis of the signal caloffsetn. In such a manner, the comparator circuits 60P and 60N may raise the average voltage of the threshold voltage VthP and the threshold voltage VthN.

In such a manner, the threshold shift estimation circuit 360 may estimate shifts of the threshold voltage VthP of the comparator circuit 60P and the threshold voltage VthN of the comparator circuit 60N, and on the basis of the estimation result, the signal generation circuit 380 may generate the signal caloffsetp for adjusting the threshold voltage VthP of the comparator circuit 60P and the signal caloffsetn for adjusting the threshold voltage VthN of the comparator circuit 60N. The comparator circuit 60P is able to adjust the threshold voltage VthP on the basis of the signal caloffsetp. The comparator circuit 60N is able to adjust the threshold voltage VthN on the basis of the signal caloffsetn.

In such a manner, it is possible to adjust the threshold voltage VthP of the comparator circuit 60P and the threshold voltage VthN of the comparator circuit 60N in the AD converter circuit 1.

FIG. 17 illustrates an experiment example of a signal-to-noise and distortion ratio (SNDR) in the AD converter circuit 1. In this example, a sampling frequency of the AD converter circuit 1 was 1.5 GHz, and the input voltage Vin was a sinusoidal voltage of 10 MHz in this example, the AD converter circuit 1 started an AD conversion operation on the basis of a power supply voltage VDD of 0.8 V. An SNDR value immediately after the start of the AD conversion operation was about 40 dB. Thereafter, the AD converter circuit 1 performed calibration while continuously performing the AD conversion operation. This caused the SNDR value to increase, and to converge to about 55 dB, That is, as of immediately after the start of the AD conversion operation, the threshold voltages of the comparator circuits 48 to 40, the gains of the coarse DACs 31 and 32, and the threshold voltages of the comparator circuits 60P and 60N were different from desired values due to, for example, manufacturing variations of the AD converter circuit 1 or other factors. Upon performing the calibration thereafter, these parameters were becoming adjusted to the desired values. As a result, in this example, the SNDR value improved by about 15 dB.

Thereafter, the power supply voltage VDD was changed from 0.8 V to 0.76 V. This caused the threshold voltages of the comparator circuits 48 to 40, the gains of the coarse DACs 31 and 32, and the threshold voltages VthP and VthN of the comparator circuits 60P and 60N to become different from the desired values again, resulting in a reduction of the SDNR value by about 9 dB. Thereafter, the AD converter circuit 1 performed calibration while continuously performing the AD conversion operation. The above parameters were thereby becoming adjusted to the desired values again. As a result, the SNDR value increased to return to about 55 dB.

Thereafter, the power supply voltage VDD was changed from 0.76 V to 0.8 V. This caused the threshold voltages of the comparator circuits 48 to 40, the gains of the coarse DACs 31 and 32, and the threshold voltages VthP and VthN of the comparator circuits 60P and 60N to become different from the desired values again, resulting in a reduction of the SDNR value by about 7 dB. Thereafter, the AD converter circuit 1 performed calibration while continuously performing the AD conversion operation. The above parameters were thereby becoming adjusted again to the desired values. As a result, the SNDR value increased to return to about 55 dB.

FIG. 18 illustrates an operation example of the AD converter circuit 1. The AD converter circuit 1 may perform calibration in an intermittent manner, for example, while continuously performing an AD conversion operation. The following will describe this operation in detail.

When the power supply voltage is turned on, the AD converter circuit 1 may start an AD conversion operation (step S101).

Next, the AD converter circuit 1 may confirm whether or not the AD conversion operation is to end (step S102).

In a case where the AD converter circuit 1 confirms in step S102 that the AD conversion operation is not to end ("N" in step S102), the AD converter circuit 1 may then determine whether or not the error bit detection circuit 72 and the error factor estimation circuit 73 are to acquire digital codes (step S103). In this example, the AD converter circuit 1 may perform calibration in an intermittent manner. In the case of performing calibration, the AD converter circuit 1 may determine that the error bit detection circuit 72 and the error factor estimation circuit 73 are to acquire the digital codes. In the case of not performing calibration, the AD converter circuit 1 may determine that the error bit detection circuit 72 and the error factor estimation circuit 73 are not to acquire the digital codes. In the case where the error bit detection circuit 72 and the error factor estimation circuit 73 are not to acquire the digital codes ("N" in step S103), the process may return to step S102.

In the case where it is determined in step S103 that the error bit detection circuit 72 and the error factor estimation circuit 73 are to acquire the digital codes ("Y" in step S103), the error bit detection circuit 72 and the error factor estimation circuit 73 may acquire the digital codes (step S104). For example, the error bit detection circuit 72 and the error factor estimation circuit 73 may acquire the first digital code (signal B1[8:0]) and the second digital code (signal B2[1:0]).

Next, the error bit detection circuit 72 may detect an error bit on the basis of the digital codes acquired in step S103 (step S105). The error bit detection circuit 72 may, then generate the nine error flags e8 to e0 that respectively correspond to the nine bit data of the signal B1[8:0] generated by the coarse phase circuit 33, and may thereby generate the error data DTE including the nine error flags e8 to e0.

Next, the error factor estimation circuit 73 may estimate an error factor on the basis of the digital codes acquired in step S103 and the error data DTE generated in step S105 (step S106).

Next, on the basis of the estimation result acquired in step S106, the calibration signal generation circuit 74 may generate the calibration signals off_cal, th_cal, DAC1_cal, DAC2_cal, and finephase_cal (step S107).

Thereafter, on the basis of the calibration signals generated in step S107, the comparator circuits 48 to 40 of the coarse phase circuit 33, the coarse DACs 31 and 32, and the comparator circuits 60P and 60N of the fine phase circuit 52 may adjust parameters (step S108). For example, the comparator circuits 48 to 40 of the coarse phase circuit 33 may adjust the threshold voltages on the basis of the calibration signals off_cal and th_cal; the coarse DAC 31 may adjust the gain on the basis of the calibration signal DAC1_cal; the coarse DAC 32 may adjust the gain on the basis of the calibration signal DAC2_cal; and the comparator circuits 60P and 60N of the fine phase circuit 52 may adjust the threshold voltages VthP and VthN on the basis of the calibration signal finephase_cal. Thereafter, the process may return to step S102.

The AD converter circuit 1 may repeat the operations of steps S102 to S108 until the AD converter circuit 1 ends the AD conversion operation.

In a case where the AD converter circuit 1 confirms in step S102 that the AD conversion operation is to end ("Y" in step S102), the AD converter circuit 1 may end the AD conversion operation (step S109).

The flow may thus end.

As has been described, the AD converter circuit 1 includes the first stage converter 30 and the second stage converter 50. The first stage converter 30 generates the first digital code (signal B1[8:0]) by performing AD conversion on the basis of the input voltage Vin. The second stage converter 50 generates the second digital code (signal B2[1:0]) by performing, on the basis of the input voltage Vin and the first digital code, AD conversion over a voltage range wider than the voltage range of the least significant bit of the first stage converter 30. The AD converter circuit 1 further includes the error bit detection circuit 72, and the calibration circuit including the error factor estimation circuit 73 and the calibration signal generation circuit 74. The error bit detection circuit 72 detects a conversion error of the AD conversion on the basis of the first digital code and the second digital code, and thereby generates the error data DTE that indicates at which bit in the first digital code and what kind of conversion error has occurred. The calibration circuit estimates an error factor of the conversion error on the basis of the first digital code, the second digital code, and the error data DTE, and performs, on the basis of the estimation result on the error factor, calibration of a circuit relevant to the error factor estimated, among circuits included in the first stage converter and the second stage converter.

As described above, the second stage converter 50 performs AD conversion over a voltage range wider than the voltage range of the least significant bit of the first stage converter 30. Accordingly, by determining, for example, whether or not the input voltage Vin is a voltage within the redundant voltage range included in the voltage range of the fine phase circuit 52, it is possible for the error bit detection circuit 72 to detect a conversion error, and to detect at which bit in the first digital code and what kind of conversion error has occurred. For example, the error bit detection circuit 72 is able to detect at which bit in the first digital code a conversion error has occurred and whether the conversion error is in a direction that changes the bit data from "1" into "0" or a direction that changes the bit data from "0" into "1". The error factor estimation circuit 73 is able to estimate an error factor of the conversion error on the basis of the first digital code, the second digital code, and the error data DTE. In this example, the error factor estimation circuit 73 is able to detect shifts of the threshold voltages of the comparator circuits 48 to 40 of the coarse phase circuit 33, gain mismatches of the coarse DACs 31 and 32, and shifts of the threshold voltages VthP and VthN of the comparator circuits 60P and 60N of the fine phase circuit 52. The calibration signal generation circuit 74 is able to, for example, adjust the threshold voltages of the comparator circuits 48 to 40 of the coarse phase circuit 33, adjust the gains of the coarse DACs 31 and 32, and adjust the threshold voltages VthP and VthN of the comparator circuits 60P and 60N of the fine phase circuit 52, on the basis of the estimation result on the error factor. This makes it possible for the AD converter circuit to achieve increased AD conversion accuracy.

In some cases, for the purpose of reducing power consumption, for example, the AD converter circuit 1 may be manufactured using a manufacturing process that allows for manufacture of miniature elements. In such cases, wide variations in the element characteristics can occur due to the miniature size of the elements, and such variations can lead to variations in circuit characteristics, resulting in lower AD conversion accuracy. On the other hand, in a case of manufacturing the AD converter circuit 1 using large elements for the purpose of increasing AD conversion accuracy, greater parasitic capacitance will result, leading to higher power consumption and furthermore, lower operation speed. The AD converter circuit 1 estimates an error factor of a conversion error, and performs calibration on a circuit relevant to the estimated error factor. This makes it possible to reduce various kinds of characteristic variations even in the case where the AD converter circuit 1 is manufactured using a manufacturing process that allows for manufacture of miniature elements, for example. As a result, the AD converter circuit 1 is able to achieve increased AD conversion accuracy.

Further, in the AD converter circuit 1, an error factor of a conversion error is estimated on the basis of the first digital code generated by the first stage converter 30, the second digital code generated by the second stage converter 50, and the error data DTE, and calibration is performed on the basis of the estimation result on the error factor. This makes it possible for the AD converter circuit 1 to perform calibration concurrently with a normal AD conversion operation. The AD converter circuit 1 is thus able to perform so-called background calibration. This makes it possible to perform calibration without stopping the AD conversion operation, for example.

<Effects>

As described above, according to the present example embodiment, the AD converter circuit includes the first stage converter, the second stage converter, the error bit detection circuit, and the calibration circuit. The first stage converter generates the first digital code by performing AD conversion on the basis of the input voltage. The second stage converter generates the second digital code by performing, on the basis of the input voltage and the first digital code, AD conversion over a voltage range wider than the voltage range of the least significant bit of the first stage converter. The error bit detection circuit detects a conversion error of the AD conversion on the basis of the first digital code and the second digital code, and thereby generates the error data that indicates at which bit in the first digital code and what kind of conversion error has occurred. The calibration circuit estimates an error factor of the conversion error on the basis of the first digital code, the second digital code, and the error data, and performs, on the basis of the estimation result on the error factor, calibration of a circuit relevant to the error factor estimated, among circuits included the first stage converter and the second stage converter. This makes it possible to achieve increased AD conversion accuracy.

Modification Example 1

In the foregoing example embodiment, adjustments may be made to the threshold voltages of the comparator circuits 60P and 60N of the fine phase circuit 52; however, this is a non-limiting example. Alternatively, for example, an amplitude of an output voltage of the fine DAC 51 may be adjusted, as in an AD converter circuit 1A illustrated in FIG. 19. The AD converter circuit 1A may include a second stage converter 50A and a processing circuit 27A. The second stage converter 50A may include an amplifier 53A. The amplifier 53A may be configured to amplify a voltage generated by the fine DAC 51 and supply the amplified voltage to the comparator circuits 61, 60P, and 60N of the fine phase circuit 52. The amplifier 53A may be able to change gain on the basis of the calibration signal finephase_cal.

FIG. 20 illustrates a configuration example of the processing circuit 27A. The processing circuit 27A may include an error factor estimation circuit 73A and a calibration signal generation circuit 74A. The error factor estimation circuit 73A may include a gain mismatch estimation circuit 360A. The calibration signal generation circuit 74A may include a signal generation circuit 380A.

The gain mismatch estimation circuit 360A may be configured to estimate a gain mismatch of the amplifier 53A. In the foregoing example embodiment, the threshold shift estimation circuit 360 may estimate shifts of the threshold voltages VthP and VthN of the comparator circuits 60P and 60N. In the present modification example, however, the gain mismatch estimation circuit 360A may estimate a gain mismatch of the amplifier 53A. The gain mismatch estimation circuit 360A may include an error rate calculator 371 and a gain mismatch determinator 373A. The gain mismatch determinator 373A may be configured to determine a gain mismatch of the amplifier 53A, using a reference value, on the basis of the calculation result acquired by the error rate calculator 371.

FIG. 21 illustrates a more specific but non-limiting example of configurations of the gain mismatch estimation circuit 360A and the signal generation circuit 380A. The gain mismatch estimation circuit 360A may include an exclusive NOR circuit (ExNOR) 311, an adder circuit 312, a ΔΣ processor 313, a counter 314, and determination circuits 315 and 316. The signal generation circuit 380A may include an OR circuit 317 and an up/down counter 318. The exclusive NOR circuit 311, the adder circuit 312, the ΔΣ processor 313, and the counter 314 may correspond to the error rate calculator 371 illustrated in FIG. 20. The determination circuits 315 and 316 may correspond to the gain mismatch determinator 373A illustrated in FIG. 20.

The exclusive NOR circuit 311, the adder circuit 312, the ΔΣ processor 313, the counter 314, the determination circuits 315 and 316, and the OR circuit 317 may be similar to those of the foregoing example embodiment (FIG. 8), The up/down counter 318 may be configured to increase or decrease the count value on the basis of the output signals of the determination circuits 315 and 316 and to thereby generate the calibration signal finephase_cal for adjusting a gain of the amplifier 53A. The up/down counter 318 may have a U terminal to be supplied with the output signal of the determination circuit 316, and a D terminal to be supplied with the output signal of the determination circuit 315.

For example, in a case where the gain of the amplifier 53A is a desired one, the error rate of the AD conversion operation in the first stage converter 30 may be about "0.3" in this example. In this case, the output value of the adder circuit 312 is substantially "0", and therefore the value at the counter 314 remains at substantially "0", for example.

For example, in a case where the gain of the amplifier 53A is lower than the desired one, the error rate of the AD conversion operation in the first stage converter 30 becomes lower than "0.3" in this example. In such a case, the adder circuit 312 often outputs a negative value, and therefore the value at the counter 314 decreases from "0". Once the value at the counter 314 has reached the value "–VAL3", the determination circuit 316 may output "1". On the basis of the output signal of the determination circuit 316, the up/down counter 318 may increase the count value and output the changed count value as the calibration signal finephase_cal for adjusting the gain of the amplifier 53A. The amplifier 53A may increase the gain on the basis of the calibration signal finephase_cal.

For example, in a case where the gain of the amplifier 53A is higher than the desired one, the error rate of the AD conversion operation in the first stage converter 30 becomes higher than "0.3" in this example. In such a case, the adder circuit 312 often outputs a positive value, and therefore the value at the counter 314 increases from "0". Once the value at the counter 314 has reached the value "VAL3", the determination circuit 315 may output "1". On the basis of the output signal of the determination circuit 315, the up/down counter 318 may decrease the count value and output the changed count value as the calibration signal finephase_cal for adjusting the gain of the amplifier 53A. The amplifier 53A may decrease the gain on the basis of the calibration signal finephase_cal.

The amplifier 53A may correspond to a specific but non-limiting example of an "amplifier circuit" according to one embodiment of the disclosure. The comparator circuits 60P and 60N may each correspond to a specific but non-limiting example of a "fourth comparator circuit" according to one embodiment of the disclosure.

In this example, in the presence of the fine DAC 51, the amplifier 53A may amplify the voltage generated by the fine DAC 51 and supply the amplified voltage to the comparator circuits 61, 60P, and 60N of the fine phase circuit 52; however, this is a non-limiting example. Alternatively, for example, the fine DAC 51 may be omitted, and the amplifier 53A may amplify the voltage generated by the coarse DAC 31 and supply the amplified voltage to the comparator circuits 61, 60P, and 60N of the fine phase circuit 52.

Modification Example 2

In the foregoing example embodiment, the AD converter circuit 1 may perform calibration when performing a normal AD conversion operation; however, this is a non-limiting example. Alternatively, for example, a signal generation circuit that generates an alternating current signal may be provided, and an AD conversion operation may be performed on the basis of the alternating current signal generated by this signal generating circuit in the case where the AD converter circuit 1 performs calibration. An AD converter circuit 2 according to the present modification example will be described in detail below.

FIG. 22 illustrates a configuration example of the AD converter circuit 2. The AD converter circuit 2 may include a DAC 91, a switch 92, and the AD converter circuit 1 according to the foregoing example embodiment. The DAC 91 may be configured to generate an alternating current signal. The alternating current signal may have, for example, a sinusoidal waveform, a triangular waveform, or a random waveform. The alternating current signal may have an amplitude corresponding to a voltage of one half or more of an input voltage range of the AD converter circuit 1, for example. The switch 92 may be configured to supply either one of an externally supplied signal and the signal generated by the DAC 91 to the AD converter circuit 1 as the input voltage Vin. For example, in the case where the AD converter circuit 1 performs calibration, the switch 92 may supply the signal generated by the DAC 91 to the AD converter circuit 1 as the input voltage Vin. The DAC 91 may correspond to a specific but non-limiting example of a "signal generation circuit" according to one embodiment of the disclosure.

FIG. 23 illustrates an operation example of the AD converter circuit 2.

When the power supply voltage is turned on, the AD converter circuit 1 may start an AD conversion operation (step S101).

Next, the DAC 91 may start the generation of the alternating current signal (step S121). The switch 92 may supply the signal generated by the DAC 91 to the AD converter circuit 1 as the input voltage Vin.

Next, the AD converter circuit 2 may confirm whether or not calibration has been completed (step S122).

In a case where it is confirmed in step S122 that the calibration has not been completed yet ("N" in step S122), the AD converter circuit 1 may determine whether or not the error bit detection circuit 72 and the error factor estimation circuit 73 are to acquire the digital codes (step S103). In the case where the error bit detection circuit 72 and the error factor estimation circuit 73 are not to acquire the digital codes ("N" in step S103), the process may return to step S122.

In the case where it is determined in step S103 that the error bit detection circuit 72 and the error factor estimation circuit 73 are to acquire the digital codes ("Y" in step S103), the error bit detection circuit 72 and the error factor estimation circuit 73 may acquire the digital codes (step S104), and the error bit detection circuit 72 may detect an error bit on the basis of the digital codes acquired in step S103 (step S105). Thereafter, the error factor estimation circuit 73 may estimate an error factor on the basis of the digital codes acquired in step S103 and the error data DTE generated in step S105 (step S106).

Next, on the basis of the estimation result acquired in step S106, the calibration signal generation circuit 74 may generate the calibration signals off_cal, th_cal, DAC1_cal, DAC2_cal, and finephase_cal (step S107). Thereafter, on the basis of the calibration signals generated in step S107, the comparator circuits 48 to 40 of the coarse phase circuit 33, the coarse DACs 31 and 32, and the comparator circuits 60P and 60N of the fine phase circuit 52 may adjust parameters (step S108). Thereafter, the process may return to step S122.

In a case where it is confirmed in step S122 that the calibration has been completed ("Y" in step S122), the DAC 91 may end the generation of the alternating current signal (step S123).

Next, the AD converter circuit 2 may confirm whether or not the AD conversion operation is to end (step S124). In a case where the AD conversion operation is not to end ("N" in step S124), the process of step S124 may be repeated until the AD conversion operation is to end. In a case where the AD conversion operation is to end ("Y" in step S124), the AD converter circuit 1 may end the AD conversion operation (step S109).

The flow may thus end.

In this example, calibration may be performed only when the voltage is turned on; however, this is a non-limiting example. Alternatively, for example, calibration may be performed in an intermittent manner. In this case, calibration may be performed with an AD conversion operation being performed on the basis of the alternating current signal generated by the DAC 91. Alternatively, for example, calibration may be performed with a normal AD conversion operation being performed on the basis of an externally supplied signal without operating the DAC 91, similarly to the foregoing example embodiment.

Modification Example 3

In the foregoing example embodiment, the error correction circuit 71, the error bit detection circuit 72, the error factor estimation circuit 73, and the calibration signal generation circuit 74 may be provided in each of the four ADCs 20; however, this is a non-limiting example. Alternatively, for example, the error correction circuit 71, the error hit detection circuit 72, the error factor estimation circuit 73, and the calibration signal generation circuit 74 may be provided so as to follow the multiplexer 16.

Modification Example 4

In the foregoing example embodiment, two coarse DACs 31 and 32 may be provided in the first stage converter 30. However, this is a non-limiting example, and a single coarse DAC may be used. In such a case, the first stage converter 30 may serve as an SAR AD converter circuit.

Modification Example 5

In the foregoing example embodiment, the ADC 20 may have a two stage configuration including the first stage converter 30 and the second stage converter 50. However, this is a non-limiting example, and the ADC 20 may have a configuration including three or more stages. For example, in a case where the ADC 20 includes a first stage converter, a second stage converter, and a third stage converter, it is possible to detect not only a conversion error in the first stage converter but also a conversion error in the second stage converter, for example.

Modification Example 6

In the foregoing example embodiment, as illustrated in FIG. 6, the gain mismatch estimation circuit 231 may estimate a gain mismatch of the coarse DAC 31 on the basis of the error flag e0; however, this is a non-limiting example. Alternatively, for example, the gain mismatch estimation circuit 231 may estimate a gain mismatch of the coarse DAC 31 on the basis of one or more of the error flags e6, e4, e2, and e0. In a case of using two or more of the error flags e6, e4, e2, and e0, an OR circuit may be provided that outputs one of the values of any of the two or more error flags that are not "0", like the OR circuit 222 of the gain mismatch estimation circuit 232. In this case, the number of the error flags to be inputted to the gain mismatch estimation circuit 231 increases, and as a result, the cumulative value at the counter 214 is changeable quickly. Accordingly, for example, the value VAL2 at the determination circuits 215 and 216 may be adjusted.

Likewise, in the foregoing example embodiment, as illustrated in FIG. 6, the gain mismatch estimation circuit 232 may estimate a gain mismatch of the coarse DAC 32 on the basis of the error flags e7, e5, e3, and e1; however, this is a non-limiting example. Alternatively, for example, the gain mismatch estimation circuit 232 may estimate a gain mismatch of the coarse DAC 32 on the basis of one or more of the error flags e7, e5, e3, and e1.

Other Modification Examples

Two or more of the modification examples described above, may be employed in combination.

Although the technology has been described with reference to the example embodiment and modification examples thereof, the technology is not limited thereto, and may be modified in a variety of ways.

For example, in the foregoing example embodiment and modification examples, the technology is applied to an SAR AD converter circuit; however, possible applications of the technology are not limited thereto. For example, the technology may be applied to a pipelined-SAR AD converter circuit. Furthermore, the technology may be applied to a pipelined AD converter (ADC) circuit.

For example, in the foregoing example embodiment, nine comparator circuits 48 to 40 may be provided in the first stage converter 30. However, this is a non-limiting example. Alternatively, for example, eight or less, or ten or more comparator circuits may be provided. Further, although the comparator circuits 61, 60P, and 60N may be provided in the second stage converter 50 in the foregoing example embodiment, a larger number of stages of comparator circuits may be provided.

It should be appreciated that the effects described herein are mere examples and non-limiting, and other effects may be achieved.

It is to be noted that the technology may be configured as follows. The technology having the following configurations makes it possible to achieve increased AD conversion accuracy.

(1)
An analog-to-digital converter circuit including:
a first converter circuit configured to generate a first digital code by performing analog-to-digital conversion on a basis of an input voltage;
a second converter circuit configured to generate a second digital code by performing, on a basis of the input voltage and the first digital code, analog-to-digital conversion over a voltage range wider than a voltage range of a least significant bit of the first converter circuit;
an error detector configured to detect a conversion error of the analog-to-digital conversion on a basis of the first digital code and the second digital code, and to thereby generate error data that indicates at which hit in the first digital code and what kind of conversion error has occurred; and
a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit.

(2)
The analog-to-digital converter circuit according to (1), in which
the first converter circuit includes two or more comparator circuits each configured to perform a comparison operation,
the two or more comparator circuits include a first comparator circuit configured to perform the comparison operation using one of two or more threshold voltages selectively, and
the calibration circuit is configured to count the number of the conversion errors for each of the two or more threshold voltages on a basis of the first digital code and the error data, and to estimate, on a basis of a counting result, a shift of each of the two or more threshold voltages of the first comparator circuit.

(3)
The analog-to-digital converter circuit according to (2), in which
the two or more comparator circuits further include a second comparator circuit,
two or more bits in the first digital code correspond to the two or more comparator circuits, respectively,
the first comparator circuit is configured to perform the comparison operation sing one of the two or more threshold voltages that corresponds to a result of the comparison operation by the second comparator circuit, and
the calibration circuit is configured to count the number of the conversion errors for each of the two or more threshold voltages on a basis of: bit data, included in the first digital code, of a bit corresponding to the second comparator circuit among the two or more bits in the first digital code; and data included in the error data and concerning the conversion error at a bit corresponding to the first comparator circuit among the two or more bits in the first digital code.

(4)
The analog-to-digital converter circuit according to (2) or (3), in which the calibration circuit is configured to adjust the two or more threshold voltages of the first comparator circuit on a basis of an estimation result on the shift of each of the two or more threshold voltages.

(5)
The analog-to-digital converter circuit according to (1), in which the first converter circuit includes
two or more comparator circuits that include a first comparator circuit and a second comparator circuit and that are each configured to perform a comparison operation, and
a digital-to-analog converter circuit,
the digital-to-analog converter circuit is configured to generate a first voltage on a basis of a result of the comparison operation by the second comparator circuit,
the first comparator circuit is configured to perform the comparison operation by comparing the first voltage with a threshold voltage,
the error data indicates at which bit in the first digital code the conversion error has occurred and whether the conversion error is in a direction that makes bit data lower in value or in a direction that makes the bit data higher in value, and the calibration circuit is configured to calculate a degree of correlation between the first digital code and the direction of the conversion error on a basis of the first digital code and the error data, and to estimate a mismatch of a gain of the digital-to-analog converter circuit on a basis of the degree of correlation.

(6)

The analog-to-digital converter circuit according to (5), in which the digital-to-analog converter circuit includes a first digital-to-analog converter circuit and a second digital-to-analog converter circuit, the two or more comparator circuits further include a third comparator circuit, the first digital-to-analog converter circuit is configured to generate the first voltage on the basis of the result of the comparison operation by the second comparator circuit, the second digital-to-analog converter circuit is configured to generate a second voltage on a basis of a result of the comparison operation by the first comparator circuit, the third comparator circuit is configured to perform the comparison operation by comparing the second voltage with a threshold voltage, and the calibration circuit is configured to calculate the degree of correlation for each of the first digital-to-analog converter circuit and the second digital-to-analog converter circuit, and to estimate the mismatch of the gain on the basis of the degree of correlation.

(7)

The analog-to-digital converter circuit according to (6), in which the first comparator circuit is configured to perform the comparison operation by comparing the first voltage with one of two or more threshold voltages that corresponds to the result of the comparison operation by the second comparator circuit, and the third comparator circuit is configured to perform the comparison operation by comparing the second voltage with one of two or more threshold voltages that corresponds to the result of the comparison operation by the first comparator circuit.

(8)

The analog-to-digital converter circuit according to any one of (5) to (7), in which the calibration circuit is configured to adjust the gain of the digital-to-analog converter circuit on a basis of an estimation result on the mismatch of the gain of the digital-to-analog converter circuit.

(9)

The analog-to-digital converter circuit according to (1), in which the second converter circuit includes a fourth comparator circuit configured to perform a comparison operation, and the calibration circuit is configured to calculate a rate of occurrence of the conversion error on a basis of the second digital code, and to estimate a shift of a threshold voltage of the fourth comparator circuit on a basis of the rate of occurrence.

(10)

The analog-to-digital converter circuit according to (9), in which the calibration circuit is configured to adjust the threshold voltage of the fourth comparator circuit on a basis of an estimation result on the shift of the threshold voltage of the fourth comparator circuit.

(11)

The analog-to-digital converter circuit according to (1), in which the second converter circuit further includes an amplifier circuit, and a fourth comparator circuit that is configured to perform a comparison operation by comparing an output voltage of the amplifier circuit with a threshold voltage, and the calibration circuit is configured to calculate a rate of occurrence of the conversion error on a basis of the second digital code, and to estimate a mismatch of a gain of the amplifier circuit on a basis of the rate of occurrence.

(12)

The analog-to-digital converter circuit according to (11), in which the calibration circuit is configured to adjust the gain of the amplifier circuit on a basis of an estimation result on the mismatch of the gain of the amplifier circuit.

(13)

The analog-to-digital converter circuit according to any one of (1) to (12), further including a signal generation circuit, in which the analog-to-digital converter circuit has a first mode and a second mode, in the first mode, the signal generation circuit is configured to generate an alternating current voltage, and the first converter circuit is configured to generate the first digital code by performing analog-to-digital conversion on a basis of the alternating current voltage, and in the second mode, the first converter circuit is configured to generate the first digital code by performing analog-to-digital conversion on a basis of externally supplied voltage.

This application claims the benefit of priority of U.S. Provisional Patent Application No. 63/071,739 filed Aug. 28, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An analog-to-digital converter circuit comprising:
a first converter circuit configured to generate a first digital code by performing analog-to-digital conversion on a basis of an input voltage;
a second converter circuit configured to generate a second digital code by performing, on a basis of the input voltage and the first digital code, analog-to-digital conversion over a voltage range wider than a voltage range of a least significant bit of the first converter circuit;
an error detector configured to detect a conversion error of the analog-to-digital conversion on a basis of the first digital code and the second digital code, and to thereby generate error data that indicates at which bit in the first digital code and what kind of conversion error has occurred; and
a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit, wherein the first converter circuit includes two or more comparator circuits each configured to perform a comparison operation, the two or more comparator circuits include a first comparator circuit configured to perform the comparison operation using one of two or more threshold voltages selectively, and the calibration circuit is configured to count a number of conversion errors for each of the two or more threshold voltages on a basis of the first digital code and the error data, and to estimate, on a basis of a counting result, a shift of each of the two or more threshold voltages of the first comparator circuit.

2. The analog-to-digital converter circuit according to claim 1, wherein the two or more comparator circuits further include a second comparator circuit, two or more bits in the first digital code correspond to the two or more comparator circuits, respectively, the first comparator circuit is configured to perform the comparison operation using one of the two or more threshold voltages that corresponds to a result of the comparison operation by the second comparator circuit, and the calibration circuit is configured to count the number of conversion errors for each of the two or more threshold voltages on a basis of: bit data, included in the first digital code, of a bit corresponding to the second comparator circuit among the two or more bits in the first digital code; and data included in the error data and concerning the conversion error at a bit corresponding to the first comparator circuit among the two or more bits in the first digital code.

3. The analog-to-digital converter circuit according to claim 1, wherein the calibration circuit is configured to adjust the two or more threshold voltages of the first comparator circuit on a basis of an estimation result on the shift of each of the two or more threshold voltages.

4. An analog-to-digital converter circuit comprising:

a first converter circuit configured to generate a first digital code by performing analog-to-digital conversion on a basis of an input voltage;

a second converter circuit configured to generate a second digital code by performing, on a basis of the input voltage and the first digital code, analog-to-digital conversion over a voltage range wider than a voltage range of a least significant bit of the first converter circuit;

an error detector configured to detect a conversion error of the analog-to-digital conversion on a basis of the first digital code and the second digital code, and to thereby generate error data that indicates at which bit in the first digital code and what kind of conversion error has occurred; and a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit, wherein the first converter circuit includes two or more comparator circuits that include a first comparator circuit and a second comparator circuit and that are each configured to perform a comparison operation, and a digital-to-analog converter circuit, the digital-to-analog converter circuit is configured to generate a first voltage on a basis of a result of the comparison operation by the second comparator circuit, the first comparator circuit is configured to perform the comparison operation by comparing the first voltage with a threshold voltage, the error data indicates at which bit in the first digital code the conversion error has occurred and whether the conversion error is in a direction that makes bit data lower in value or in a direction that makes the bit data higher in value, and the calibration circuit is configured to calculate a degree of correlation between the first digital code and the direction of the conversion error on a basis of the first digital code and the error data, and to estimate a mismatch of a gain of the digital-to-analog converter circuit on a basis of the degree of correlation.

5. The analog-to-digital converter circuit according to claim 4, wherein the digital-to-analog converter circuit includes a first digital-to-analog converter circuit and a second digital-to-analog converter circuit, the two or more comparator circuits further include a third comparator circuit, the first digital-to-analog converter circuit is configured to generate the first voltage on the basis of the result of the comparison operation by the second comparator circuit, the second digital-to-analog converter circuit is configured to generate a second voltage on a basis of a result of the comparison operation by the first comparator circuit, the third comparator circuit is configured to perform the comparison operation by comparing the second voltage with a threshold voltage, and the calibration circuit is configured to calculate the degree of correlation for each of the first digital-to-analog converter circuit and the second digital-to-analog converter circuit, and to estimate the mismatch of the gain on the basis of the degree of correlation.

6. The analog-to-digital converter circuit according to claim 5, wherein the first comparator circuit is configured to perform the comparison operation by comparing the first voltage with one of two or more threshold voltages that corresponds to the result of the comparison operation by the second comparator circuit, and the third comparator circuit is configured to perform the comparison operation by comparing the second voltage with one of two or more threshold voltages that corresponds to the result of the comparison operation by the first comparator circuit.

7. The analog-to-digital converter circuit according to claim 4, wherein the calibration circuit is configured to adjust the gain of the digital-to-analog converter circuit on a basis of an estimation result on the mismatch of the gain of the digital-to-analog converter circuit.

8. An analog-to-digital converter circuit comprising:

a first converter circuit configured to generate a first digital code by performing analog-to-digital conversion on a basis of an input voltage;

a second converter circuit configured to generate a second digital code by performing, on a basis of the input voltage and the first digital code, analog-to-digital conversion over a voltage range wider than a voltage range of a least significant bit of the first converter circuit;

an error detector configured to detect a conversion error of the analog-to-digital conversion on a basis of the first digital code and the second digital code, and to thereby generate error data that indicates at which bit in the first digital code and what kind of conversion error has occurred; and a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit, wherein the second converter circuit includes a fourth comparator circuit configured to perform a comparison operation, and the calibration circuit is configured to calculate a rate of occurrence of the conversion error on a basis of the second digital code, and to estimate a shift of a threshold voltage of the fourth comparator circuit on a basis of the rate of occurrence.

9. The analog-to-digital converter circuit according to claim 8, wherein the calibration circuit is configured to adjust the threshold voltage of the fourth comparator circuit on a basis of an estimation result on the shift of the threshold voltage of the fourth comparator circuit.

10. An analog-to-digital converter circuit comprising:
a first converter circuit configured to generate a first digital code by performing analog-to-digital conversion on a basis of an input voltage;

a second converter circuit configured to generate a second digital code by performing, on a basis of the input voltage and the first digital code, analog-to-digital conversion over a voltage range wider than a voltage range of a least significant bit of the first converter circuit;

an error detector configured to detect a conversion error of the analog-to-digital conversion on a basis of the first digital code and the second digital code, and to thereby generate error data that indicates at which bit in the first digital code and what kind of conversion error has occurred; and a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit, wherein the second converter circuit further includes an amplifier circuit, and a fourth comparator circuit that is configured to perform a comparison operation by comparing an output voltage of the amplifier circuit with a threshold voltage, and the calibration circuit is configured to calculate a rate of occurrence of the conversion error on a basis of the second digital code, and to estimate a mismatch of a gain of the amplifier circuit on a basis of the rate of occurrence.

11. The analog-to-digital converter circuit according to claim 10, wherein the calibration circuit is configured to adjust the gain of the amplifier circuit on a basis of an estimation result on the mismatch of the gain of the amplifier circuit.

12. An analog-to-digital converter circuit comprising:
a first converter circuit configured to generate a first digital code by performing analog-to-digital conversion on a basis of an input voltage;

a second converter circuit configured to generate a second digital code by performing, on a basis of the input voltage and the first digital code, analog-to-digital conversion over a voltage range wider than a voltage range of a least significant bit of the first converter circuit;

an error detector configured to detect a conversion error of the analog-to-digital conversion on a basis of the first digital code and the second digital code, and to thereby generate error data that indicates at which bit in the first digital code and what kind of conversion error has occurred;

a calibration circuit configured to estimate an error factor on a basis of the first digital code, the second digital code, and the error data, and to perform, on a basis of an estimation result on the error factor, calibration of a circuit relevant to the error factor estimated, among circuits included in the first converter circuit and the second converter circuit; and a signal generation circuit, wherein the analog-to-digital converter circuit has a first mode and a second mode, in the first mode, the signal generation circuit is configured to generate an alternating current voltage, and the first converter circuit is configured to generate the first digital code by performing analog-to-digital conversion on a basis of the alternating current voltage, and in the second mode, the first converter circuit is configured to generate the first digital code by performing analog-to-digital conversion on a basis of externally supplied voltage.

* * * * *